(12) United States Patent
Oishi et al.

(10) Patent No.: US 7,732,351 B2
(45) Date of Patent: Jun. 8, 2010

(54) MANUFACTURING METHOD OF SEMICONDUCTOR DEVICE AND LASER PROCESSING APPARATUS

(75) Inventors: Hirotada Oishi, Kanagawa (JP); Koichiro Tanaka, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 324 days.

(21) Appl. No.: 11/856,885

(22) Filed: Sep. 18, 2007

(65) Prior Publication Data

US 2008/0076267 A1 Mar. 27, 2008

(30) Foreign Application Priority Data

Sep. 21, 2006 (JP) ............................. 2006-255863

(51) Int. Cl.
*H01L 21/31* (2006.01)
*H01L 21/469* (2006.01)
*H01L 21/302* (2006.01)
*H01L 21/461* (2006.01)

(52) U.S. Cl. ...................... 438/785; 438/710; 438/714; 438/746

(58) Field of Classification Search ................. 438/785, 438/494, 498, 504, 707–714, 726, 746
See application file for complete search history.

(56) References Cited

U.S. PATENT DOCUMENTS

| 4,594,471 | A | 6/1986 | Yamazaki | |
|---|---|---|---|---|
| 4,603,470 | A | 8/1986 | Yamazaki | |
| 4,861,964 | A | 8/1989 | Sinohara | |
| 5,010,517 | A | * 4/1991 | Migita et al. | ................. 365/114 |
| 5,708,252 | A | 1/1998 | Shinohara et al. | |
| 5,974,069 | A | * 10/1999 | Tanaka et al. | ............ 372/46.01 |
| 6,149,988 | A | 11/2000 | Shinohara et al. | |
| 6,261,856 | B1 | 7/2001 | Shinohara et al. | |
| 6,362,514 | B1 * | 3/2002 | Ido et al. | ..................... 257/529 |
| 7,001,829 | B1 * | 2/2006 | Yamazaki | ................... 438/479 |
| 7,176,069 | B2 | 2/2007 | Yamazaki et al. | |
| 7,199,516 | B2 | 4/2007 | Seo et al. | |
| 7,202,155 | B2 | 4/2007 | Fukuchi | |
| 7,226,819 | B2 | 6/2007 | Maekawa et al. | |
| 2005/0043186 | A1 | 2/2005 | Maekawa et al. | |
| 2006/0158482 | A1 | 7/2006 | Nakamura et al. | |
| 2006/0270175 | A1 | 11/2006 | Aoki et al. | |
| 2007/0051952 | A1 | 3/2007 | Yamazaki et al. | |

FOREIGN PATENT DOCUMENTS

JP 2001-77194 3/2001

* cited by examiner

*Primary Examiner*—Chuong A. Luu
(74) *Attorney, Agent, or Firm*—Husch Blackwell Sanders LLP

(57) ABSTRACT

In a manufacturing process of a semiconductor device, a manufacturing technique and a manufacturing apparatus of a semiconductor device which simplify a lithography step using a photoresist is provided, so that the manufacturing cost is reduced, and the throughput is improved. An irradiated object, in which a light absorbing layer and an insulating layer are stacked over a substrate, is irradiated with a multi-mode laser beam and a single-mode laser beam so that both the laser beams overlap with each other, and an opening is formed by ablation in part of the irradiated object the irradiation of which is performed so that both the laser beams overlap with each other.

18 Claims, 32 Drawing Sheets

8500
8501
8502

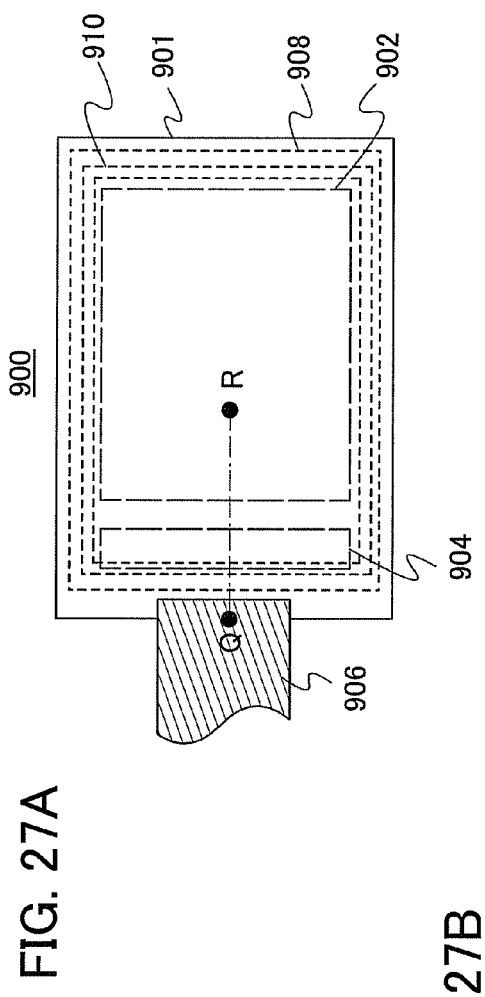
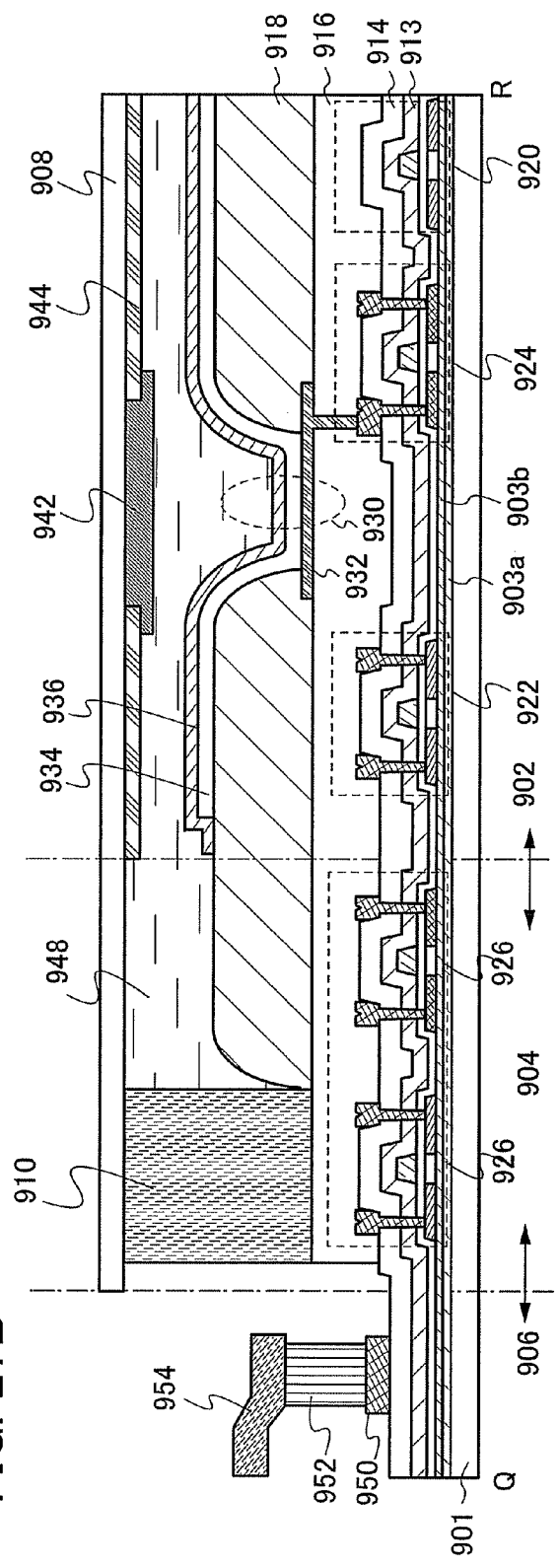
FIG. 27A
FIG. 27B

MANUFACTURING METHOD OF SEMICONDUCTOR DEVICE AND LASER PROCESSING APPARATUS

BACKGROUND OF THE INVENTION

1. Field of the Invention

The present invention relates to a manufacturing method of a semiconductor device. In particular, the present invention relates to a method for forming an opening in thin films such as a conductive layer and an insulating layer.

2. Description of the Related Art

In a conventional technique, thin films such as an insulating layer and a conductive layer are formed over a substrate and a desired pattern is formed by a lithography technique, as appropriate, so as to manufacture a MOS transistor, a thin film transistor (hereinafter also referred to as a TFT), and a semiconductor device including such a transistor. A lithography technique is a technique in which a pattern of a circuit or the like referred to as a photomask, which is formed with a light-shielding material over a transparent flat plate, is transferred to an aimed object by utilizing light. The lithography technique has been widely used in a process of manufacturing a semiconductor integrated circuit and the like.

In the manufacturing process using a lithography technique, multiple steps such as resist application using a photosensitive resin referred to as a photoresist, pattern light exposure, development, etching using a resist as a mask, and resist removal are necessary. Therefore, the cost is increased and the throughput is decreased as the number of lithography steps is increased.

For example, a manufacturing method of a semiconductor device is described in Patent Document 1: Japanese Published Patent Application No. 2001-77194, in which lithography steps are simplified by removing the necessity of an etching step in forming an opening in an insulating film. Specifically, a resist film is formed in advance in a region where it is desired to form an opening, an insulating film is formed in a region other than the resist film, and the resist film is removed, whereby the opening is formed in the insulating film.

SUMMARY OF THE INVENTION

It is an object of the present invention to provide a manufacturing technique of a semiconductor device which simplifies a lithography steps or to provide a manufacturing technique of a semiconductor device with which the number of lithography steps is reduced.

In addition, it is another object of the present invention to provide a manufacturing apparatus of a semiconductor device with which a thin film can be processed without using a photoresist.

The present invention has a feature in that ablation by laser beam irradiation is utilized to form an opening for electrically connecting conductive layers with each other or an opening for electrically connecting a conductive layer and a semiconductor layer, without using a photoresist. As in the present invention, a process in which a pattern is formed by utilizing laser ablation is referred to as a laser ablation patterning process (LAPP) in this specification. In the present invention, an opening pattern is formed by utilizing laser ablation.

Note that ablation (also referred to as laser ablation) is a phenomenon that part of an irradiated region of an irradiated object is removed by laser beam irradiation, in this specification. Here, ablation includes both sublimation in which part of an irradiated region of an irradiated object is changed from a solid state to a gas state by laser beam irradiation, and evaporation in which the phase in the irradiated region is changed from a solid state to a gas state through a liquid state.

The irradiated object is a lamination body in which a light absorbing layer and an insulating layer are stacked over a substrate. In addition, in the irradiated object, a conductive layer may be formed under the light absorbing layer. Irradiation of a multi-mode laser beam and a single-mode laser beam are performed from the insulating layer side so that both the laser beams overlap with each other, and an opening is formed in part of the irradiated object which is in a region the irradiation of which is performed so that both the laser beams overlap with each other.

The multi-mode laser beam and the single-mode laser beam irradiation of which is performed from the insulating layer side transmit the insulating layer and are absorbed by the light absorbing layer. In a region the irradiation of which is performed so that the multi-mode laser beam and the single-mode laser beam overlap with each other, energy of both the laser beams are synthesized. The light absorbing layer absorbs the energy of the multi-mode laser beam and the single-mode laser beam which are synthesized in the region where the irradiation is performed so that both the laser beams overlap with each other, and is heated by the energy. Consequently, at least part of the insulating layer stacked over the light absorbing layer is damaged and removed; therefore, an opening is formed in the insulating layer. Part or the entire light absorbing layer in the region where the irradiation is performed so that both the laser beams overlap with each other, may be removed along with the insulating layer.

The light absorbing layer is formed using a material which absorbs a laser beam. The insulating layer is formed using a material which transmits a laser beam.

The multi-mode laser beam may be emitted from a laser oscillation device from which a multi-mode laser beam can be obtained. The single-mode laser beam may be emitted from a laser oscillation device from which a single-mode laser beam can be obtained.

The opening can be formed, by utilizing laser ablation, without using a lithography step with a photoresist.

One aspect of a method for manufacturing a semiconductor device of the present invention includes the steps of forming a light absorbing layer; forming an insulating layer over the light absorbing layer; and performing irradiation of a multi-mode laser beam and a single-mode laser beam from the insulating layer side so that both the laser beams overlap with each other and removing the insulating layer in a region where the irradiation is performed so that the multi-mode laser beam and the single-mode laser beam overlap with each other, to form an opening in the insulating layer.

Another aspect of a method for manufacturing a semiconductor device of the present invention includes the steps of forming a light absorbing layer; forming an insulating layer over the light absorbing layer; and performing irradiation of a multi-mode laser beam and a single-mode laser beam from the insulating layer side so that both the laser beams overlap with each other and removing the light absorbing layer and the insulating layer in a region where the irradiation is performed so that the multi-mode laser beam and the single-mode laser beam overlap with each other, to form an opening in the light absorbing layer and the insulating layer.

Another aspect of a method for manufacturing a semiconductor device of the present invention includes the steps of forming a light absorbing layer over a conductive layer; forming an insulating layer over the light absorbing layer; and performing irradiation of a multi-mode laser beam and a single-mode laser beam from the insulating layer side so that both the laser beams overlap with each other and removing the insulating layer in a region where the irradiation is performed so that the multi-mode laser beam and the single-mode laser beam overlap with each other, to form an opening in the insulating layer.

Another aspect of a method for manufacturing a semiconductor device of the present invention includes the steps of forming a light absorbing layer over a conductive layer; forming an insulating layer over the light absorbing layer; and performing irradiation of a multi-mode laser beam and a single-mode laser beam from the insulating layer side so that both the laser beams overlap with each other and removing the light absorbing layer and the insulating layer in a region where the irradiation is performed so that the multi-mode laser beam and the single-mode laser beam overlap with each other, to form an opening in the light absorbing layer and the insulating layer.

A laser beam emitted from a YAG laser, a $YVO_4$ laser, or an excimer laser is preferably used as the multi-mode laser beam.

A laser beam emitted from a femtosecond laser or a picosecond laser is preferably used as the single-mode laser beam.

The light absorbing layer is preferably formed using a material which absorbs the multi-mode laser beam and the single-mode laser beam.

According to another aspect of a method for manufacturing a semiconductor device of the present invention, the light absorbing layer is preferably formed using a material which contains at least one element of chromium (Cr), molybdenum (Mo), nickel (Ni), titanium (Ti), cobalt (Co), copper (Cu), or aluminum (Al).

According to another aspect of a method for manufacturing a semiconductor device of the present invention, the light absorbing layer is preferably formed using a material which contains at least one of silicon, germanium, silicon germanium, molybdenum oxide, tin oxide, bismuth oxide, vanadium oxide, nickel oxide, zinc oxide, gallium arsenide, gallium nitride, indium oxide, indium phosphide, indium nitride, cadmium sulfide, cadmium telluride, or strontium titanate.

The insulating layer is preferably formed with a material which transmits the multi-mode laser beam and the single-mode laser beam.

According to another aspect of a method for manufacturing a semiconductor device of the present invention, a conductive layer is formed in the opening formed in the insulating layer, or the light absorbing layer and the insulating layer.

In addition, the present invention provides a laser processing apparatus which can form an opening directly in an insulating layer.

One aspect of a laser processing apparatus of the present invention includes a first laser oscillation device which emits a first multi-mode laser beam, a first optical system which shapes the first laser beam emitted from the first laser oscillation device and performs the irradiation to an irradiated object, a second laser oscillation device which emits a second single-mode laser beam, a second optical system which shapes the second laser beam emitted from the second laser oscillation device, an optical element which divides the second laser beam passed through the second optical system and which performs irradiation of the second laser beam to the irradiated object so that the second laser beam overlaps with the first laser beam, and a stage which holds the irradiated object and moves to a desired place.

Another aspect of a laser processing apparatus of the present invention includes a first laser oscillation device which emits a first laser beam which is a multi-mode laser beam; a first optical system which shapes the first laser beam emitted from the first laser oscillation device and performs the irradiation to an irradiated object; a second laser oscillation device which emits a second laser beam which is a single-mode laser beam; a second optical system which shapes the second laser beam emitted from the second laser oscillation device; a deflector which divides the second laser beam passed through the second optical system and which performs irradiation of the second laser beam to the irradiated object so that the second laser beam overlaps with the first laser beam; and a stage which holds the irradiated object and moves to a desired place.

The first laser oscillation device is preferably a YAG laser, a $YVO_4$ laser, or an excimer laser. In addition, the second laser oscillation device is preferably a femtosecond laser or a picosecond laser.

According to another aspect of a laser processing apparatus of the present invention, part of the irradiated object which is a region where the irradiation is performed with the second laser beam so that the second laser beam overlap with the first laser beam, is removed.

According to another aspect of a laser processing apparatus of the present invention, the irradiated object is a lamination body in which a light absorbing layer and an insulating layer are sequentially stacked over a substrate, and an irradiation with the second laser beam is performed so that the second laser beam overlaps with the first laser beam, and the light absorbing layer and the insulating layer, or the insulating layer is removed.

An opening can be formed in a thin film such as an insulating layer by applying the present invention without using a photoresist.

According to the present invention, lithography steps in forming an opening can be simplified or the number of lithography steps can be reduced in a manufacturing process of a semiconductor device. Therefore, the manufacturing cost can be reduced and the throughput can be improved.

BRIEF DESCRIPTION OF DRAWINGS

In the accompanying drawings:

FIGS. 27A and 27B are views illustrating an example of a display device of the present invention;

DETAILED DESCRIPTION OF THE INVENTION

Figure 1A:
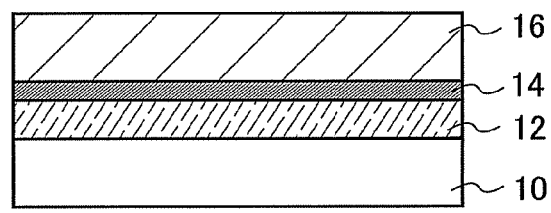
FIGS. 1A to 1D are conceptual views illustrating the present invention.
Figure 1B:
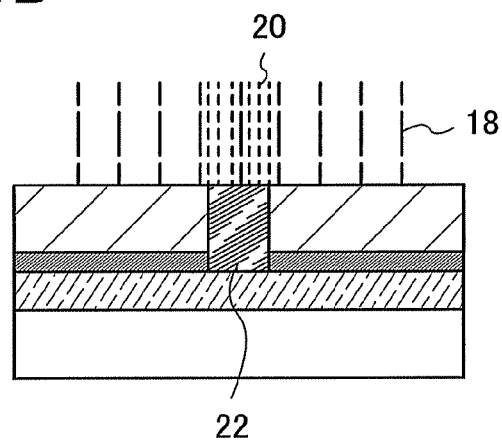
Figure 1C:
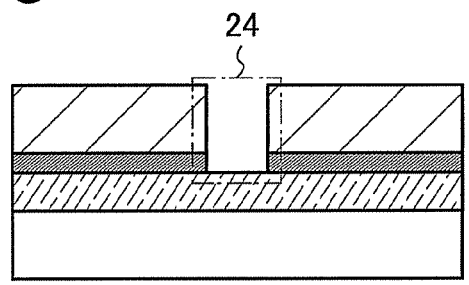
Figure 1D:
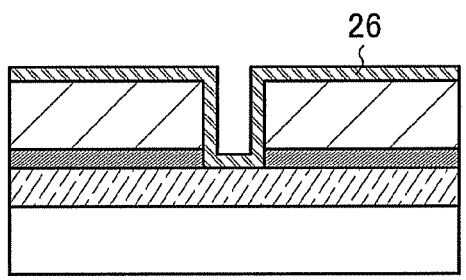

Embodiment modes of the present invention will be described hereinafter with reference to the accompanying drawings. However, it is to be easily understood by those skilled in the art that the present invention is not limited to the description below and various changes in modes and details thereof will be apparent without departing from the purpose and the scope of the present invention. Therefore, the present invention should not be interpreted as being limited to the description of the embodiment modes below. Note that reference numerals denoting the same portions are used in common in different drawings in the structures of the present invention described below.

Embodiment Mode 1

The present invention has a feature in that an opening is formed in a desired region without using a lithography technique with a photoresist. In this embodiment mode, an opening for electrically connecting conductive layers to each other is formed in an insulating layer. Hereinafter, one mode of a method for forming an opening in an insulating layer by applying the present invention will be specifically described with reference to FIGS. 1A to 1D.

First, a substrate 10 over which a conductive layer 12, a light absorbing layer 14, and an insulating layer 16 are sequentially stacked is prepared (see FIG. 1A). The substrate over which the conductive layer 12, the light absorbing layer 14, and the insulating layer 16 are sequentially stacked are an irradiated object of this embodiment mode.

As the substrate 10, a glass substrate, a quartz substrate, a sapphire substrate, a ceramic substrate, a semiconductor substrate, or the like is used. Note that a base insulating layer can also be formed over the substrate 10. In this case, the base insulating layer may be formed using an insulating material such as silicon oxide, silicon nitride, silicon oxynitride, or silicon nitride oxide.

The conductive layer 12 is formed using a conductive material without being particularly limited. For example, an element of silver (Ag), gold (Au), nickel (Ni), platinum (Pt), palladium (Pd), iridium (Ir), rhodium (Rh), tantalum (Ta), tungsten (W), titanium (Ti), molybdenum (Mo), aluminum (Al), or copper (Cu), or an alloy material or a compound material containing the element as its main component can be used. As the compound containing the element as its main component, a nitrogen compound, an oxygen compound, a carbon compound, a halogen compound, or the like can be used. Specifically, aluminum nitride, tungsten nitride, tantalum nitride, or the like can be used. The conductive layer 12 can be formed in a single layer structure or a stacked layer structure, using any of these conductive materials by a sputtering method, a CVD method, or the like.

The light absorbing layer 14 is formed using a material which can absorb a laser beam. In addition, the light absorbing layer 14 is preferably formed using a material of which temperature of a boiling point or a sublimation point is lower than that of a melting point of the conductive layer 12 below. For example, a conductive material such as any of elements of chromium (Cr), molybdenum (Mo), nickel (Ni), titanium (Ti), cobalt (Co), copper (Cu), or aluminum (Al), or an alloy material or a compound containing the element as its main component can be used. As the compound containing the element as its main component, a nitrogen compound, an oxygen compound, a carbon compound, a halogen compound, or the like can be used, and, for example, aluminum nitride, tungsten nitride, tantalum nitride, or the like can be used. Besides, a semiconductor material such as silicon, germanium, silicon germanium, molybdenum oxide, tin oxide, bismuth oxide, vanadium oxide, nickel oxide, zinc oxide, gallium arsenide, gallium nitride, indium oxide, indium phosphide, indium nitride, cadmium sulfide, cadmium telluride, or strontium titanate can be used. Further, zinc sulfide, silicon nitride, mercury sulfide, aluminum chloride, or the like can be used. The light absorbing layer 14 can be formed in a single layer structure or a stacked layer structure, using such a material as described above by an evaporation method, a sputtering method, a CVD method, or the like. In addition, the light absorbing layer 14 can also be added with hydrogen or an inert gas (a rare gas such as helium (He), argon (Ar), krypton (Kr), neon (Ne), or xenon (Xe)). The light absorbing layer 14 is added with hydrogen or an inert gas, so that discharge of gas or vaporization easily occurs in the light absorbing layer 14 when irradiation of a laser beam will be performed later.

The insulating layer 16 is formed using a material which can transmit a laser beam. For example, a light-transmitting inorganic insulating material or organic insulating material, or the like is used. As the inorganic insulating material, silicon oxide, silicon nitride, silicon oxynitride, silicon nitride oxide, or the like can be used. As the organic insulating material, an organic resin such as polyimide, acrylic, polyamide, polyimide amide, benzocyclobutene, or an epoxy resin, or the like can be used. The insulating layer 16 can be formed in a single layer structure or a stacked layer structure, using any of these materials by a sputtering method, a CVD method, a coating method, or the like.

Next, irradiation of a laser beam is performed from the insulating layer 16 side. The irradiation of the laser beam is performed so that a first laser beam 18 and a second laser beam 20 overlap with each other. In the light absorbing layer 14 and the insulating layer 16, a region the irradiation of which is performed so that the first laser beam 18 and the second laser beam 20 overlap with each other is to be an overlap irradiation region 22 (see FIG. 1B).

Figure 3A:
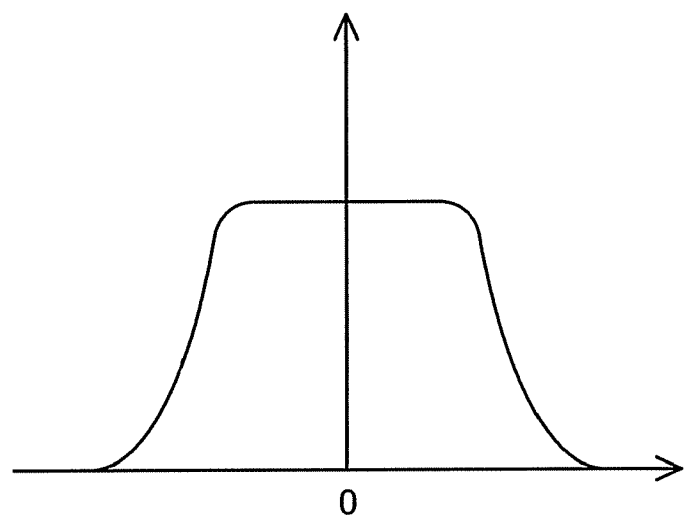
FIGS. 3A and 3B are conceptual diagrams illustrating the present invention.
Figure 3B:
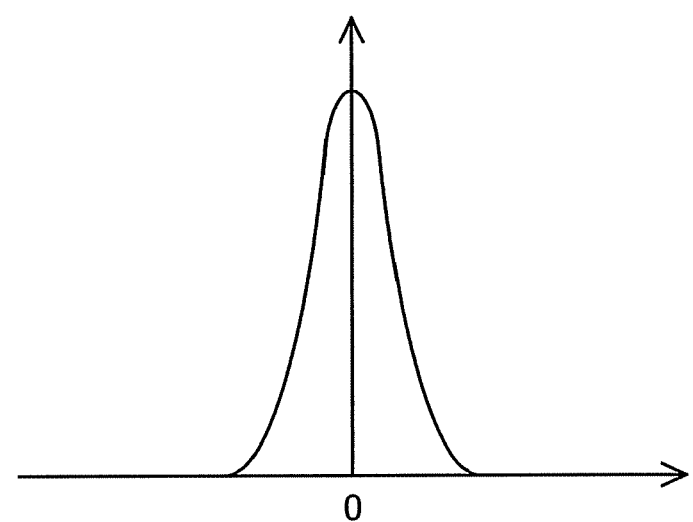

As the first laser beam 18, irradiation of a multi-mode laser beam is performed. As the second laser beam 20, irradiation of a single-mode laser beam is performed. Here, FIG. 3A illustrates a waveform of energy distributions in a cross section of a multi-mode laser beam (corresponding to the first laser beam 18). FIG. 3B illustrates a waveform of energy distributions in a cross section of a single-mode laser beam (corresponding to the second laser beam 20). The waveforms illustrated in FIGS. 3A and 3B are each energy distributions of a cross section in a vertical direction with respect to a traveling direction of the laser beam. The waveforms illustrated in FIGS. 3A and 3B each indicate energy intensity of the laser beam in a vertical axis and a distance from the center of the laser beam in a horizontal axis.

The energy distributions in such a cross section of a multi-mode laser beam as illustrated in FIG. 3A have a broad peak width. In a multi-mode laser beam, generally, the entire energy is high; thus, high output power can be obtained. Such a multi-mode laser beam, that is, the first laser beam 18 in this embodiment mode can be obtained using an oscillator such as an excimer laser oscillator of KrF, ArF, XeCl, or the like; a gas laser oscillator of He, He—Cd, Ar, He—Ne, or the like; a solid-state laser oscillator using a medium of a single crystal such as YAG, YVO$_4$, forsterite (Mg$_2$SiO$_4$), YAlO$_3$, or GdVO$_4$ or a polycrystal (ceramic) such as YAG, Y$_2$O$_3$, YVO$_4$, YAlO$_3$, or GdVO$_4$, to which one or more of Nd, Yb, Cr, Ti, Ho, Er, Tm, or Ta is added as a dopant; or a semiconductor laser oscillator of GaN, GaAs, GaAlAs, InGaAsP, or the like. When a YAG laser, a YVO$_4$ laser, or an excimer laser is used as the first laser beam 18, high output power is likely to be obtained, which is preferable. In addition, when the solid-state laser oscillator is used, it is preferable to select as appropriate from a fundamental wave to a fifth harmonic. The multi-mode laser beam can be obtained by selecting as appropriate an excitation method of the gas laser oscillator or the solid-state laser oscillator. As the first laser beam 18, either a continuous wave laser beam or a pulsed laser beam may be used.

On the other hand, the energy distributions in such a cross section of a single-mode laser beam as illustrated in FIG. 3B have a sharp peak near the center (near the center of the laser beam). Such a waveform as illustrated in FIG. 3B is also referred to as a Gaussian distribution. Since the single-mode laser beam has a sharp peak, a convergence property is favorable and the laser beam can also be converged into a spot having a diameter of several μm. Such a single-mode laser beam, that is, the second laser beam 20 in this embodiment mode can be obtained using an oscillator such as a pulsed laser oscillator with which a laser beam the pulse width of which is in the range of picosecond or femtosecond ($10^{-15}$ seconds) can be obtained; a gas laser oscillator of He, He—Cd, Ar, He—Ne, or the like; or a solid-state laser oscillator using a medium of a single crystal such as YAG, YVO$_4$, forsterite (Mg$_2$SiO$_4$), YAlO$_3$, or GdVO$_4$ or a polycrystal (ceramic) such as YAG, Y$_2$O$_3$, YVO$_4$, YAlO$_3$, or GdVO$_4$, to which one or more of Nd, Yb, Cr, Ti, Ho, Er, Tm, or Ta is added as a dopant. When the solid-state laser oscillator is used, it is preferable to select as appropriate from a fundamental wave to a fifth harmonic. The single-mode laser beam can be obtained by selecting as appropriate an excitation method of the gas laser oscillator or the solid-state laser oscillator.

The first laser beam 18 and the second laser beam 20 transmit the insulating layer 16 and are absorbed by the light absorbing layer 14. The light absorbing layer 14 is removed along with the insulating layer 16 thereabove by ablation in the region where the irradiation is performed so that the first laser beam 18 and the second laser beam 20 overlap with each other (the overlap irradiation region 22). Consequently, an opening 24 is formed. At the bottom surface of the opening 24, the conductive layer 12 is exposed (see FIG. 1C).

Ablation occurs when irradiation of a laser beam having energy greater than or equal to a certain threshold value is performed. Hereinafter, a threshold value of energy of a laser beam at which ablation occurs is also referred to as an ablation threshold value in this specification. In this embodiment mode, ablation of the light absorbing layer 14 and the insulating layer 16 occurs when energy of the laser beams absorbed by the light absorbing layer 14 is greater than or equal to an ablation threshold value. Therefore, when energy of the laser beams absorbed by the light absorbing layer 14, that is, energy of the irradiated laser beams is less than the ablation threshold value, the ablation of the light absorbing layer 14 and the insulating layer 16 does not occur even when irradiation of the laser beams is performed.

In this embodiment mode, energy of the first laser beam 18 is less than the ablation threshold value. Synthesized energy of the second laser beam 20 and the first laser beam 18 is to be greater than or equal to the ablation threshold value.

For example, energy of the first laser beam 18, the second laser beam 20, and the ablation threshold value are to be A, B, and C, respectively. The present invention satisfies the following formulas (1) and (2).

[Formula 1]

$$A < C \tag{1}$$

[Formula 2]

$$A + B > C \tag{2}$$

In a region irradiated only with the first laser beam 18 in the irradiated object, the first laser beam 18 transmits the insulating layer 16 and is absorbed by the light absorbing layer 14. However, since energy of the laser beam absorbed by the light absorbing layer 14 is less than the ablation threshold value, ablation does not occur. In the region where the irradiation is performed so that the first laser beam 18 and the second laser beam 20 overlap with each other, energy of the first laser beam 18 and the second laser beam 20 are synthesized. Consequently, energy of the laser beams absorbed by the light absorbing layer 14 gets greater than or equal to the ablation threshold value and ablation occurs. According to the ablation, the shape of the opening 24 formed in the irradiated object (the light absorbing layer 14 and the insulating layer 16) depends on the second laser beam 20. Since the second laser beam 20 can supply energy locally with a favorable convergence property, a minute opening the diameter of which is several μm can be formed.

The multi-mode laser beam generally has an advantage that high output power can be obtained; however, the multi-mode laser beam is only converged into a diameter of not less than approximately several hundred μm with a poor convergence property. On the other hand, the single-mode laser beam, which has a favorable convergence property because energy can be supplied locally, has an advantage that it can be converged into a diameter of approximately several μm; however, the total energy is low and it is difficult to obtain high output power.

The present inventors find that, when the irradiated object is irradiated with a laser beam having energy less than the ablation threshold value, the irradiated object does not alter at all and that ablation occurs only when the irradiated object is irradiated with a laser beam having energy greater than or equal to the ablation threshold value. Detailed description is provided with reference to FIGS. 32A and 32B.

Figure 32A:
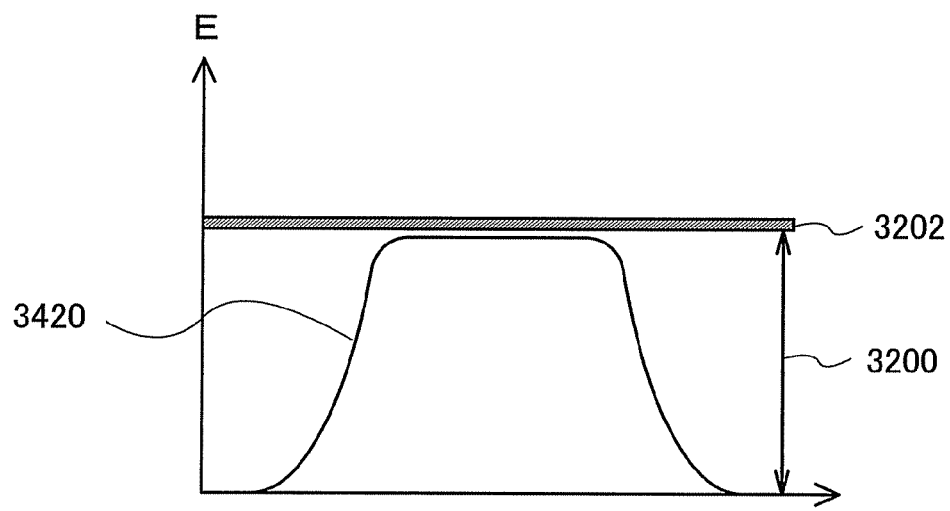
FIGS. 32A and 32B are conceptual diagrams illustrating the present invention.
Figure 32B:
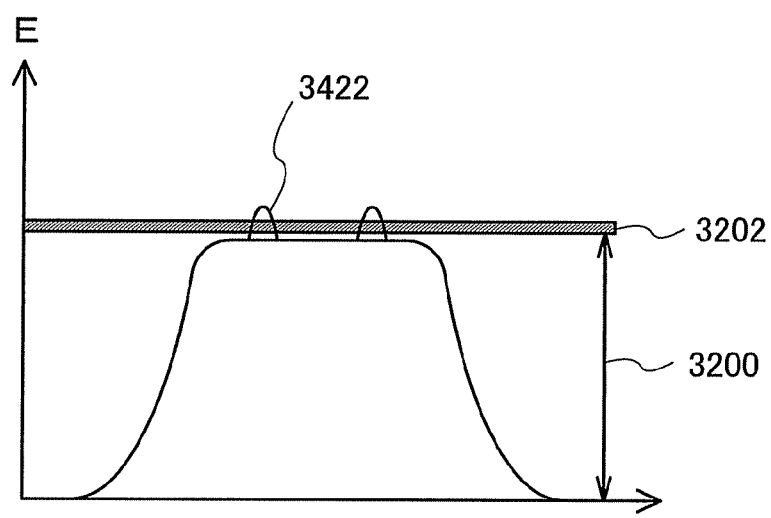

FIGS. 32A and 32B are diagrams each illustrating the relation of ablation and energy, where a vertical axis indicates energy (E) and a horizontal axis indicates a length. In addition, FIGS. 32A and 32B illustrate a waveform 3420 of energy distributions in a cross section of the multi-mode laser beam and a waveform 3422 of energy distributions in a cross section of the single-mode laser beam, respectively.

In FIG. 32A, when the irradiated object is irradiated with a laser beam having energy less than an ablation threshold value 3202, that is, energy within an energy range 3200, the irradiated object does not alter at all. The waveform 3420 is within the energy range 3200, that is, less than the ablation threshold value 3202. Therefore, even when the irradiated object is irradiated with a multi-mode laser beam the energy distributions of which show the waveform 3420, the irradiated object does not alter at all.

FIG. 32B illustrates an example in which irradiation with the single-mode laser beam the energy distributions of which show the waveform 3422 is performed so that the single-mode laser beam overlap with the multi-mode laser beam the energy distributions of which show the waveform 3420. In the region where the irradiation is performed so that both the laser beams overlap with each other, energy of the multi-mode laser beam the energy distributions of which show the waveform 3420 and energy of the single-mode laser beam the energy distributions of which show the waveform 3422 are synthesized. Accordingly, the waveform 3422 becomes greater than or equal to the ablation threshold value 3202. Consequently, ablation of the irradiated object occurs only in the region where the irradiation is performed so that the multi-mode laser beam and the single-mode laser beam overlap with each other. In addition, since the ablation of the irradiated object depends on the single-mode laser beam, the shape or size of the opening which is formed by the ablation of the irradiated object also depends on the single-mode laser beam.

In the present invention, the irradiated object is irradiated with the first multi-mode laser beam 18 and the second single-mode laser beam 20 to overlap with each other, whereby energy greater than or equal to the ablation threshold value is supplied. It is found from FIGS. 32A and 32B that the first multi-mode laser beam 18 can have high energy to the utmost limit within the energy range in which energy is less than the ablation threshold value. Therefore, since a high assist effect can be obtained from the multi-mode laser beam in the present invention, an effect that energy of the single-mode laser beam can be reduced is achieved. That is, the following formula (3) can be satisfied.

[Formula 3]

$$A \gg B \quad (3)$$

Therefore, it is possible to utilize advantages of both the laser beams that the minute opening can be formed by the single-mode laser beam while energy is gained with the multi-mode laser beam. Irradiation of the first multi-mode laser beam 18 is performed, so that irradiation of a laser beam which has energy large to some extent and is homogenized can be performed extensively. In addition, a region where it is desired to form an opening by ablation is irradiated with the second single-mode laser beam 20 to overlap with the first multi-mode laser beam 18. Since the second laser beam 20 can supply energy locally, a minute opening can be formed by performing ablation in a minute region.

In addition, as described above, since irradiation energy of the second single-mode laser beam 20 can be reduced, the second laser beam 20 can be divided into a plurality of laser beams. Consequently, a plurality of minute openings can also be formed at the same time.

For example, the first multi-mode laser beam 18 can easily obtain high output power when a YAG laser, a YVO$_4$ laser, or an excimer laser is used. Therefore, when any of these lasers is used, high energy can be supplied extensively with ease and an assist effect is increased, which is preferable. In addition, the second single-mode laser beam is likely to converge in a minute region when a femtosecond laser or a picosecond laser is used. Therefore, when any of these lasers is used, energy can be supplied locally with ease and minute processing can be performed, which is preferable.

Next, a conductive layer 26 is formed over the opening 24. The conductive layer 26 is electrically connected to the conductive layer 12. In addition, the conductive layer 26 is electrically connected also to the light absorbing layer 14 when the light absorbing layer 14 is formed using a conductive material (see FIG. 1D). Through the above steps, the opening which electrically connects the conductive layers can be formed in the insulating layer without using a lithography technique with a photoresist.

An opening can be formed in a desired region by applying the present invention without using a lithography step with a photoresist. Thus, lithography steps can be simplified and/or the number of lithography steps can be reduced, the loss of a material such as a resist material or a developing solution can be prevented, and the number of photomasks which are necessary can be reduced. Consequently, reduction in the manufacturing cost of a semiconductor device can be achieved. Further, since lithography steps can be simplified and/or the number of lithography steps can be reduced, the throughput can also be improved.

Embodiment Mode 2

In this embodiment mode, one structural example of a laser processing apparatus of the present invention will be described.

Figure 2:
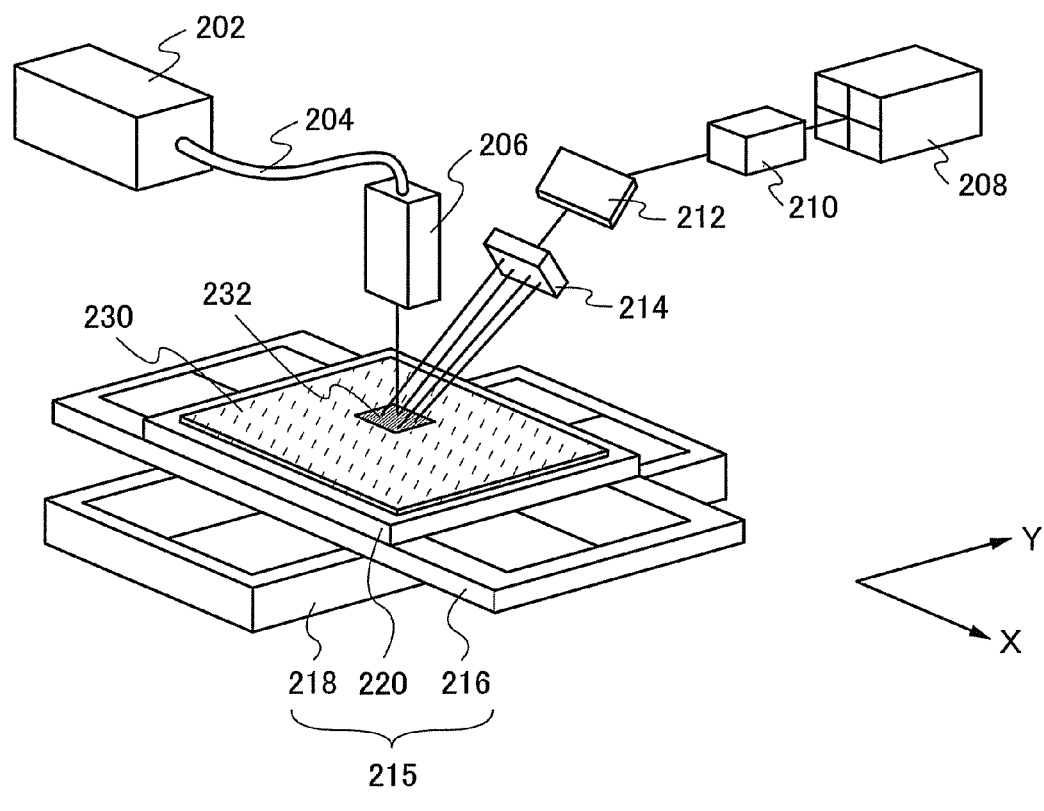
FIG. 2 is a view illustrating a laser processing apparatus of the present invention.

A schematic view of a laser processing apparatus is illustrated in FIG. 2. In FIG. 2, a laser processing apparatus 200 includes a first laser oscillation device 202, a first optical system 206 which shapes a laser beam, a second laser oscillation device 208, a second optical system 210 which shapes a laser beam, a diffractive optical element 214 which divides a laser beam passed through the second optical system 210 into a plurality of laser beams, and a stage 215.

The first laser oscillation device 202 includes a laser oscillator with which a multi-mode laser beam can be obtained. For example, an excimer laser oscillator of KrF, ArF, XeCl, or the like; a gas laser oscillator of He, He—Cd, Ar, He—Ne, or the like; a solid-state laser oscillator using a medium of a single crystal such as YAG, YVO$_4$, forsterite (Mg$_2$SiO$_4$), YAlO$_3$, or GdVO$_4$ or a polycrystal (ceramic) such as YAG, Y$_2$O$_3$, YVO$_4$, YAlO$_3$, or GdVO$_4$, to which one or more of Nd, Yb, Cr, Ti, Ho, Er, Tm, or Ta is added as a dopant; or a semiconductor laser oscillator of GaN, GaAs, GaALAs, InGaAsP, or the like can be used. When an oscillator of a YAG laser, a YVO$_4$ laser, or an excimer laser is used for the first laser oscillation device 202, high output power is likely to be obtained, which is preferable. When the solid-state laser oscillator is used, it is preferable to select as appropriate one of a fundamental wave to a fifth harmonic. In addition, either an oscillator which can obtain a continuous wave laser beam or an oscillator which can obtain a pulsed laser beam may be used.

The first optical system 206 is an optical system for shaping a laser beam emitted from the first laser oscillation device 202 into a desired shape. Specifically, a cross-sectional shape of the laser beam is formed into a planar shape such as a circular shape, an elliptic shape, or a rectangular shape; a linear shape (in a strict sense, a narrow rectangular shape); or the like. The first optical system 206 may include a plurality of lenses so that a spread angle of the laser beam is suppressed and the laser beam is converged into the irradiated surface. For example, the first optical system 206 can be used in combination with a diffractive optical element, a homogenizer, and the like. Energy distributions of the laser beam can be homogenized also by combining the first optical system 206 with the homogenizer or the like.

An optical fiber 204 is preferably provided between the first laser oscillation device 202 and the first optical system 206. The optical fiber 204 can transfer a laser beam emitted from the first laser oscillation device 202 to the first optical system 206. In addition, the optical fiber 204, which has flexibility, can be moved freely. Therefore, a desired place of an irradiated object 230 can be irradiated with a laser beam by moving the optical fiber 204. Note that the present invention is not particularly limited and one that can transfer a laser beam may be provided between the first laser oscillation device 202 and the first optical system 206.

The second laser oscillation device 208 includes a laser oscillator with which a single-mode laser beam can be obtained. For example, a pulsed laser oscillator with which a laser beam the pulse width of which is in the range of picosecond or femtosecond ($10^{-15}$ seconds) can be obtained; a gas laser oscillator of He, He—Cd, Ar, He—Ne, or the like; a solid-state laser oscillator using a medium of a single crystal such as YAG, YVO$_4$, forsterite (Mg$_2$SiO$_4$), YAlO$_3$, or GdVO$_4$ or a polycrystal (ceramic) such as YAG, Y$_2$O$_3$, YVO$_4$, YAlO$_3$, or GdVO$_4$, to which one or more of Nd, Yb, Cr, Ti, Ho, Er, Tm, or Ta is added as a dopant; or the like can be used.

The second optical system 210 is an optical system for shaping a laser beam emitted from the second laser oscillation device 208. Specifically, a cross-sectional shape of the laser beam is formed into a planar shape such as a circular shape, an elliptic shape, or a rectangular shape; a linear shape (in a strict sense, a narrow rectangular shape); or the like. For example, as the second optical system 210, an expander which adjusts a beam diameter of a laser beam, or the like can be used.

The diffractive optical element 214 is an optical element which divides a laser beam passed through the second optical system 210 into a plurality of laser beams. The diffractive optical element 214 can control behavior of the laser beam according to a diffraction phenomenon of a planar structure of the diffractive optical element 214. Specifically, the diffractive optical element 214 can control energy distributions of a beam spot formed on a surface to be irradiated by irradiation of the laser beam by a diffraction phenomenon of a planar structure of the diffractive optical element 214. For example, the energy distribution of a beam spot formed on a surface to be irradiated can have a large number of peaks by the diffractive optical element 214. Consequently, a laser beam can be divided into a plurality of laser beams on the surface to be irradiated. The planar structure of the diffractive optical element 214 is designed as appropriate, so that the laser beam can be divided into a plurality of laser beams and also desired places of the irradiated object 230 can be irradiated with the laser beams.

For example, the diffractive optical element 214 can be manufactured by optimizing and designing phase distributions by an ORA (Optimal Rotation Angle) method or the like. Alternatively, the diffractive optical element 214 can also be manufactured by being automatically designed with optical design software whereby wave optical analysis can be performed.

As a physical shape of the diffractive optical element 214, a binary phase grating, a multiple phase grating, a consecutive phase grating, or the like can be applied. A transmission type diffractive optical element or a reflective type diffractive optical element may be used as the diffractive optical element 214. The transmission type is to be used as the diffractive optical element 214 shown in this embodiment mode.

In addition, a mirror or the like is preferably provided as appropriate in order to control a traveling direction, a deflection direction, or the like of the laser beam. As the mirror, a galvanometer mirror or a polygon mirror may be provided. In this embodiment mode, a mirror 212 is provided between the second optical system 210 and the diffractive optical element 214. The laser beam, which is passed through the second optical system 210, is deflected by the mirror 212.

The stage 215 holds the irradiated object 230 and moves in a desired direction. In this embodiment mode, the stage 215 is composed of a suction stage 220, a transport stage 216 that moves in an X-axis direction, and a transport stage 218 that moves in a Y-axis direction. The irradiated object 230 is sucked by the suction stage 220 and fixed. In addition, the irradiated object 230 is moved by the transport stages 216 and 218 so that laser beam irradiation is performed in a desired region. Therefore, when a certain region in a surface of the irradiated object 230 is irradiated with a laser beam to complete processing of the irradiated object, the irradiated object 230 can be moved and laser beam irradiation can be performed to another region to be processed by making the transport stages 216 and 218 to operate.

Note that the structure of the laser processing apparatus illustrated in FIG. 2 is just an example and the positional relationship of the optical systems and the diffractive optical element arranged in an optical path of a laser beam is not particularly limited. In addition, the mirror for controlling a traveling direction, a deflection direction, or the like of a laser beam; a homogenizer that homogenizes energy distributions of the laser beam; or the like may be provided as appropriate.

As the irradiated object 230, at least a light absorbing layer and an insulating layer are stacked over a substrate. A conductive layer, an insulating layer, or the like may be formed under the light absorbing layer. Materials of the light absorbing layer and the insulating layer follow those shown in Embodiment Mode 1. The face on which the insulating layer is formed in the irradiated object 230 is a surface to be irradiated with the laser beams.

A laser beam emitted from the first laser oscillation device 202 is transferred to the optical fiber 204, passed through the first optical system 206, and shaped. The surface of the irradiated object 230 held over the stages 215 is irradiated with the laser beam which is passed through the first optical system 206 and shaped. At this time, the surface of the irradiated object 230 is irradiated with a beam spot 232 of the laser beam emitted from the first laser oscillation device 202.

On the other hand, the laser beam emitted from the second laser oscillation device 208 is passed through the second optical system 210 and shaped. The laser beam, which is passed through the second optical system 210 and shaped, is deflected with the mirror 212, passed through the diffractive optical element 214, and divided into a plurality of laser beams. The surface of the irradiated object 230 held over the stage 215 is irradiated with the plurality of laser beams passed through the diffractive optical element 214. The ranges of the beam spot 232 of the laser beam emitted from the first laser oscillation device 202 in the surface of the irradiated object 230 are irradiated with all of the plurality of laser beams passed through the diffractive optical element 214. That is, the surface of the irradiated object 230 is irradiated with the plurality of laser beams emitted from the second laser oscillation device 208 to overlap with the laser beam emitted from the first laser oscillation device 202.

As described above, when the irradiation of the laser beam emitted from the second laser oscillation device 208 and the laser beam emitted from the first laser oscillation device 202 is performed to overlap with each other, energy of the laser beams is synthesized in the region the irradiation of which is performed so that both the laser beams overlap with each other. In this embodiment mode, the laser beam emitted from the second laser oscillation device 208 is divided into the plurality of laser beams by the diffractive optical element 214, and the irradiation of the plurality of laser beams is performed so that each laser beam overlaps with the laser beam emitted from the first laser oscillation device 202.

In the present invention, energy of the laser beam emitted from the first laser oscillation device 202 is to be less than the ablation threshold value. When energy of the laser beam emitted from the second laser oscillation device 208 is synthesized with energy of the laser beam emitted from the first laser oscillation device 202, the energy is to be greater than or equal to the ablation threshold value.

In a region of the irradiated object 230 irradiated only with the laser beam emitted from the first laser oscillation device 202, energy less than the ablation threshold value is absorbed. Therefore, ablation of the irradiated object 230 does not occur.

On the other hand, in the regions the irradiation of which is performed so that the laser beam emitted from the first laser oscillation device 202 and the laser beams emitted from the second laser oscillation device 208 overlap with each other, the synthesized energy of both the laser beams is absorbed by the irradiated object 230. Consequently, ablation of the irradiated object 230 occurs and openings are formed. Specifically, in the regions of the irradiated object 230 the irradiation of which is performed so that the laser beam emitted from the first laser oscillation device 202 and the laser beams emitted from the second laser oscillation device 208 overlap with each other, ablation of the light absorbing layer occurs, and the light absorbing layer and the insulating layer thereover, or the insulating layer over the light absorbing layer is removed. Then, a desired opening pattern is formed at least in the insulating layer.

In this embodiment mode, the laser beam emitted from the second laser oscillation device 208 is divided into the plurality of laser beams, and the irradiation of the plurality of laser beams is performed so that each laser beam overlaps with the laser beam emitted from the first laser oscillation device 202. That is, in the irradiated object 230, there are a plurality of the regions the irradiation of which is performed so that the laser beam emitted from the first laser oscillation device 202 and the laser beams emitted from the second laser oscillation device 208 overlap with each other. Therefore, in the irradiated object 230, ablation of the plurality of the regions occurs, so that a plurality of the openings can be formed at the same time.

In addition, the shape or size of the opening which are formed in the irradiated object 230 by ablation depends on the laser beam emitted from the second laser oscillation device 208. In this embodiment mode, a single-mode laser beam capable of locally supplying energy with a favorable convergence property is emitted from the second laser oscillation device 208. Therefore, minute openings can be formed in the irradiated object 230.

In this embodiment mode, as described above, as ablation of the light absorbing layer occurs in the regions the irradiation of which is performed so that the laser beam emitted from the first laser oscillation device 202 and the laser beams emitted from the second laser oscillation device 208 overlap with each other, energy of the laser beam emitted from the first laser oscillation device 202 and energy of the laser beam emitted from the second laser oscillation device 208 may be decided as appropriate.

In addition, with the laser beam emitted from the first laser oscillation device 202, high energy the upper limit of which is to be the ablation threshold value can be supplied to the irradiated object 230; therefore, energy of the laser beam emitted from the second laser oscillation device 208 can be reduced. Consequently, the laser beam emitted from the second laser oscillation device 208 can be divided into a large number of laser beams.

Further, the laser beam emitted from the second laser oscillation device 208 is divided into a large number of laser beams, and the irradiation with the divided laser beams is performed so that the laser beams overlap with the laser beam emitted from the first laser oscillation device 202. Accordingly, a large number of openings can be formed in the irradiated object 230 also by performing single irradiation of the laser beams from the first laser oscillation device 202 and the second laser oscillation device 208. Therefore, mass productivity can be improved easily in a manufacturing process of a semiconductor device.

Openings can be formed in desired regions of an irradiated object in a laser processing apparatus of the present invention without using a photoresist. Therefore, since lithography steps can be simplified and/or the number of lithography steps can be reduced in a manufacturing process of the semiconductor device, the manufacturing cost can be reduced and the throughput can be improved.

In the laser processing apparatus of the present invention, a large number of openings can be formed in the irradiated object with single treatment. Therefore, the time for a step of forming openings can be shortened and mass productivity can be improved in the manufacturing process of the semiconductor device.

Note that this embodiment mode can be freely combined with the above Embodiment Mode 1 as appropriate.

Embodiment Mode 3

In this embodiment mode, a structural example of a laser processing apparatus different from that in Embodiment Mode 2 will be described.

Figure 4:
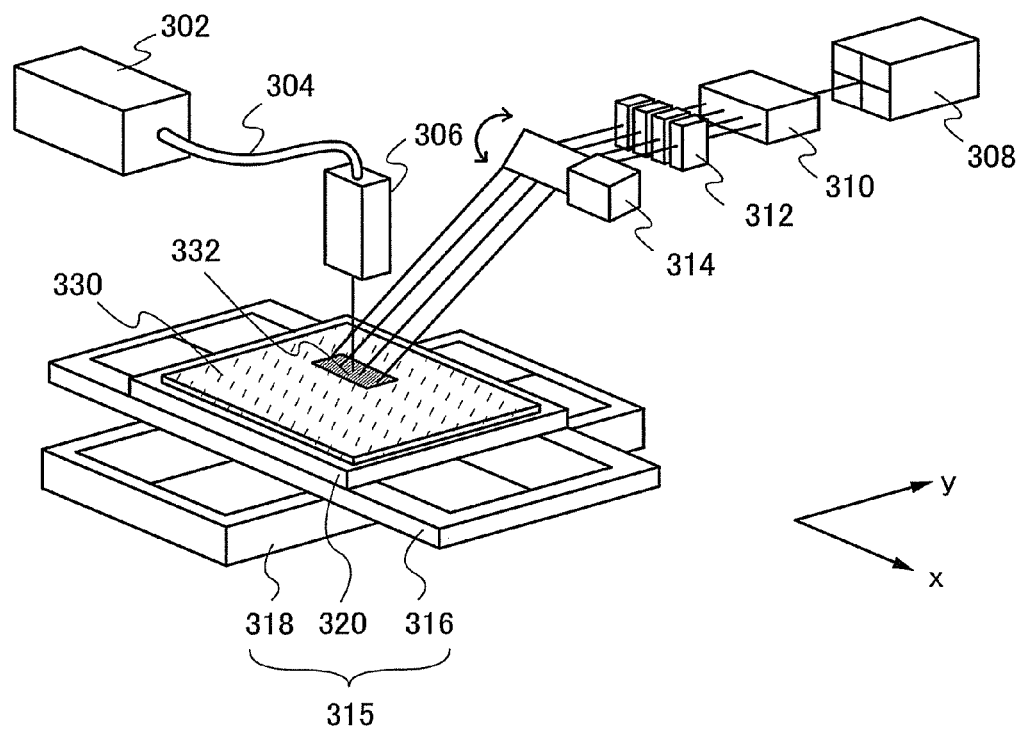
FIG. 4 is a view illustrating a laser processing apparatus of the present invention.

A schematic view of a laser processing apparatus is illustrated in FIG. 4. In FIG. 4, a laser processing apparatus 300 includes a first laser oscillation device 302, a first optical system 306 which shapes a laser beam, a second laser oscillation device 308, a second optical system 310 which divides a laser beam into a plurality of laser beams, a first deflector 312 and a second deflector 314 which control traveling directions of laser beams, and a stage 315.

The first laser oscillation device 302 includes a laser oscillator with which a multi-mode laser beam can be obtained. As the first laser oscillation device 302, specifically, a laser oscillator similar to the first laser oscillation device 202 shown in Embodiment Mode 2 can be used. When an oscillator of a YAG laser, a YVO$_4$ laser, or an excimer laser is used for the first laser oscillation device 302, high output power is likely to be obtained, which is preferable.

The first optical system 306 is an optical system for shaping a laser beam emitted from the first laser oscillation device 302 into a desired shape. Specifically, a cross-sectional shape of the laser beam is formed into a planar shape such as a circular shape, an elliptic shape, or a rectangular shape; a linear shape (in a strict sense, a narrow rectangular shape); or the like. The first optical system 306 may include a plurality of lenses so that a spread angle of the laser beam is suppressed and the laser beam is converged into the irradiated surface. In addition, the first optical system 306 may be combined with a homogenizer that homogenizes energy distributions of a laser beam, or the like.

An optical fiber 304 is preferably provided between the first laser oscillation device 302 and the first optical system 306. The optical fiber 304 can transfer a laser beam emitted from the first laser oscillation device 302 to the first optical system 306. In addition, the optical fiber 304, which has flexibility, can be moved freely. Therefore, a desired place of an irradiated object 330 can be irradiated with a laser beam by moving the optical fiber 304. Note that the present invention is not particularly limited and one that can transfer a laser beam may be provided between the first laser oscillation device 302 and the first optical system 306.

The second laser oscillation device 308 includes a laser oscillator with which a single-mode laser beam can be obtained. For example, a pulsed laser oscillator with which a laser beam the pulse width of which is in the range of picosecond or femtosecond ($10^{-15}$ seconds) can be obtained; a gas laser oscillator of He, He—Cd, Ar, He—Ne, or the like; a solid-state laser oscillator using a medium of a single crystal such as YAG, YVO$_4$, forsterite (Mg$_2$SiO$_4$), YAlO$_3$, or GdVO$_4$ or a polycrystal (ceramic) such as YAG, Y$_2$O$_3$, YVO$_4$, YAlO$_3$, or GdVO$_4$, to which one or more of Nd, Yb, Cr, Ti, Ho, Er, Tm, or Ta is added as a dopant; or the like can be used.

The second optical system 310 is an optical system to shape and divide a laser beam emitted from the second laser oscillation device 308 into a plurality of laser beams. The second optical system 310 may be composed of a polarizing plate and a polarizer in combination as appropriate. The second optical system 310 can have a function to make a laser beam branch by being composed of a polarizing plate and a polarizer in combination. In addition, a half mirror or the like that can make a laser beam branch may be incorporated in the second optical system 310.

The first deflector 312 deflects divided laser beams passed through the second optical system 310 and controls the traveling direction of the laser beams. For example, an AOD (Acousto-Optical Deflector) can be used as the first deflector 312. An AOD is a deflector that deflects a laser beam by acousto-optic change in an optical medium. The optical medium used for an AOD may be selected as appropriate depending on a wavelength, a deflection direction, energy, or the like of a laser beam to be deflected. For example, when a laser beam in a visible region is deflected with an AOD, gallium phosphorus, tellurium dioxide, indium phosphorus, or the like can be used as the optical medium. An AOD is used as the first deflector 312 to deflect laser beams and to control the traveling directions of the laser beams, so that on and off of laser beam irradiation can be switched. Here, an on state of laser beam irradiation refers to deflection which is performed so that an irradiated surface is irradiated with laser beams. On the other hand, an off state of laser beam irradiation refers to that an irradiated surface is not irradiated with laser beams or other than an irradiated surface is irradiate with laser beams.

The second deflector 314 deflects laser beams passed through the first deflector 312 and controls the traveling direction of the laser beams. For example, a galvanometer mirror can be used as the second deflector 314. In a galvanometer mirror, the setting angles of the mirror can be set arbitrarily. Therefore, a desired place of the irradiated object 330 can be irradiated with the laser beams by using a galvanometer mirror as the second deflector 314.

The stage 315 holds the irradiated object 330 and moves in a desired direction. In this embodiment mode, the stage 315 is composed of a suction stage 320, a transport stage 316 that moves in an X-axis direction, and a transport stage 318 that moves in a Y-axis direction. The irradiated object 330 is sucked by the suction stage 320 and fixed. In addition, the irradiated object 330 is moved by the transport stages 316 and 318 so that laser beam irradiation is performed in a desired region. Therefore, when a certain region in a surface of the irradiated object 230 is irradiated with a laser beam to complete processing of the irradiated object, the irradiated object 230 can be moved and laser beam irradiation can be performed to another region to be processed by making the transport stages 316 and 318 operate.

Note that the structure of the laser processing apparatus illustrated in FIG. 4 is just an example and the positional relationship of the optical systems, the deflectors, and the like arranged in an optical path of a laser beam is not particularly limited. In addition, the mirror for controlling a traveling direction, a deflection direction, or the like of a laser beam; a homogenizer that homogenizes energy distributions of the laser beam; or the like may be provided as appropriate. In this embodiment mode, the structure is described in which a plurality of deflectors of the first deflector 312 and the second deflector 314 are provided; however, the present invention is not particularly limited. Therefore, a structure in which only one deflector is provided may be employed or a structure in which a plurality of three or more deflectors are provided may be employed.

As the irradiated object 330, at least a light absorbing layer and an insulating layer are stacked over a substrate. A conductive layer, an insulating layer, or the like may be formed under the light absorbing layer. Materials of the light absorbing layer and the insulating layer follow those shown in Embodiment Mode 1. The face on which the insulating layer is formed in the irradiated object 330 is a surface to be irradiated with the laser beams.

A laser beam emitted from the first laser oscillation device 302 is transferred to the optical fiber 304, passed through the first optical system 306, and shaped. The surface of the irradiated object 330 held over the stage 315 is irradiated with the laser beam that is passed through the first optical system 306 and shaped. At this time, the surface of the irradiated object 330 is irradiated with a beam spot 332 of the laser beam emitted from the first laser oscillation device 302.

On the other hand, the laser beam emitted from the second laser oscillation device 308 is passed through the second optical system 310 and divided into a plurality of laser beams. In this embodiment mode, the laser beam emitted from the second laser oscillation device 308 is to pass the second optical system 310 and to be divided into 4 laser beams.

Needless to say, the present invention is not particularly limited and the laser beam can be divided into laser beams the number of which is less than 4 or more than 4.

The divided plurality of laser beams passed through the second optical system 310 are deflected with the first deflector 312 and the traveling directions are controlled. The plurality of laser beams passed through the first deflector 312 are further deflected with the second deflector 314 and the traveling directions are controlled. The surface of the irradiated object 330 held over the stage 315 is irradiated with the plurality of laser beams passed through the second deflector 314. The ranges of the beam spot 332 of the laser beam emitted from the first laser oscillation device 302 in the surface of the irradiated object 330 are irradiated with all of the plurality of laser beams passed through the second deflector 314. That is, the surface of the irradiated object 330 is irradiated with the plurality of laser beams emitted from the second laser oscillation device 308 to overlap with the laser beam emitted from the first laser oscillation device 302.

As described above, when the irradiation of the laser beam emitted from the second laser oscillation device 308 and the laser beam emitted from the first laser oscillation device 302 is performed to overlap with each other, energy of the laser beams is synthesized in the regions the irradiation of which is performed so that both the laser beams overlap with each other. In this embodiment mode, the laser beam emitted from the second laser oscillation device 308 is divided into the plurality of laser beams by the second optical system 310, and the irradiation of the plurality of laser beams is performed so that each laser beam overlaps with the laser beam emitted from the first laser oscillation device 302 by passing through the deflectors (the deflectors 312 and 314).

In the present invention, energy of the laser beam emitted from the first laser oscillation device 302 is to be less than the ablation threshold value. When energy of the laser beam emitted from the second laser oscillation device 308 is synthesized with energy of the laser beam emitted from the first laser oscillation device 302, the energy is to be greater than or equal to the ablation threshold value.

In a region of the irradiated object 330 irradiated only with the laser beam emitted from the first laser oscillation device 302, the energy less than the ablation threshold value is absorbed. Therefore, ablation of the irradiated object 330 does not occur.

On the other hand, in the regions the irradiation of which is performed so that the laser beam emitted from the first laser oscillation device 302 and the laser beams emitter from the second laser oscillation device 308 overlap with each other, the synthesized energy of both the laser beams is absorbed by the irradiated object 330. Consequently, ablation of the irradiated object 330 occurs and openings are formed. Specifically, in the regions of the irradiated object 330 the irradiation of which is performed so that the laser beam emitted from the first laser oscillation device 302 and the laser beams emitted from the second laser oscillation device 308 overlap with each other, ablation of the light absorbing layer occurs, and the light absorbing layer and the insulating layer thereover, or the insulating layer over the light absorbing layer is removed. Then, a desired opening pattern is formed at least in the insulating layer.

In this embodiment mode, the laser beam emitted from the second laser oscillation device 308 is divided into the plurality of laser beams by the second optical system 310, and the irradiation of the plurality of laser beams is performed so that each laser beam overlaps with the laser beam emitted from the first laser oscillation device 302. That is, in the irradiated object 330, there are a plurality of the regions the irradiation of which is performed so that the laser beam emitted from the first laser oscillation device 302 and the laser beams emitted from the second laser oscillation device 308 overlap with each other. Therefore, in the irradiated object 330, ablation of the plurality of the regions occurs, so that a plurality of the openings can be formed at the same time.

In addition, the shape of the openings which are formed in the irradiated object 330 by ablation depends on the laser beam emitted from the second laser oscillation device 308. In this embodiment mode, a single-mode laser beam capable of locally supplying energy with a favorable convergence property is emitted from the second laser oscillation device 308; therefore, the optical systems, the deflectors, and the like arranged in an optical path of the laser beam are selected as appropriate, so that it is also possible to form beam spots each having a diameter of several μm. Thus, minute openings can be formed in the irradiated object 330.

In this embodiment mode, as ablation of the light absorbing layer occurs in the regions the irradiation of which is performed so that the laser beam emitted from the first laser oscillation device 302 and the laser beams emitted from the second laser oscillation device 308 overlap with each other, energy of the laser beam emitted from the first laser oscillation device 302 and energy of the laser beam emitted from the second laser oscillation device 308 may be decided appropriately. The irradiated object 330 can be irradiated with a laser beam having high energy the upper limit of which is the ablation threshold value emitted from the first laser oscillation device 302. Therefore, the energy of the laser beam emitted from the second laser oscillation device 308 can be reduced. Consequently, the laser beam emitted from the second laser oscillation device 308 can be divided into a large number of laser beams.

Further, the laser beam emitted from the second laser oscillation device 308 is divided into a large number of laser beams, and the irradiation with the divided laser beams is performed so that the laser beams overlap with the laser beam emitted from the first laser oscillation device 302. Accordingly, a large number of minute openings can be formed in the irradiated object 330 also by performing single irradiation of the laser beams from the first laser oscillation device 302 and the second laser oscillation device 308. Therefore, mass productivity can be improved easily in a manufacturing process of a semiconductor device.

Openings can be formed in a desired region of an irradiated object in a laser processing apparatus of the present invention without using a photoresist. Therefore, since lithography steps can be simplified and/or the number of lithography steps can be reduced in a manufacturing process of the semiconductor device, the manufacturing cost can be reduced and the throughput can be improved.

In the laser processing apparatus of the present invention, a large number of openings can be formed in the irradiated object with one treatment. Therefore, the time for a step of forming openings can be shortened and mass productivity can be improved in the manufacturing process of the semiconductor device.

This embodiment mode can be freely combined with the above Embodiment Mode 1 as appropriate.

Embodiment Mode 4

In this embodiment mode, a method will be described in which a plurality of openings are formed in a desired region without using a lithography technique with a photoresist. Specifically, one mode of a method for forming a plurality of openings in an insulating layer by applying the present invention will be described with reference to FIGS. 5A to 5C, 6, 7A, and 7B.

Figure 5A:
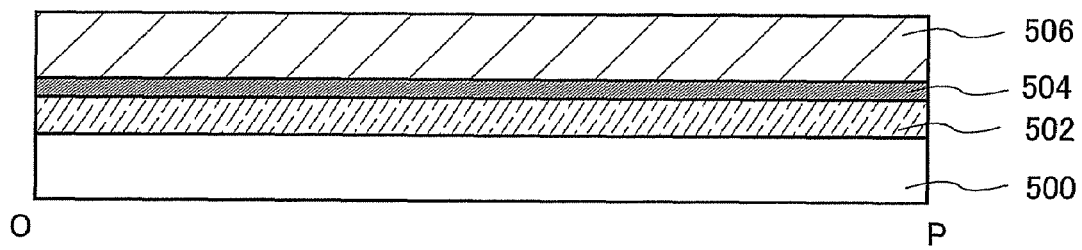
FIGS. 5A to 5C are conceptual views illustrating the present invention.

First, a substrate 500 over which a conductive layer 502, a light absorbing layer 504, and an insulating layer 506 are sequentially stacked is prepared (see FIG. 5A).

As the substrate 500, a substrate similar to the substrate 10 shown in the above Embodiment Mode 1 may be used. For example, a glass substrate, a quartz substrate, a sapphire substrate, a ceramic substrate, a semiconductor substrate, or the like can be used. In addition, a base insulating layer may be formed over the substrate 500.

As the conductive layer 502, the light absorbing layer 504, and the insulating layer 506, those similar to the conductive layer 12, the light absorbing layer 14, and the insulating layer 16 shown in the above Embodiment Mode 1 may be used, respectively.

The conductive layer 502 can be formed using an element of silver (Ag), gold (Au), nickel (Ni), platinum (Pt), palladium (Pd), iridium (Ir), rhodium (Rh), tantalum (Ta), tungsten (W), titanium (Ti), molybdenum (Mo), aluminum (Al), or copper (Cu), or an alloy or a compound containing these elements as its main component, for example.

The light absorbing layer 14 can be formed using an element of chromium (Cr), molybdenum (Mo), nickel (Ni), titanium (Ti), cobalt (Co), copper (Cu), or aluminum (Al), or an alloy or a compound containing these elements as its main component, for example. Besides, a semiconductor material such as silicon, germanium, silicon germanium, molybdenum oxide, tin oxide, bismuth oxide, vanadium oxide, nickel oxide, zinc oxide, gallium arsenide, gallium nitride, indium oxide, indium phosphide, indium nitride, cadmium sulfide, cadmium telluride, or strontium titanate can be used.

The insulating layer 506 can be formed using a light-transmitting inorganic insulating material such as silicon oxide, silicon nitride, silicon oxynitride, or silicon nitride oxide, or a light-transmitting organic insulating material such as polyimide, acrylic resin, polyamide, polyimide amide, benzocyclobutene-based resin, or an epoxy resin.

Next, irradiation of a laser beam is performed from the insulating layer 506 side. In the irradiation of the laser beam, irradiation of a first laser beam 510 and a second laser beam 512 is performed. The second laser beam 512 is divided into a plurality of laser beams, and irradiation of each laser beam is performed so that the laser beam overlaps with the first laser beam 510. In the light absorbing layer 504 and the insulating layer 506, the regions where the first laser beam 510 and the second laser beam 512 overlap with each other are defined as overlap irradiation regions 520, 522, 524, 526, 528, and 530 (see FIG. 5B).

Figure 5B:
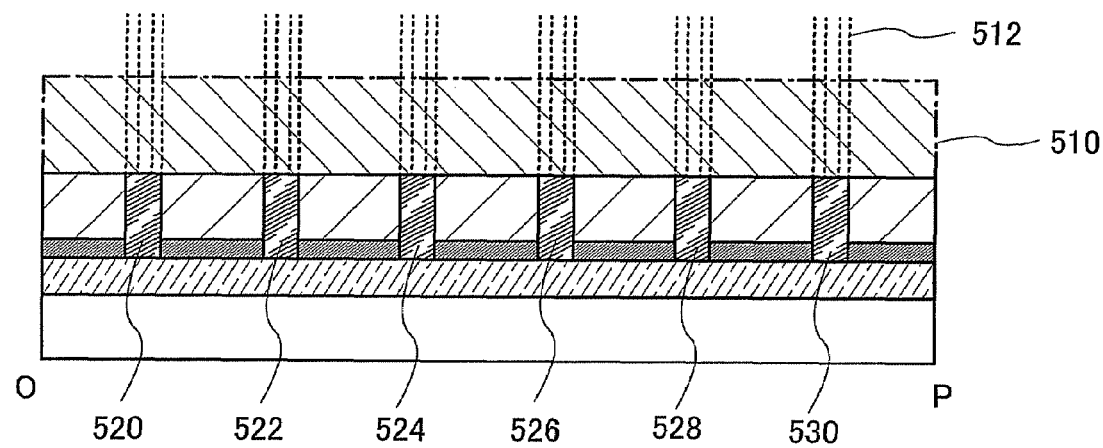
Figure 6:
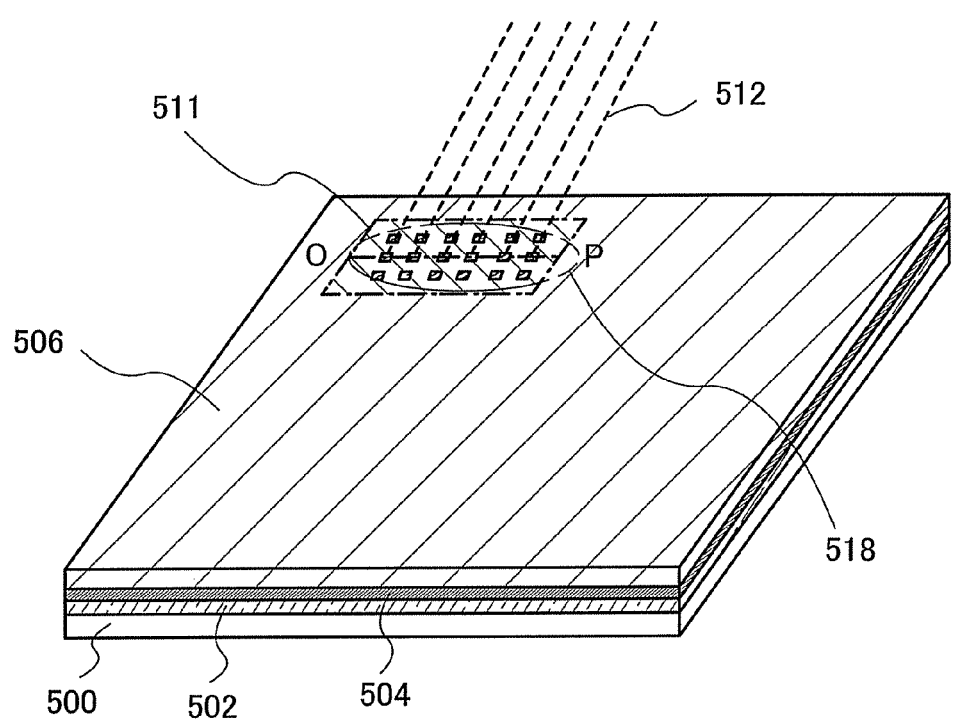
FIG. 6 is a conceptual view illustrating the present invention.

A perspective view of FIG. 5B is illustrated in FIG. 6. FIG. 5B corresponds to a cross-sectional view taken along a line OP in FIG. 6. In FIG. 6, the first laser beam 510 is omitted, and beam spots 511 formed by the first laser beam 510 are illustrated. Part of the second laser beam 512 is also omitted. In FIG. 6, all of the divided second laser beams are irradiated within the range of the beam spots 511 of the first laser beam. That is, in the beam spots 511 of the first laser beam, an overlap irradiation region group 518 in which the first laser beam 510 and the second laser beam 512 overlap with each other is formed. In FIG. 6, part of the overlap irradiation region group 518 surrounded with a circle of a broken line is the overlap irradiation regions 520, 522, 524, 526, 528, and 530 in FIG. 5B.

As the first laser beam 510, a multi-mode laser beam is irradiated. For example, an excimer laser oscillator of KrF, ArF, XeCl, or the like; a gas laser oscillator of He, He—Cd, Ar, He—Ne, or the like; a solid-state laser oscillator using a medium of a single crystal such as YAG, YVO$_4$, forsterite (Mg$_2$SiO$_4$), YAlO$_3$, or GdVO$_4$ or a polycrystal (ceramic) such as YAG, Y$_2$O$_3$, YVO$_4$, YAlO$_3$, or GdVO$_4$, to which one or more of Nd, Yb, Cr, Ti, Ho, Er, Tm, or Ta is added as a dopant; or a semiconductor laser oscillator of GaN, GaAs, GaAlAs, InGaAsP, or the like can be used for the first laser beam 510. The use of an oscillator of a YAG laser, a YVO$_4$ laser, or an excimer laser is preferable for the first laser beam 510 because high output power can be obtained. When the solid-state laser oscillator is used, it is preferable to select as appropriate from a fundamental wave to a fifth harmonic. In addition, either an oscillator which can obtain a continuous wave laser beam or an oscillator which can obtain a pulsed laser beam may be used.

Energy of the first laser beam 510 is arranged to be a degree that ablation does not occur in the light absorbing layer 504. That is, the energy of the first laser beam 510 is tuned to be less than the ablation threshold value.

As a cross-sectional shape of the first laser beam 510, a planar shape such as a circular shape, an elliptic shape, or a rectangular shape; or a linear shape (in a strict sense, a narrow rectangular shape) is to be selected as appropriate. The first laser beam 510 may be shaped with an optical system so as to have such a cross-sectional shape. In this embodiment mode, irradiation of the first laser beam 510 is performed by shaping the cross-sectional shape in a rectangular planar shape. Therefore, in FIG. 6, the beam spots 511 of the rectangular first laser beam are formed. In the present invention, since irradiation of a multi-mode laser beam is performed as the first laser beam 510, high output power can be obtained, and energy which has an upper limit at the ablation threshold value can be supplied to the beam spots 511.

As the second laser beam 512, a single-mode laser beam is irradiated. For example, a pulsed laser oscillator which gives a laser beam with the pulse width in the order of picosecond or femtosecond ($10^{-15}$ seconds) can be obtained; a gas laser oscillator of He, He—Cd, Ar, He—Ne, or the like; a solid-state laser oscillator using a medium of a single crystal such as YAG, YVO$_4$, forsterite (Mg$_2$SiO$_4$), YAlO$_3$, or GdVO$_4$ or a polycrystal (ceramic) such as YAG, Y$_2$O$_3$, YVO$_4$, YAlO$_3$, or GdVO$_4$, to which one or more of Nd, Yb, Cr, Ti, Ho, Er, Tm, or Ta is added as a dopant; or the like can be used for the second laser beam 512. When the solid-state laser oscillator is used, it is preferable to select as appropriate from a fundamental wave to a fifth harmonic.

Energy of the second laser beam 512 is tuned to energy by which ablation occurs in the light absorbing layer 504 when the first laser beam 510 and the second laser beam 512 is combined. That is, energy of the combined laser beam of the first laser beam 510 and the second laser beam 512 is arranged to be greater than or equal to the ablation threshold value.

As a cross-sectional shape of the second laser beam 512, a planar shape such as a circular shape, an elliptic shape, or a rectangular shape; or a linear shape (in a strict sense, a narrow rectangular shape) is to be selected as appropriate. The second laser beam 512 may be shaped with an optical system so as to have such a cross-sectional shape. In the present invention, since irradiation of a single-mode laser beam is performed as the second laser beam 512, the second laser beam 512 can be converged into a diameter of not less than approximately several μm. Therefore, the second laser beam 512 can locally supply energy in a minute region of approximately several μm in diameter.

In addition, since irradiation of the first laser beam 510 having high energy the upper limit of which is to be the ablation threshold value is performed, energy of the second laser beam 512 can be reduced. Therefore, the second laser beam 512 can be divided into a larger number of laser beams. Thus, energy greater than or equal to the ablation threshold value can be locally supplied simultaneously to a large number of the minute region on the light absorbing layer 504.

The first laser beam 510 and the second laser beam 512 transmit the insulating layer 506 and are absorbed by the light absorbing layer 504. The light absorbing layer 504 is removed along with the insulating layers 506 thereabove by ablation of the regions where the first laser beam 510 and the second laser beam 512 are superimposed (the overlap irradiation regions 520, 522, 524, 526, 528, and 530 in FIG. 5B). Consequently, openings 532, 534, 536, 538, 540, and 542 are formed. At the bottom surfaces of the openings 532, 534, 536, 538, 540, and 542, the conductive layer 502 is exposed (see FIG. 5C).

Since the first laser beam 510 has energy less than the ablation threshold value, ablation of the light absorbing layer 504 where only the first laser beam 510 is absorbed does not occur. On the other hand, in the regions where the first laser beam 510 and the second laser beam 512 are superimposed (the overlap irradiation regions 520, 522, 524, 526, 528, and 530 in FIG. 5B), energy of the laser beams absorbed by the light absorbing layer 504 is greater than or equal to the ablation threshold value. Therefore, the light absorbing layer 504 is removed along with the insulating layer 506 stacked thereover by ablation. In this embodiment mode, ablation of the overlap irradiation regions 520, 522, 524, 526, 528, and 530 illustrated in FIG. 5B occurs and the openings 532, 534, 536, 538, 540, and 542 are formed (see FIG. 5C).

Figure 5C:
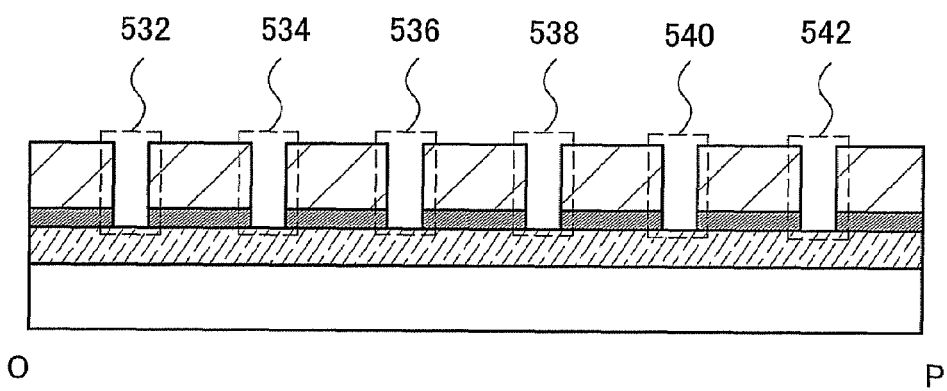
Figure 7A:
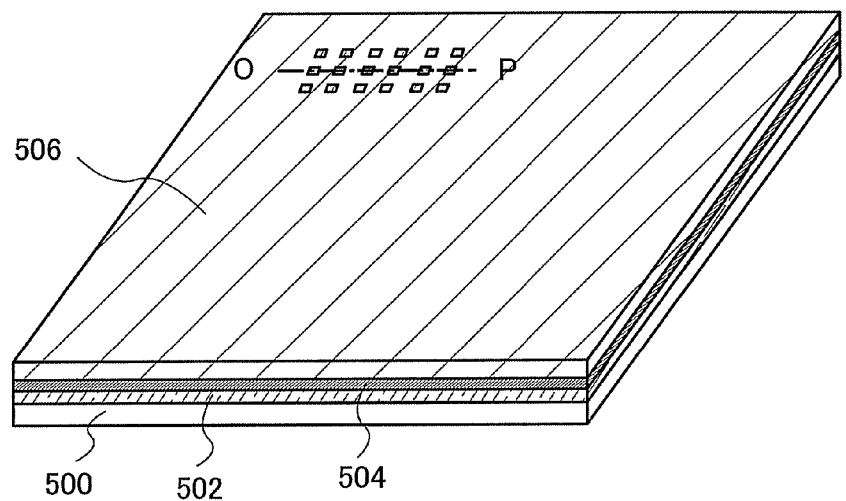
FIGS. 7A and 7B are conceptual views illustrating the present invention.
Figure 7B:
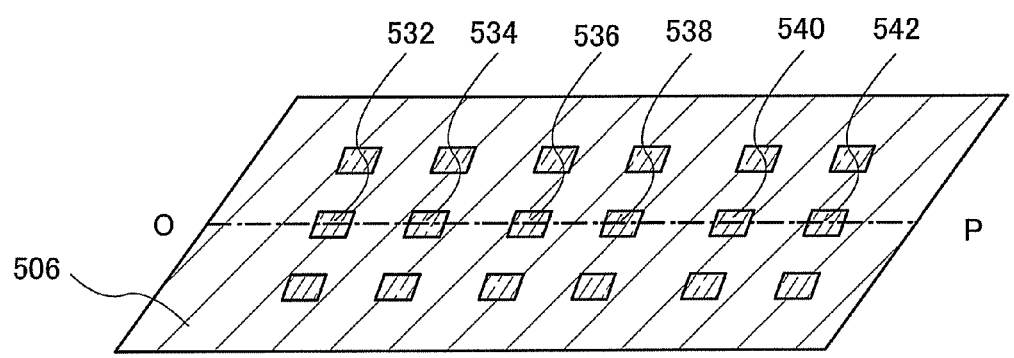

A perspective view of FIG. 5C is illustrated in FIG. 7A. FIG. 5C corresponds to a cross-sectional view taken along a line OP in FIG. 7A. FIG. 7B illustrates an enlarged view taken along vicinity of the line OP in FIG. 7A. In FIGS. 7A and 7B, the openings are formed so as to penetrate the insulating layer 506 and the light absorbing layer 504, and the conductive layer 502 is exposed at each of the bottom surfaces of the openings.

In the present invention, irradiation of a single-mode laser beam is performed as the second laser beam 512, and energy can be supplied locally. Therefore, ablation of the light absorbing layer 504 is performed by locally supplying energy greater than or equal to the ablation threshold value to minute regions of the light absorbing layer 504, so that minute openings can be formed.

In addition, in the present invention, the irradiation of the first laser beam and the second laser beam is performed so that both the laser beams overlap with each other. In the present invention, energy of the first laser beam can be increased to the utmost limit within the energy range in which energy is less than the ablation threshold value, which results in a high assist effect. Thus, the energy of the second laser beam can be reduced and the second laser beam 512 can be divided into a number of laser beams. Therefore, a large number of minute openings can be formed at the same time and the process time for the opening-formation can be shortened.

Note that a conductive layer is formed in each of the openings so that the conductive layer can be electrically connected to the conductive layer 502.

This embodiment mode can be freely combined with the above Embodiment Modes 1 to 3 as appropriate.

Embodiment Mode 5

In this embodiment mode, a method will be described in which an opening for electrically connecting conductive layers to each other or electrically connecting a conductive layer and a semiconductor layer is formed in an insulating layer. In Embodiment Mode 1, the example is shown in which an opening is formed so as to penetrate an insulating layer and a light absorbing layer which are stacked over a conductive layer and the conductive layer is exposed at the bottom surface of the opening. In this embodiment mode, another example will be shown in which an opening that reaches a conductive layer is formed. In addition, another example will also be shown in which an opening that reaches a semiconductor layer is formed.

Figure 8A:
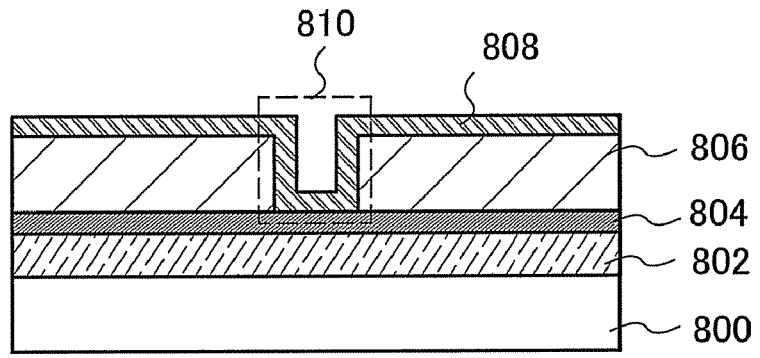
FIGS. 8A to 8C are conceptual views illustrating the present invention.
Figure 8B:
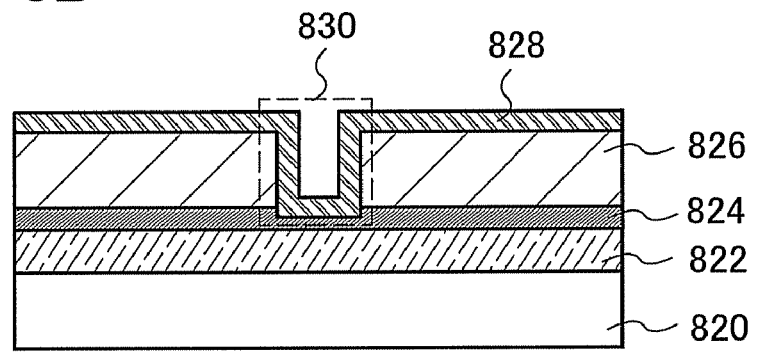
Figure 8C:
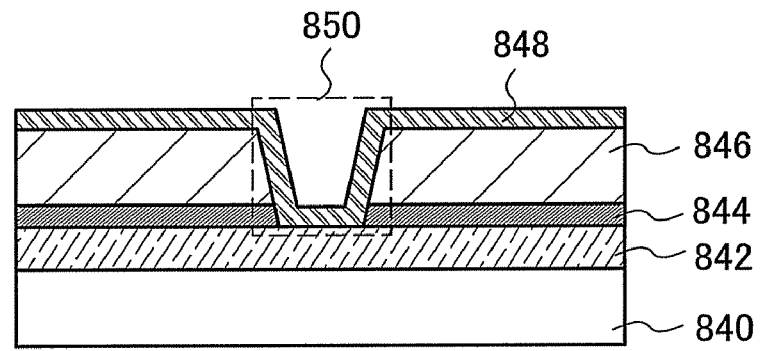

FIGS. 8A to 8C each illustrate a structure in which a conductive layer, a light absorbing layer, and an insulating layer are sequentially stacked over a substrate and an opening that reaches the conductive layer or the light absorbing layer is formed. In addition, a structure is also illustrated in which a conductive layer is formed in the opening and the conductive layer is electrically connected to the conductive layer formed over the substrate.

In each of FIGS. 8A to 8C, the opening at least formed in the insulating layer is formed by utilizing ablation by laser beam irradiation as shown in the above Embodiment Modes 1 to 4. Specifically, irradiation of a multi-mode laser beam and a single-mode laser beam is performed so that both the laser beams overlap with each other and a region, the irradiation of which is performed so that both the laser beams overlap with each other, is removed by ablation. It is possible to select a portion to be removed by ablation by selecting as appropriate laser beam energy, a material that form the light absorbing layer, or the like.

In FIGS. 8A to 8C, a substrate, a conductive layer, and an insulating layer follow those in the above Embodiment Mode 1 and the like. For example, as the substrate, a glass substrate, a quartz substrate, a sapphire substrate, a ceramic substrate, a semiconductor substrate, or the like may be used. As the conductive layer, a conductive material may be used. For example, the conductive layer is formed using an element such as silver (Ag), gold (Au), nickel (Ni), platinum (Pt), palladium (Pd), iridium (Ir), rhodium (Rh), tantalum (Ta), tungsten (W), titanium (Ti), molybdenum (Mo), aluminum (Al), or copper (Cu), or an alloy material or a compound material containing the element as its main component. The insulating layer may be formed using a light-transmitting inorganic insulating material or a light-transmitting organic insulating material. Moreover, a base insulating layer functioning as a protective layer may be formed between the substrate and the conductive layer or between the substrate and the light absorbing layer. The base insulating layer can be formed using an inorganic insulating material such as silicon oxide, silicon nitride, silicon oxynitride, or silicon nitride oxide. The effect on the substrate due to the irradiation of the laser beams can be reduced by forming the base insulating layer.

The light absorbing layer is formed using a material which can absorb a laser beam. In addition, the light absorbing layer is preferably formed using a material of which temperature of a boiling point or a sublimation point is lower than that of a melting point of the conductive layer below. For example, the light absorbing layer is formed using a conductive material such as an element of chromium (Cr), molybdenum (Mo), nickel (Ni), titanium (Ti), cobalt (Co), copper (Cu), aluminum (Al), or the like, or an alloy material or a compound containing the element as its main component. Moreover, indium oxide, zinc oxide, or the like may also be used. Hereinafter, the specific description is given.

FIG. 8A illustrates an example in which, in a light absorbing layer and an insulating layer stacked over a conductive layer, only the insulating layer is removed by ablation. A conductive layer 802, a light absorbing layer 804, and an insulating layer 806 are sequentially stacked over a substrate 800. An opening 810 is formed so as to penetrate only the insulating layer 806, and the light absorbing layer 804 is exposed at the bottom surface of the opening 810. In addition, a conductive layer 808 is formed over the opening 810 and is in contact with the light absorbing layer 804. Since the light absorbing layer 804 is formed using a conductive material, the conductive layer 808 and the conductive layer 802 are connected electrically.

FIG. 8B illustrates an example in which, in a light absorbing layer and an insulating layer stacked over a conductive layer, upper layer part of the light absorbing layer and the insulating layer is removed by ablation. A conductive layer 822, a light absorbing layer 824, and an insulating layer 826 are sequentially stacked over a substrate 820. An opening 830 is formed in the insulating layer 826 and upper layer part of the light absorbing layer 824, and the light absorbing layer 824 is exposed at the bottom surface of the opening 830. A region of the light absorbing layer 824 where the opening 830 is formed has a thinner film thickness than that of other regions. In addition, a conductive layer 828 is formed over the opening 830 and is in contact with the light absorbing layer 824. Since the light absorbing layer 824 is formed using a conductive material, the conductive layer 828 and the conductive layer 822 are connected electrically.

FIG. 8C illustrates an example in which at least side surfaces of an opening formed in an insulating layer each has a tapered shape. A conductive layer 842, a light absorbing layer 844, and an insulating layer 846 are sequentially stacked over a substrate 840. An opening 850 has a sharp edge, and the side surfaces of the opening 850 each have a tapered shape with respect to the bottom surface. A conductive layer 848 is formed over the opening 850 and is electrically connected to the conductive layer 842.

In FIG. 8C, the example is illustrated in which the opening 850 is formed so as to penetrate the insulating layer 846 and the light absorbing layer 844; however, the present invention is not particularly limited. Alternatively, an opening may be formed so as to penetrate only the insulating layer as illustrated in FIG. 8A, or so as to penetrate the insulating layer and to reach upper layer part of the light absorbing layer 844 as illustrated in FIG. 8B. At least, a structure in which the conductive layer is in contact with the light absorbing layer may be employed.

Next, an example is described in which an opening that reaches a conductive layer or an opening that reaches a semiconductor layer is formed in an insulating layer. FIGS. 9A to 9D each illustrate a structure in which a light absorbing layer and an insulating layer are sequentially stacked over a substrate and an opening that reaches the light absorbing layer is formed. In addition, a structure is also illustrated in which a conductive layer is formed over the opening and the conductive layer is electrically connected to the light absorbing layer exposed from the opening.

In each of FIGS. 9A to 9D, the opening at least formed in the insulating layer is formed by utilizing ablation by laser beam irradiation as shown in the above Embodiment Modes 1 to 4. Specifically, irradiation of a multi-mode laser beam and a single-mode laser beam is performed so that both the laser beams overlap with each other and a region, the irradiation of which is performed so that both the laser beams overlap with each other, is removed by ablation. It is possible to select a portion to be removed by ablation by selecting as appropriate laser beam energy, a material that form the light absorbing layer, or the like.

As a substrate and an insulating layer illustrated in each of FIGS. 9A to 9D, the same as those illustrated in each of FIGS. 8A to 8C can be used. A light absorbing layer is formed with a material which can absorb a laser beam. As the light absorbing layer, a semiconductor material as well as the same as that illustrated in each of FIGS. 8A to 8C can be used. For example, as the light absorbing layer, a semiconductor material such as silicon, germanium, silicon germanium, molybdenum oxide, tin oxide, bismuth oxide, vanadium oxide, nickel oxide, zinc oxide, gallium arsenide, gallium nitride, indium oxide, indium phosphide, indium nitride, cadmium sulfide, cadmium telluride, or strontium titanate can be used. Hereinafter, the specific description is given.

Figure 9A:
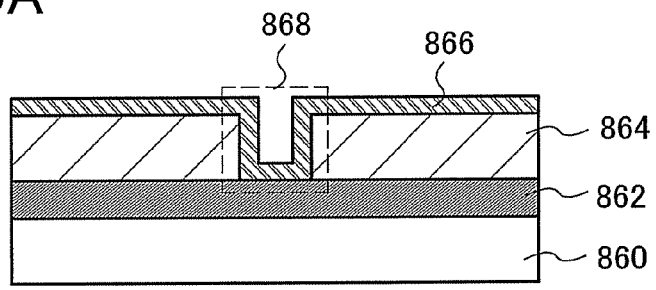
FIGS. 9A to 9D are conceptual views illustrating the present invention.

FIG. 9A illustrates an example in which, in a light absorbing layer and an insulating layer stacked over a substrate, only the insulating layer is removed by ablation. A light absorbing layer 862 and an insulating layer 864 are sequentially stacked over a substrate 860. An opening 868 is formed so as to penetrate only the insulating layer 864, and the light absorbing layer 862 is exposed at the bottom surface of the opening 868. In addition, a conductive layer 866 is formed over the opening 868 and is in contact with the light absorbing layer 862. The light absorbing layer 862 is formed using a conductive material or a semiconductor material. Through the above processes, a structure can be obtained in which conductive layers are electrically connected with each other or in which a conductive layer and a semiconductor layer are electrically connected.

Figure 9B:
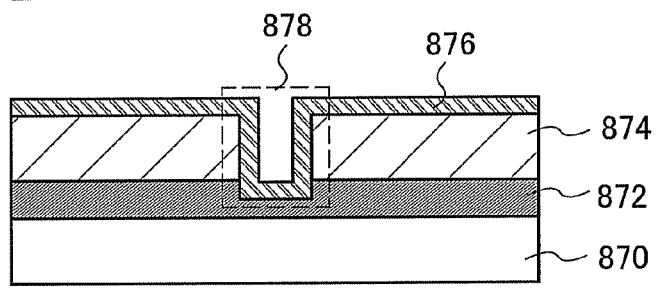

FIG. 9B illustrates an example in which, in a light absorbing layer and an insulating layer stacked over a substrate, upper layer part of the light absorbing layer and the insulating layer is removed by ablation. A light absorbing layer 872 and an insulating layer 874 are sequentially stacked over a substrate 870. An opening 878 is formed over the insulating layer 874 and upper layer part of the light absorbing layer 872, and the light absorbing layer 872 is exposed at the bottom surface of the opening 878. A region of the light absorbing layer 872 where the opening 878 is formed has a thinner film thickness than that of other regions. In addition, a conductive layer 876 is formed over the opening 878 and is in contact with the light absorbing layer 872. The light absorbing layer 872 is formed using a conductive material or a semiconductor material. Through the above processes, a structure can be obtained in which conductive layers are electrically connected with each other or in which a conductive layer and a semiconductor layer are electrically connected.

Figure 9C:
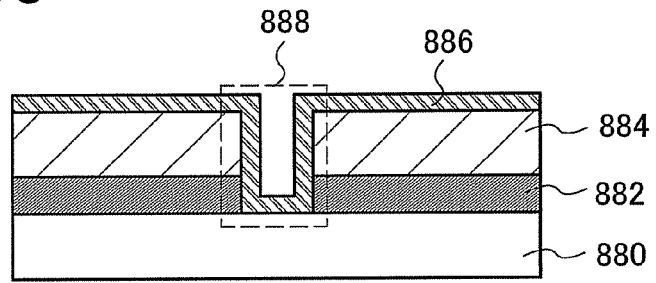

FIG. 9C illustrates an example in which, in a light absorbing layer and an insulating layer stacked over a substrate, the light absorbing layer and the insulating layer are removed by ablation so as to be penetrated. A light absorbing layer 882 and an insulating layer 884 are sequentially stacked over a substrate 880. An opening 888 is formed so as to penetrate the insulating layer 884 and the light absorbing layer 882, and the light absorbing layer 882 is exposed on the side surfaces of the opening 888. In addition, a conductive layer 886 is formed over the opening 888 and is in contact with the light absorbing layer 882. The light absorbing layer 882 is formed using a conductive material or a semiconductor material. Through the above processes, a structure can be obtained in which conductive layers are electrically connected with each other or in which a conductive layer and a semiconductor layer are electrically connected.

Figure 9D:
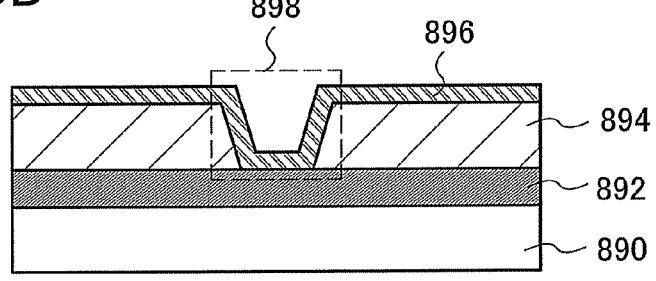

FIG. 9D illustrates an example in which at least a side surface of an opening formed in an insulating layer has a tapered shape. A light absorbing layer 892 and an insulating layer 894 are sequentially stacked over a substrate 890. An opening 898 has a sharp edge, and the side surfaces of the opening 898 each have a tapered shape with respect to the bottom surface. A conductive layer 896 is formed over the opening 898 and is in contact with the light absorbing layer 892. The light absorbing layer 892 is formed with a conductive material or a semiconductor material. Through the above processes, a structure can be obtained in which conductive layers are electrically connected with each other or in which a conductive layer and a semiconductor layer are electrically connected.

In FIG. 9D, the example is illustrated in which the opening 898 is formed so as to penetrate only the insulating layer 894; however, the present invention is not particularly limited. An opening may be formed so as to penetrate the insulating layer and to reach upper layer part of the light absorbing layer as illustrated in FIG. 9B, or so as to penetrate the insulating layer and the light absorbing layer as illustrated in FIG. 9C. At least, a structure in which the conductive layer is in contact with a light absorbing layer may be employed.

Various openings can be formed by applying the present invention. An opening can have various modes by selecting as appropriate laser beam energy, a material that form the light absorbing layer, or the like.

An opening can be formed in a desired region by applying the present invention without using a photolithography step with a photoresist. Therefore, lithography steps can be simplified and/or the number of lithography steps can be reduced, the manufacturing cost can be reduced, and the throughput can be improved.

This embodiment mode can be freely combined with the above Embodiment Modes 1 to 4 as appropriate.

Embodiment Mode 6

In this embodiment mode, a display device in which an opening that connects a transistor and a pixel electrode is formed by applying the present invention will be described with reference to FIGS. 10A to 10C and 11A to 11C. Note that an example will be shown in which an inversely staggered transistor is manufactured as a transistor in this embodiment mode.

First, a transistor 720 is formed over a substrate 7000 with a base insulating layer 7002 interposed therebetween. Specifically, a gate electrode layer 704 is formed over the substrate 7000 with the base insulating layer 7002 interposed therebetween. A semiconductor layer is formed over the gate electrode layer 704 with a gate insulating layer 706 interposed therebetween. Conductive layers 712a and 712b that each function as a source electrode or drain electrode are formed over the semiconductor layer (see FIG. 10A).

In this embodiment mode, as for the semiconductor layer, a stacked layer structure of a semiconductor layer 708 and semiconductor layers 710a and 710b having one conductivity type is formed. The semiconductor layers 710a and 710b having one conductivity type may be formed according to need. It is preferable to form the semiconductor layers 710a and 710b having one conductivity type because favorable ohmic contact between the semiconductor layer forming a channel and a conductive layer functioning as a source electrode or a drain electrode can be obtained.

For example, an NMOS structure of an n-channel transistor can be manufactured by forming semiconductor layers 710a and 710b having one conductivity type as a semiconductor layer having n-type conductivity. A PMOS structure of a p-channel transistor can be manufactured by forming semiconductor layers 710a and 710b having one conductivity type as a semiconductor layer having p-type conductivity. When an element imparting a conductivity type is added to the semiconductor layer 708 by doping to form an impurity region, an n-channel transistor or a p-channel transistor can be formed. Alternatively, plasma treatment with a $PH_3$ gas may be performed, whereby a conductivity type may be imparted to the semiconductor layer 708.

As the substrate 7000, a glass substrate of barium borosilicate glass, alumino borosilicate glass, or the like; a quartz substrate; a sapphire substrate; a ceramic substrate; or a plastic substrate having heat resistance which can withstand processing temperature in this manufacturing process is used. Further, in order to planarize the surface of the substrate 7000, the substrate may be polished by a CMP method or the like.

The base insulating layer 7002 is formed as a single layer structure or a stacked layer structure by applying various methods such as a CVD method, a sputtering method, and a spin coating method using an insulating material such as silicon oxide, silicon nitride, silicon oxynitride, or silicon nitride oxide. It is not always necessary to form the base insulating layer 7002; however, it has an effect of blocking a contamination substance from the substrate 7000.

The gate electrode layer 704 may be formed using a conductive material, for example, an element such as Ag, Au, Ni, Pt, Pd, Ir, Rh, Ta, W, Ti, Mo, Al, or Cu, or an alloy or a compound containing these elements as its main component. Alternatively, a semiconductor material typified by polycrystalline silicon doped with an impurity element such as phosphorus, or an AgPdCu alloy may be used. Either a single layer structure or a stacked layer structure may be used. For example, a two-layer structure of a tungsten nitride film and a molybdenum (Mo) film or a three-layer structure in which a tungsten film having a film thickness of 50 nm, an alloy film of aluminum and silicon (Al—Si) having a film thickness of 500 nm, and a titanium nitride film having a film thickness of 30 nm are sequentially stacked may be used. Further, in the case of the three-layer structure, tungsten nitride may be used instead of tungsten for a first conductive layer, an alloy film of aluminum and titanium may be used instead of the alloy film of aluminum and silicon for a second conductive layer, and a titanium film may be used instead of the titanium nitride film for a third conductive layer.

The gate electrode layer 704 is formed by selectively etching a conductive layer formed by a physical vapor deposition (PVD) method such as a sputtering method, a chemical vapor deposition (CVD) method such as a low-pressure CVD (LPCVD) method or a plasma CVD method, or the like.

Alternatively, the gate electrode layer 704 may also be formed by various printing methods (a method for forming a desired pattern such as screen (mimeograph) printing, offset (planograph) printing, relief printing, or gravure (intaglio) printing), a nano-imprinting method, a droplet-discharging method, a dispenser method, a selective coating method, or the like. With such a method, the conductive layer can be selectively formed in a desired place.

The gate insulating layer 706 is formed by a CVD method, a sputtering method, or the like using an insulating material such as silicon oxide, silicon nitride, silicon oxynitride, or silicon nitride oxide. The gate insulating layer 706 may have a single layer structure or a stacked layer structure. For example, for the gate insulating layer 706, a single layer structure of a silicon oxynitride layer or a two-layer structure of a silicon nitride layer and a silicon oxide layer may be used. Alternatively, a stacked layer structure including three or more layers may be employed with these materials. Preferably, silicon nitride, which can form a dense film, may be used. The gate insulating layer 706 is preferably formed using silicon nitride or NiB in a case where the gate electrode layer 704 below is formed using silver or copper by a droplet-discharging method. These films have an effect of preventing diffusion of an impurity and planarizing a surface. Note that a rare gas element such as argon may be included in a reaction gas in forming the gate insulating layer 706. When a rare gas element is included in a reaction gas, a dense insulating layer with negligible leakage current can be obtained at a low film formation temperature.

Each of the semiconductor layers (the semiconductor layers 708, 710a, and 710b) can be formed using an amorphous semiconductor (hereinafter also referred to as "AS") formed by a vapor phase growth method using a semiconductor source gas typified by silane or germane or a sputtering method, a polycrystalline semiconductor formed by crystallizing the amorphous semiconductor utilizing light energy or thermal energy, a semi-amorphous semiconductor (also referred to as microcrystal and hereinafter also referred to as "SAS"), or the like. The semiconductor layers can be formed by various methods (a sputtering method, an LPCVD method, a plasma CVD method, and the like).

An SAS is a semiconductor having an intermediate structure between amorphous and crystalline (including single crystalline and polycrystalline) structures and a third state which is stable in terms of free energy. Moreover, an SAS includes a crystalline region with a short-distance order and lattice distortion. A crystal region having a diameter of 0.5 nm to 20 nm can be observed at least in part of the film. In a case where silicon is contained as a main component, Raman spectrum is shifted to the low wavenumber side that is lower than 520 cm$^{-1}$. The diffraction peaks of (111) and (220), which are believed to be derived from silicon crystal lattice, are observed by X-ray diffraction. An SAS contains hydrogen or halogen by at least 1 atomic % or more for terminating dangling bonds. An SAS is formed by glow discharge decomposition (plasma CVD) of a gas containing silicon. As the gas containing silicon, $SiH_4$ can be used, and alternatively, $Si_2H_6$, $SiH_2Cl_2$, $SiHCl_3$, $SiCl_4$, $SiF_4$, or the like can also be used. Further, $F_2$ or $GeF_4$ may be mixed. The gas containing silicon may be diluted with $H_2$, or $H_2$ and one or a plurality of kinds of rare gas elements of He, Ar, Kr, or Ne. The dilution ratio is 1:2 to 1:1000, pressure is approximately 0.1 Pa to 133 Pa, and a power source frequency is 1 MHz to 120 MHz, preferably, 13 MHz to 60 MHz. Temperature for heating the substrate is preferably less than or equal to 300° C., and an SAS can also be formed at 100° C. to 200° C. It is preferable that the concentration of impurities of atmospheric components such as oxygen, nitrogen, or carbon as impurity elements entering the film in deposition be less than or equal to $1 \times 10^{20}$ cm$^{-3}$. In particular, an oxygen concentration is preferably less than or equal to $5 \times 10^{19}$ cm$^{-3}$, and more preferably, less than or equal to $1 \times 10^{19}$ cm$^{-3}$. Further, when a rare gas element such as helium, argon, krypton, or neon is contained to further promote the lattice distortion, stability can be enhanced, and a favorable SAS can be obtained. Furthermore, as each of the semiconductor layers, an SAS layer formed by using a hydrogen-based gas may be stacked over an SAS layer formed by using a fluorine-based gas.

As an example of a typical amorphous semiconductor, hydrogenated amorphous silicon can be given while polysilicon or the like can be given as an example of a typical crystalline semiconductor. Polysilicon (also referred to as polycrystalline silicon) includes so-called high-temperature polysilicon formed using polysilicon which is formed at processing temperatures of greater than or equal to 800° C. as a main material, so-called low-temperature polysilicon formed using polysilicon which is formed at processing temperatures of less than or equal to 600° C. as a main material, polysilicon crystallized by being doped with an element which promotes crystallization or the like, and the like. Needless to say, as described above, a semi-amorphous semiconductor or a semiconductor which includes a crystal phase in part of any of the semiconductor layers can also be used.

When a crystalline semiconductor such as a polycrystalline semiconductor or a semi-amorphous semiconductor is used for the semiconductor layers, the semiconductor layers may be formed by various methods such as a laser crystallization method, a thermal crystallization method, and a thermal crystallization method using an element such as nickel which promotes crystallization. Further, a microcrystalline semiconductor that is an SAS may be crystallized by laser irradiation to enhance crystallinity. In a case where silicon is used and an element which promotes crystallization is not added, before the amorphous silicon layer is irradiated with a laser beam, the amorphous silicon layer is heated at 700° C. for an hour in a nitrogen atmosphere to discharge hydrogen so that a hydrogen concentration in the amorphous silicon layer becomes less than or equal to $1 \times 10^{20}$ atoms/cm$^3$. This is because, if the amorphous silicon layer contains much hydrogen, the amorphous silicon layer may be broken by laser beam irradiation.

A method for introducing a metal element into the amorphous semiconductor layer is not particularly limited as long as it is a method for introducing the metal element to a surface or inside of the amorphous semiconductor layer. For example, a sputtering method, a CVD method, a plasma treatment method (including a plasma CVD method), an adsorption method, or a method for coating a solution of metal salt can be used. Among them, a method using a solution is simple and advantageous in that the concentration of the metal element can be easily controlled. At this time, it is preferable to form an oxide film on the surface of the amorphous semiconductor layer by UV light irradiation in an oxygen atmosphere, a thermal oxidation method, treatment with ozone water containing hydroxyl radical or a hydrogen peroxide solution, or the like to improve wettability of the surface of the amorphous semiconductor layer so that an aqueous solution can be diffused on the entire surface of the amorphous semiconductor layer.

In order to crystallize the amorphous semiconductor layer, heat treatment may be combined with crystallization by laser beam irradiation, or one of heat treatment and laser beam irradiation may be performed multiple times.

Moreover, a crystalline semiconductor layer may be directly formed on the substrate by a plasma method. Furthermore, the crystalline semiconductor layer may be selectively formed over the substrate by a linear plasma method.

The semiconductor layers can be formed using an organic semiconductor material. As the organic semiconductor material, a low-molecular material, a high-molecular material, or the like can be used. In addition, a material such as a conductive high-molecular material can also be used. For example, a π-electron conjugated high-molecular material of which skeletal structure includes a conjugated double bond can be used, and specifically, a soluble high-molecular material such as polythiophene, polyfluorene, poly(3-alkylthiophene), a polythiophene derivative, or pentacene can be used. In addition, as the organic semiconductor material, there is a material which can form a semiconductor layer by forming a soluble precursor of the material and then performing a process thereon. As such an organic semiconductor material, there are polythienylenevinylene, poly(2,5-thienylenevinylene), polyacetylene, a polyacetylene derivative, polyarylenevinylene, and the like.

The precursor is changed into the organic semiconductor not only by heat treatment but also by addition of a reaction catalyst such as a hydrogen chloride gas. Moreover, as a typical solvent for dissolving the soluble organic semiconductor material, toluene, xylene, chlorobenzene, dichlorobenzene, anisole, chloroform, dichloromethane, γ-butyrolactone, butylcellosolve, cyclohexane, N-methyl-2-pyrrolidone (NMP), cyclohexanone, 2-butanon, dioxane, dimethylformamide (DMF), tetrahydrofuran (THF), or the like can be used.

In this embodiment mode, amorphous semiconductor layers are formed as the semiconductor layer 708 and the semiconductor layers 710a and 710b having one conductivity type. As each of the semiconductor layers 710a and 710b having one conductivity type, an n-type semiconductor layer, which contains phosphorus (P) that is an impurity element imparting n-type conductivity, is formed. The semiconductor layers 710a and 710b having one conductivity type function as source and drain regions and favorable ohmic contact between the semiconductor layer 708 and the conductive layer functioning as a source electrode or a drain electrode can be obtained. The semiconductor layers 710a and 710b having one conductivity type may be formed according to need, and an n-type semiconductor layer containing an impurity element imparting n-type conductivity (P, As) or a p-type semiconductor layer containing an impurity element imparting p-type conductivity (B) can be formed.

The semiconductor layer 708, or the semiconductor layers 710a and 710b are formed by selectively etching a semiconductor layer formed by a sputtering method, an LPCVD method, a plasma CVD method, or the like. Note that the etching is performed even up to the semiconductor layer 708 to some extent and a depression portion is formed in the semiconductor layer 708 in some cases, in forming the separated semiconductor layers 710a and 710b.

Alternatively, the semiconductor layer 708, or the semiconductor layers 710a and 710b may also be formed by various printing methods (a method for forming a desired pattern such as screen (mimeograph) printing, offset (planograph) printing, relief printing, or gravure (intaglio) printing), a nano-imprinting method, a droplet-discharging method, a dispenser method, a selective coating method, or the like. With such a method, the semiconductor layers can be selectively formed in a desired place.

The semiconductor layer 708 forms a channel of the transistor. In addition, the semiconductor layers 710a and 710b each form a source or drain region of the transistor.

The conductive layers 712a and 712b are each formed of a material which can absorb a laser beam. For example, a conductive material such as an element of chromium (Cr), molybdenum (Mo), nickel (Ni), titanium (Ti), cobalt (Co), copper (Cu), or aluminum (Al), or an alloy material or a compound containing the element as its main component can be used. Besides, indium tin oxide (ITO) having a light-transmitting property, indium tin oxide containing silicon oxide (ITSO), organic indium, organotin, zinc oxide, titanium nitride, or the like may be combined. Alternatively, the conductive layers 712a and 712b may have a single layer structure or a stacked layer structure.

The conductive layers 712a and 712b are formed by selectively etching a conductive layer formed by a physical vapor deposition (PVD) method such as a sputtering method, a chemical vapor deposition (CVD) method such as a low-pressure CVD (LPCVD) method or a plasma CVD method, or the like.

Alternatively, the conductive layers 712a and 712b may also be formed by various printing methods (a method for forming a desired pattern such as screen (mimeograph) printing, offset (planograph) printing, relief printing, or gravure (intaglio) printing), a nano-imprinting method, a droplet-discharging method, a dispenser method, a selective coating method, or the like. With such a method, the conductive layer can be selectively formed in a desired place.

Figure 10A:
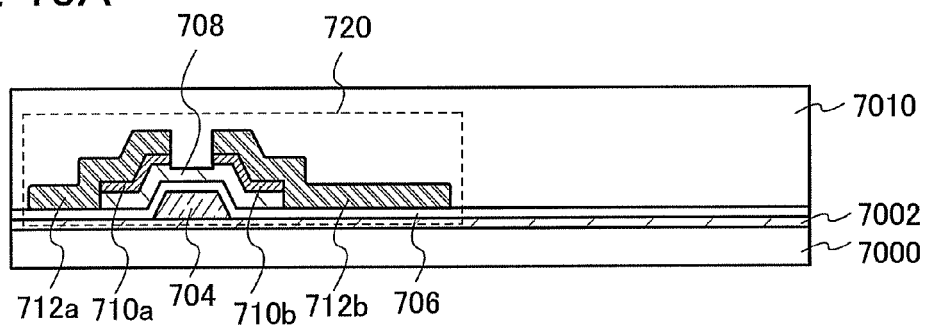
FIGS. 10A to 10C are views illustrating an example of a manufacturing method of a display device of the present invention.

Next, an insulating layer 7010 is formed so as to cover the transistor 720 (see FIG. 10A).

The insulating layer 7010 is formed as a single layer structure or a stacked layer structure by using a material such as silicon oxide, silicon nitride, silicon oxynitride, aluminum oxide, aluminum nitride, aluminum oxynitride, diamond-like carbon (DLC), nitrogen-containing carbon (CN), polysilazane, or other substances including an inorganic insulating material, or the like. Alternatively, a material containing siloxane may be used. An organic insulating material may also be used, and polyimide, acrylic resin, polyamide, polyimideamide, resist, or benzocyclobutene-based resin can be used as the organic material. Moreover, an oxazole resin can be used, and for example, photo-curing polybenzoxazole or the like can be used.

The insulating layer 7010 can be formed by a physical vapor deposition (PVD) method such as a sputtering method, a chemical vapor deposition (CVD) method such as a low-pressure CVD (LPCVD) method or a plasma CVD method, a spin-coating method, or the like.

Figure 10B:
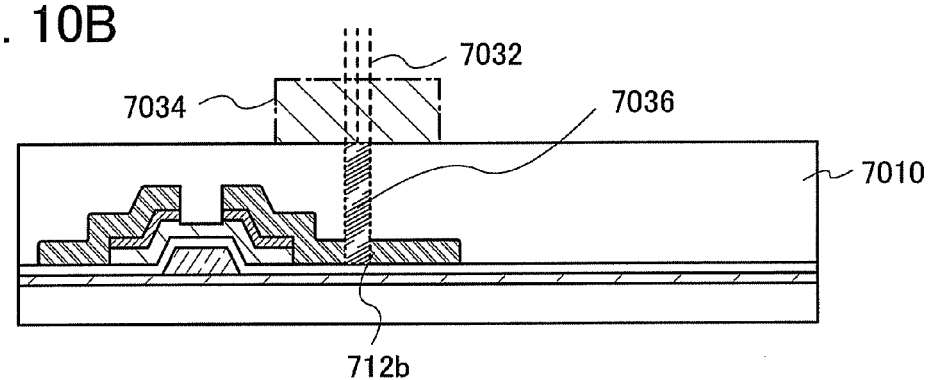
Figure 10C:
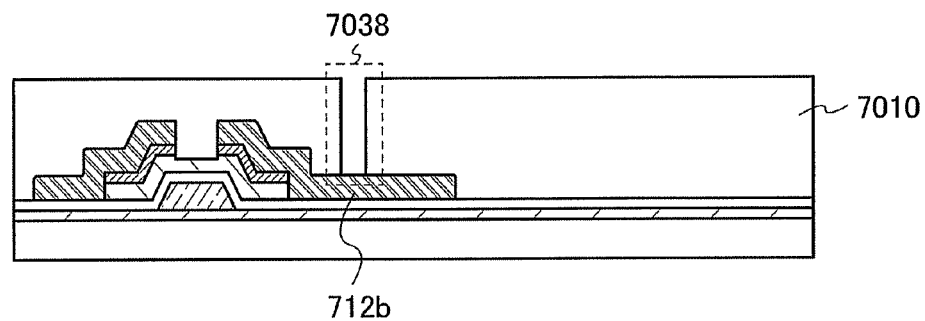

Next, laser beam irradiation is performed from the insulating layer 7010 side (see FIG. 10A), and an opening that reaches the conductive layer 712b is formed in the insulating layer 7010 (see FIG. 10C).

In FIG. 10C, the opening formed in the insulating layer 7010 is formed by utilizing ablation by laser beam irradiation as shown in the above Embodiment Modes 1 to 5.

Specifically, in the irradiation process of the laser beam, irradiation of a multi-mode laser beam 7034 and a single-mode laser beam 7032 is performed as illustrated in FIG. 10B. The irradiation of the single-mode laser beam 7032 is performed so that the single-mode laser beam overlaps with the multi-mode laser beam 7034. In the conductive layer 712b and the insulating layer 7010, a region, the irradiation of which is performed so that the multi-mode laser beam 7034 and the single-mode laser beam 7032 overlap with each other, is to be an overlap irradiation region 7036. The irradiated multi-mode laser beam 7034 and the single-mode laser beam 7032 are absorbed by the conductive layer 712b.

Ablation of the conductive layer 712b occurs in the region where the multi-mode laser beam 7034 and the single-mode laser beam 7032 overlap with each other (the overlap irradiation region 7036), and the insulating layer 7010 thereabove is removed. Consequently, as illustrated in FIG. 10C, an opening 7038 is formed in the insulating layer 7010.

Note that the example is shown in this embodiment mode in which only the insulating layer 7010 is removed by ablation to form the opening 7038; however, the present invention is not particularly limited. For example, the conductive layer 712b in an overlap irradiation region 7036 may be removed partially or entirely by ablation to form the opening.

Next, a light-emitting element 7020 electrically connected to the transistor 720 is formed. As the light-emitting element 7020, an element which emits light of red (R), green (G), or blue (B) may be formed. Alternatively, an element which emits light of white (W) may be formed as the light-emitting element 7020 and combined with a color filter to obtain light of R, G or B. Hereinafter, a method for forming the light-emitting element 7020 is described.

First, a first electrode layer 7012 functioning as a pixel electrode is formed in the opening 7038 where the conductive layer 712b is exposed. The conductive layer 712b and the first electrode layer 7012 are electrically connected (see FIG. 11A).

The first electrode layer 7012 can be formed using a conductive material such as indium tin oxide (ITO), indium tin oxide containing silicon oxide (ITSO), or zinc oxide. For example, indium tin oxide containing silicon oxide (ITSO) can be formed by a sputtering method using a target in which ITO is mixed with silicon oxide of 2 wt % to 10 wt %. Besides, a conductive material obtained by doping gallium (Ga) to ZnO, or indium zinc oxide (IZO) that is an oxide conductive material formed by using a target in which silicon oxide is contained and indium oxide is mixed with zinc oxide (ZnO) of 2 wt % to 20 wt % may be used.

The first electrode layer 7012 is formed by selectively etching a conductive layer formed by a physical vapor deposition (PVD) method such as a sputtering method, a chemical vapor deposition (CVD) method such as a low-pressure CVD (LPCVD) method or a plasma CVD method, or the like.

The first electrode layer 7012 can be selectively formed in a desired place by a droplet-discharging method, a printing method (a method for forming a pattern, such as screen printing or offset printing), a dipping method, a dispenser method, or the like.

The first electrode layer 7012 may be cleaned or polished by a CMP method or with the use of a polyvinyl alcohol based porous material, so that the surface thereof is planarized. In addition, after polishing using a CMP method, ultraviolet ray irradiation, oxygen plasma treatment, or the like may be performed on the surface of the first electrode layer 7012.

Figure 11A:
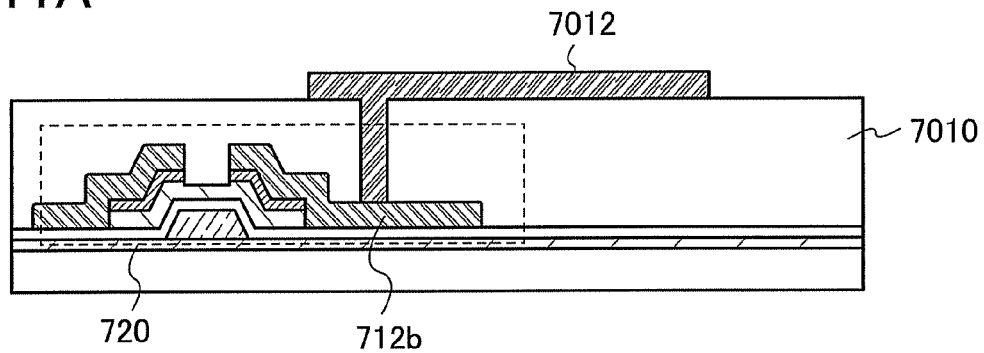
FIGS. 11A to 11C are views illustrating an example of a manufacturing method of a display device of the present invention.
Figure 11B:
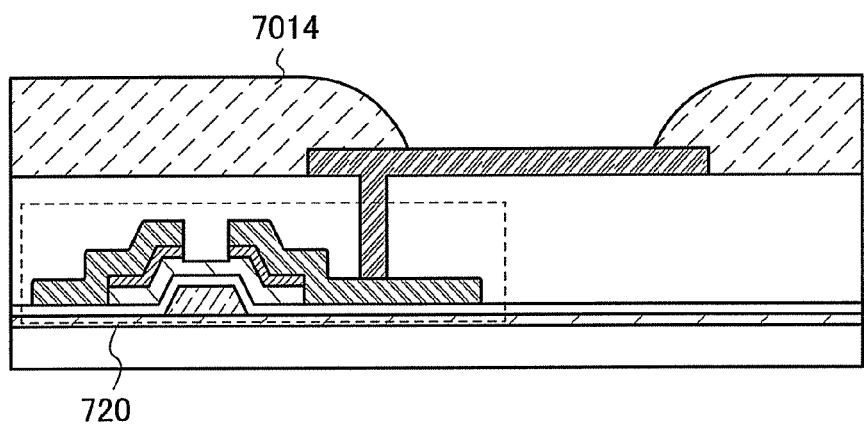

Next, a partition layer 7014 is formed so as to have an opening over the first electrode layer 7012 (see FIG. 11B). The partition layer 7014 can be formed using an inorganic insulating material such as silicon oxide, silicon nitride, silicon oxynitride, aluminum oxide, aluminum nitride, or aluminum oxynitride; an acrylic acid ester, a methacrylic acid ester, or a derivative thereof; a heat-resistant high-molecular material such as polyimide, aromatic polyamide, or polybenzimidazole; an insulating material such as silicone formed by using a siloxane-based material as a starting material, an inorganic siloxane which includes a Si—O—Si bond, and an organic siloxane in which hydrogen bonded to silicon is substituted by an organic group such as methyl group or phenyl group. A photosensitive or nonphotosensitive material such as acrylic resin or polyimide may also be used.

The partition layer 7014 can be selectively formed using a droplet-discharging method, a printing method, a disperser method, or the like. Alternatively, the partition layer 7014 with desired shape may be constructed by forming a layer of an insulating material over the entire surface, forming a resist mask or the like by utilizing lithography steps, and etching the layer of the insulating material. Besides, the partition layer 7014 having a desired shape can also be formed by forming a layer of a photosensitive material over the entire surface and exposing the layer of the photosensitive material to light to develop it. It is preferable that the partition layer 7014 have a shape in which radius of curvature continuously changes. By applying such a shape to the partition layer, coverage by a layer 7016 and a second electrode layer 7018 which are formed thereover is improved.

After the partition layer 7014 is formed by discharging a composition by a droplet-discharging method, its surface may be planarized by pressing with pressure to enhance a level of planarity. As a pressing method, scanning the surface by a roller-shaped object, or pressing the surface perpendicularly by using a flat plate-shaped object may be performed. Alternatively, concavity and convexity of the surface may be removed with an air knife after the surface is softened or melted with a solvent or the like. A CMP method may also be used for polishing the surface. This process can be employed for planarizing the surface when the surface becomes uneven by a droplet-discharging method. When a level of planarity is enhanced by this process, irregular display of the display device can be prevented; thus, a high definition image can be displayed.

Next, the layer 7016 and the second electrode layer 7018 are stacked over the first electrode layer 7012 and the partition layer 7014. Then, the light-emitting element 7020 having a structure in which the layer 7016 is interposed between the first electrode layer 7012 and the second electrode layer 7018 is obtained (see FIG. 11C). The layer 7016 includes at least a layer containing a light-emitting material by which a desired light-emission wavelength can be obtained (hereinafter referred to as a light-emitting layer). Specifically, the layer 7016 includes a layer containing an organic compound, a layer containing an inorganic compound, or a layer containing both organic and inorganic compounds.

Through the above processes, a display device provided with the light-emitting element 7020 can be obtained.

An opening can be formed in a desired region by applying the present invention without using a lithography step with a photoresist. Thus, lithography steps can be simplified and/or the number of lithography steps can be reduced, the loss of a material such as a resist material or a developing solution can be prevented, and the number of photomasks which are necessary can be reduced. Therefore, in the manufacturing process of the display device, the cost can be reduced and the throughput can be improved. In addition, a large number of openings can be formed at the same time and mass productivity of the display device can also be improved.

This embodiment mode can be freely combined with the above Embodiment Modes 1 to 5 as appropriate.

Embodiment Mode 7

In this embodiment mode, a structure of a display panel according to the present invention will be described.

Figure 15A:
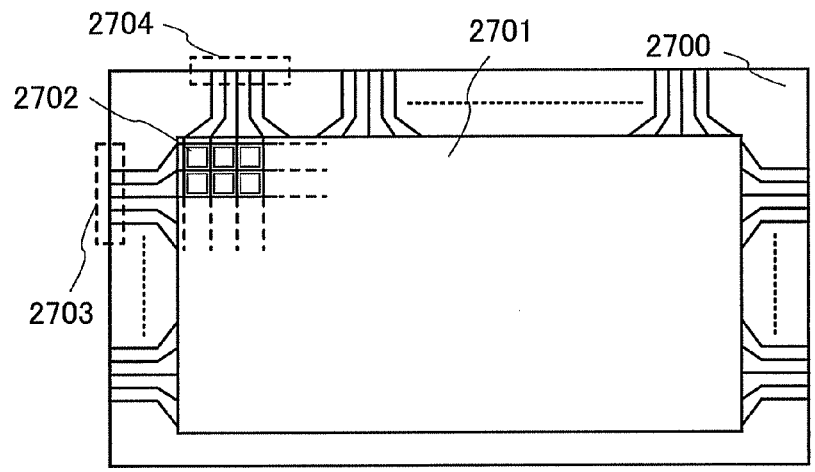
FIGS. 15A to 15C are top views of display devices of the present invention.

FIG. 15A is a top view illustrating a structure of a display panel according to the present invention. A pixel portion 2701 in which pixels 2702 are arranged in matrix, a scanning line input terminal 2703, and a signal line input terminal 2704 are formed over a substrate 2700 having an insulating surface. The number of pixels may be determined in accordance with various standards. In the case of XGA full-color display using RGB, the number of pixels may be 1024×768×3 (RGB). In the case of UXGA full-color display using RGB, the number of pixels may be 1600×1200×3 (RGB), and in the case of full-spec high-definition, and full-color display using RGB, the number of pixels may be 1920×1080×3 (RGB).

The pixels 2702 are formed in matrix by intersections of scanning lines extended from the scanning line input terminal 2703 and signal lines extended from the signal line input terminal 2704. Each pixel 2702 is provided with a switching element and a pixel electrode layer connected thereto. A typical example of the switching element is a transistor. A gate electrode side of the transistor is connected to the scanning line, and a source electrode or drain electrode side of the transistor is connected to the signal line, which enables each pixel to be independently controlled by a signal inputted from outside.

Figure 16A:
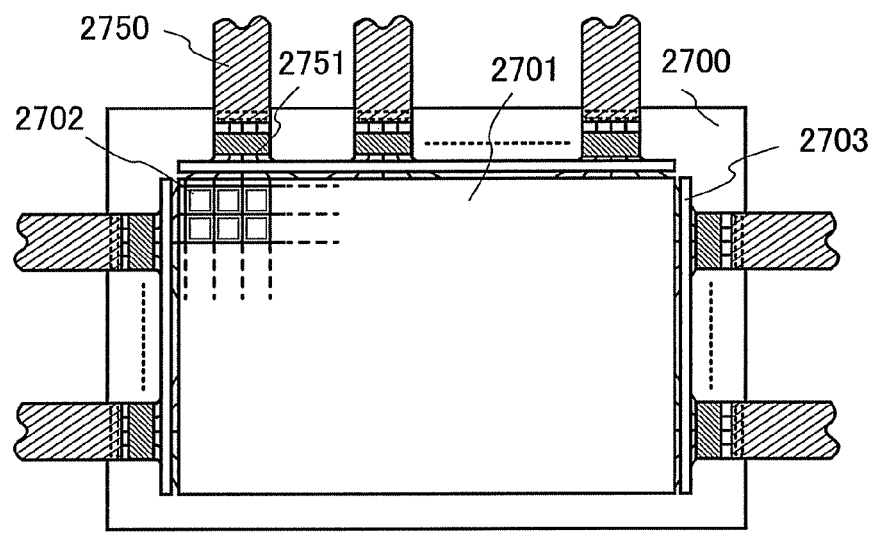
FIGS. 16A and 16B are top views of display devices of the present invention.
Figure 16B:
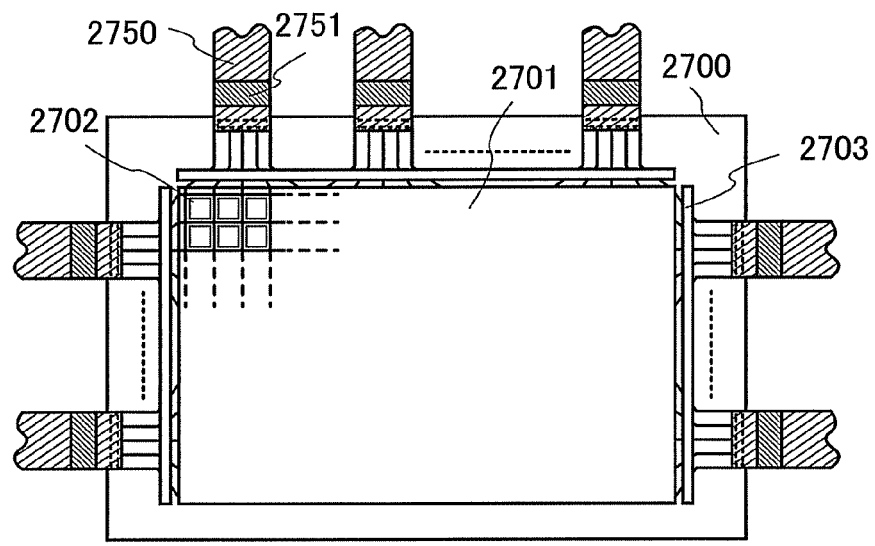

FIG. 15A illustrates a structure of a display device in which a signal to be inputted to the scanning line and the signal line is controlled by an external driver circuit. Alternatively, a driver IC 2751 may be mounted on the substrate 2700 by a COG (Chip On Glass) method as illustrated in FIG. 16A. As another mounting mode, a TAB (Tape Automated Bonding) method may be used as illustrated in FIG. 16B. The driver IC may be formed over a single crystalline semiconductor substrate or may be formed using a TFT over a glass substrate. In each of FIGS. 16A and 16B, the driver IC 2751 is connected to an FPC 2750.

Figure 15B:
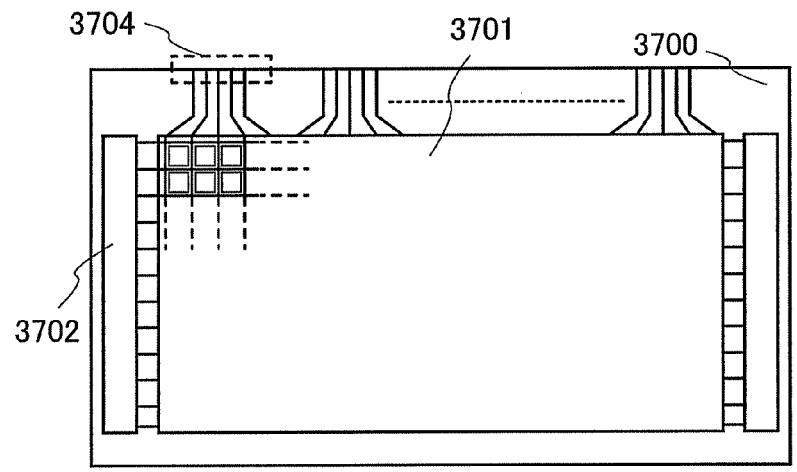
Figure 15C:
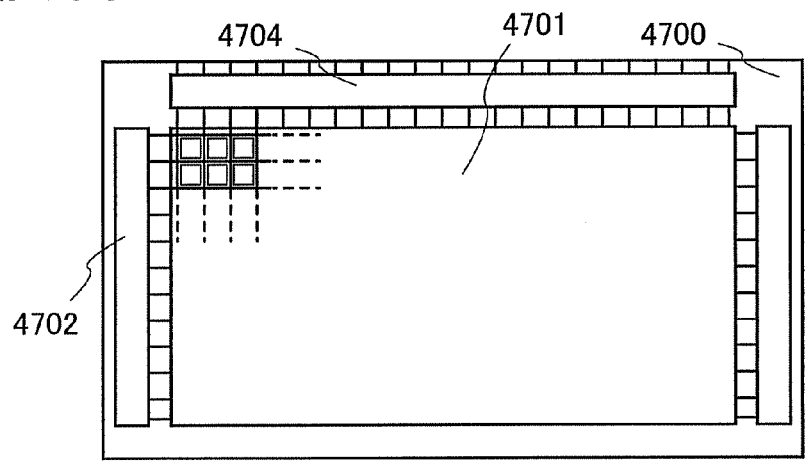

When a transistor provided in a pixel is formed of a crystalline polycrystalline (or microcrystalline) semiconductor, a scanning line driver circuit 3702 can be formed over a substrate 3700 as illustrated in FIG. 15B. In FIG. 15B, reference numeral 3701 denotes a pixel portion, and a signal line driver circuit is controlled by an external driver circuit in a similar manner to FIG. 15A. When the transistor provided in a pixel is formed of a polycrystalline (microcrystalline) semiconductor, a single crystalline semiconductor, or the like having high mobility, a scanning line driver circuit 4702 and a signal line driver circuit 4704 can all be formed over a glass substrate 4700 as illustrated in FIG. 15C.

In this embodiment mode, the present invention utilizing laser ablation as shown in the above Embodiment Modes 1 to 6 can be applied to an opening which forms a wiring connecting a switching element and a pixel electrode, an opening which forms a wiring connecting a gate electrode of a transistor and a scanning line, an opening which forms a wiring connecting a source electrode or drain electrode and a signal line, or the like.

Lithography steps with a photoresist can be simplified and/or the number of lithography steps can be reduced by applying the present invention. Therefore, in manufacturing the display device, the manufacturing cost can be reduced and the throughput can be improved. In addition, a large number of openings can be formed at the same time and mass productivity can also be improved.

This embodiment mode can be freely combined with the above Embodiment Mode 6 as appropriate.

Embodiment Mode 8

In this embodiment mode, an example of a display device according to the present invention will be described with reference to FIGS. 27A and 27B.

FIG. 27A illustrates a top schematic view of a display device shown in this embodiment mode. In addition, FIG. 27B illustrates a cross-sectional view taken along a line Q-R of FIG. 27A.

A display device 900 illustrated in FIGS. 27A and 27B includes, over a substrate 901, a pixel portion 902 and a driver circuit portion 904. A sealing substrate 908 is provided over the substrate 901 with a sealant 910 interposed therebetween. Further, a terminal portion 906 is provided over the substrate 901. Signals for controlling operations of a plurality of elements included in the pixel portion 902 and power source potentials are inputted from outside through the terminal portion 906.

The pixel portion 902 is provided with a light-emitting element 930, a driving transistor 924, a switching transistor 922, and a capacitor element 920. In the light-emitting element 930, at least a layer including a light-emitting layer is interposed between a pair of electrode layers. The light-emitting element 930 is electrically connected to the driving transistor 924.

Edge portions of a lower electrode layer of the light-emitting element 930 (the electrode layer electrically connected to the driving transistor 924) are covered with a partition layer 918. The partition layer 918 is formed of an inorganic insulating material such as silicon oxide or silicon nitride; an organic insulating material such as acrylic, polyimide, or resist; a siloxane material; or the like. The partition layer 918 can separate light-emitting elements provided adjacent to each other. When the partition layer 918 has an edge portion with a rounded shape of which radius of curvature continuously changes as shown in this embodiment mode, coverage by layers stacked thereover is improved, which is preferable.

The driver circuit portion 904 is provided with a plurality of transistors 926, which form a driver circuit for controlling the operation of the pixel portion 902. The driver circuit portion 904 is provided with, for example, a shift register, a decoder, a buffer, a sampling circuit, a latch, or the like.

The substrate 901 and the sealing substrate 908 are attached to each other with the sealant 910 interposed therebetween so as to seal the pixel portion 902 and the driver circuit portion 904. The sealing substrate 908 is provided with a color filter 942 and a light-shielding layer 944. The present invention is not particularly limited, and the color filter 942 or the light-shielding layer 944 may also be omitted.

This embodiment mode differs from the above Embodiment Mode 6 in that a gate electrode layer of each transistor is provided below or over a semiconductor layer. Other structures are based on those in Embodiment Mode 6.

Next, an example of a specific manufacturing method will be described.

As a base insulating layer 903a is formed using silicon nitride oxide with a film thickness of 10 nm to 200 nm (preferably 50 nm to 150 nm) over the substrate 901, and a base insulating layer 903b is formed thereover using silicon oxynitride with a thickness of 50 nm to 200 nm (preferably 100 nm to 150 nm) by a PVD (Physical Vapor Deposition) method such as a sputtering method, a CVD (Chemical Vapor Deposition) method such as a low-pressure CVD (LPCVD) method or a plasma CVD method, or the like.

In this embodiment mode, the base insulating layers 903a and 903b are formed using a plasma CVD method. As the substrate 901, a glass substrate, a quartz substrate, a silicon substrate, a metal substrate, or a stainless steel substrate provided with an insulating layer on the surface may be used. In addition, a plastic substrate having heat resistance sufficient to withstand the process temperature of this embodiment mode may be used, or a flexible film-like substrate may be used. As the plastic substrate, a substrate made of PET (polyethylene terephthalate), PEN (polyethylene naphthalate), or PES (polyethersulfone) can be used, and as the flexible substrate, a substrate made of a synthetic resin such as acrylic can be used.

The base insulating layers can be formed using silicon oxide, silicon nitride, silicon oxynitride, silicon nitride oxide, or the like and may have either a single layer structure or a stacked layer structure such as a two-layer or three-layer structure.

Next, a semiconductor layer is formed over the base insulating layers. The semiconductor layer may be formed with a film thickness of 25 nm to 200 nm (preferably 30 nm to 150 nm) by any of various methods (such as a sputtering method, an LPCVD method, or a plasma CVD method). In this embodiment mode, it is preferable to use a crystalline semiconductor layer which is obtained by crystallizing an amorphous semiconductor layer with a laser beam.

The semiconductor layer obtained in such a manner may be doped with a slight amount of an impurity element (boron or phosphorus) to control a threshold voltage of a transistor. This doping with an impurity element may be performed to the amorphous semiconductor layer before the crystallization step. When the doping with an impurity element is performed to the amorphous semiconductor layer, activation of the impurity element can be performed by a later heat treatment for crystallization. In addition, defects and the like caused during the doping can be improved.

The semiconductor layer may be selectively etched and processed into a desired shape. In addition, the semiconductor layer may also be formed by various printing methods (a method for forming a desired pattern such as screen (mimeograph) printing, offset (planograph) printing, relief printing, or gravure (intaglio) printing), a nano-imprinting method, a droplet-discharging method, a dispenser method, a selective coating method, or the like.

Note that a lower electrode layer forming a capacitor element is also formed in the same process as the semiconductor layer. The lower electrode layer is formed using the same layer as the semiconductor layer constituting the transistor.

A gate insulating layer is formed to cover the semiconductor layer. The gate insulating layer is formed using an insulating layer containing silicon with a film thickness of 10 nm to 150 nm by a plasma CVD method, a sputtering method, or the like. The gate insulating layer may be formed using an inorganic insulating material such as silicon nitride, silicon oxide, silicon oxynitride, or silicon nitride oxide in a single layer structure or a stacked layer structure. The gate insulating layer may be formed in a three-layer structure of a silicon nitride layer, a silicon oxide layer, and a silicon nitride layer. Alternatively, a single layer or a stacked layer structure including two layers of a silicon oxynitride layer may be used.

Next, a gate electrode layer is formed over the gate insulating layer. The gate electrode layer can be formed by forming a conductive layer by a sputtering method, an evaporation method, a CVD method, or the like and then selectively etching the conductive layer into a desired shape. The gate electrode layer may be formed using an element of tantalum (Ta), tungsten (W), titanium (Ti), molybdenum (Mo), aluminum (Al), copper, (Cu), chromium (Cr), or neodymium (Nd), or an alloy material or a compound material containing the element as its main component. Alternatively, the gate electrode layer may be formed using a semiconductor layer typified by polycrystalline silicon doped with an impurity element such as phosphorus, or an AgPdCu alloy. The gate electrode layer may have a single layer structure or a stacked layer structure. At this time, an upper electrode layer for a capacitor element completed later is also formed. The upper electrode layer is formed using the same material as the gate electrode layer.

The gate electrode layer is formed to have a tapered side surface in this embodiment mode. The gate electrode layer can be formed into a tapered shape by using a wet etching method during the etching processing. Alternatively, a wet etching method may be sequentially performed after a dry etching method. Note that the gate electrode layer having a perpendicular side surface may be formed. Further, the gate electrode layer may have a two-layer structure in which the layers have different taper angles. When the gate electrode layer has a tapered side surface, the coverage by layers stacked thereover can be improved.

The gate electrode layer may also be formed by various printing methods (a method for forming a desired pattern such as screen (mimeograph) printing, offset (planograph) printing, relief printing, or gravure (intaglio) printing), a nano-imprinting method, a droplet-discharging method, a dispenser method, a selective coating method, or the like.

Through the etching step in forming the gate electrode layer, the gate insulating layer may be somewhat etched to and the film thickness thereof may be reduced (so-called film reduction) in some cases.

An impurity element is added to the semiconductor layer to form a pair of impurity regions. The impurity region formed in the semiconductor layer functions as a source or drain region. As the impurity element to be added, an impurity element imparting n-type conductivity or an impurity element imparting p-type conductivity may be selected as appropriate. As the impurity element imparting n-type conductivity, phosphorus (P), arsenic (As), or the like can be used. As the impurity element imparting p-type conductivity, boron (B), aluminum (Al), gallium (Ga), or the like can be used. At this time, a channel formation region is formed between the pair of impurity regions.

Note that an impurity region referred to as an LDD (Lightly Doped Drain) region may be formed between an impurity region functioning as a source or drain region and a channel formation region in the semiconductor layer. The LDD region is an impurity region with a low concentration of impurities than an impurity region of a source or drain region. The LDD region may overlap with the gate electrode layer or may not overlap with the gate electrode layer.

Heat treatment, intense light irradiation, or laser beam irradiation may be performed to activate the impurity element. At the same time as the activation, plasma damages to the gate insulating layer and to the interface between the gate insulating layer and the semiconductor layer can be repaired.

Then, a first interlayer insulating layer is formed to cover the gate electrode layer and the gate insulating layer. In this embodiment mode, the first interlayer insulating layer has a stacked layer structure of insulating layers 913 and 914. The insulating layers 913 and 914 can be formed using a silicon nitride layer, a silicon nitride oxide layer, a silicon oxynitride layer, a silicon oxide layer, or the like by a sputtering method or a plasma CVD method, or another insulating layer containing silicon may be used in a single layer structure or a stacked layer structure of three or more layers.

Further, heat treatment is performed in a nitrogen atmosphere at temperatures of 300° C. to 550° C. for 1 hour to 12 hours to hydrogenate the semiconductor layer. Preferably, it is performed at 400° C. to 500° C. This step is a step of terminating dangling bonds of the semiconductor layer with hydrogen which is contained in the insulating layer 913 that is the interlayer insulating layer. In this embodiment mode, heat treatment is performed at 410° C.

The insulating layers 913 and 914 can be formed using a material such as aluminum nitride, aluminum oxynitride, aluminum nitride oxide having a higher content of nitrogen than that of oxygen, aluminum oxide, diamond-like carbon (DLC), nitrogen-containing carbon (CN), polysilazane, or other substances including an inorganic insulating material. Alternatively, a material containing siloxane may be used. An organic insulating material may also be used, and polyimide, acrylic, polyamide, polyimide amide, resist, or benzocyclobutene can be used. Moreover, an oxazole resin can be used, and for example, photo-curing polybenzoxazole or the like can be used.

Next, an opening is formed in the insulating layers 913 and 914 and the gate insulating layer so as to reach the source or drain region formed in the semiconductor layer.

The opening can be formed by utilizing laser ablation by laser beam irradiation as shown in the above Embodiment Modes 1 to 6. Specifically, irradiation with a multi-mode laser beam and a single-mode laser beam is performed so that both the laser beams overlap with each other. Since the semiconductor layer can function as a light absorbing layer, ablation occurs in a region the irradiation of which is performed so that the multi-mode laser beam and the single-mode laser beam overlap with each other. Accordingly, the opening can be formed by removing the insulating layers 913 and 914 and the gate insulating layer over the semiconductor layer.

Alternatively, the opening that reaches the semiconductor layer may also be formed by forming a mask layer with a photoresist and etching processing by using the mask layer.

A source electrode or drain electrode layer is formed in the opening that reaches the source or drain region of the semiconductor layer, and the source or drain region of the semiconductor layer can be electrically connected to the source electrode or drain electrode layer.

The source electrode or drain electrode layer can be formed by forming a conductive layer by a PVD method, a CVD method, an evaporation method, or the like and then selectively etching the conductive layer. The source electrode or drain electrode layer is formed using an element such as Ag, Au, Cu, Ni, Pt, Pd, Ir, Rh, W, Al, Ta, Mo, Cd, Zn, Fe, Ti, Si, Ge, Zr, or Ba, or an alloy material or a metal nitride containing the element as its main component. In addition, the source electrode or drain electrode layer may have a single layer structure or a stacked layer structure.

Alternatively, the source electrode or drain electrode layer may also be formed by various printing methods (a method for forming a desired pattern such as screen (mimeograph) printing, offset (planograph) printing, relief printing, or gravure (intaglio) printing), a nano-imprinting method, a droplet-discharging method, a dispenser method, a selective coating method, or the like. Further, a reflow method or a damascene method may also be used. With such a method, the conductive layer can be selectively formed in a desired place. Note that a terminal electrode layer 950 of the terminal portion 906 is also formed in forming the source electrode or drain electrode layer.

Through the above processes, an active matrix substrate including the transistors 922 and 924 in the pixel portion 902 and the plurality of transistors 926 in the driver circuit portion 904 can be manufactured.

The present invention is not particularly limited, and a transistor may have a single-gate structure in which one channel formation region is formed, a double-gate structure in which two channel formation regions are formed, or a triple-gate structure in which three channel formation regions are formed.

Next, an insulating layer 916 is formed as a second interlayer insulating layer. The insulating layer 916 can be formed of a material such as silicon oxide, silicon nitride, silicon oxynitride, silicon nitride oxide, aluminum nitride, aluminum oxide containing nitrogen (also referred to as aluminum oxynitride), aluminum nitride containing oxygen (also referred to as aluminum nitride oxide), aluminum oxide, diamond-like carbon (DLC), nitrogen-containing carbon (CN), PSG (phosphosilicate glass), BPSG (borophosphosilicate glass), alumina, or other substances including an inorganic insulating material. Alternatively, a siloxane resin may also be used. Further, an organic insulating material may be used; an organic material may be either photosensitive or non-photosensitive; and polyimide, acrylic, polyamide, polyimide amide, resist, benzocyclobutene, polysilazane, or a low-dielectric constant (Low-k) material can be used. Furthermore, an oxazole resin can be used, and for example, photo-curing polybenzoxazole or the like can be used. Since an interlayer insulating layer provided for planarization needs to have high heat resistance, a high insulating property, and a high level of planarity, the insulating layer 916 is preferably formed by a coating method typified by a spin coating method.

The insulating layer 916 can also be formed by a dipping method, spray coating, a doctor knife, a roll coater, a curtain coater, a knife coater, a CVD method, an evaporation method, or the like. The insulating layer 916 may also be formed by a droplet-discharging method. In the case of using a droplet-discharging method, a material liquid can be saved. Alternatively, a method like a droplet-discharging method by which a pattern can be transferred or drawn, for example, a printing method (a method for forming a pattern such as screen printing or offset printing), a dispenser method, or the like can also be used.

An opening that reaches the source electrode or drain electrode layer of the transistor 924 is formed in the insulating layer 916 of the pixel portion 902. The opening may be formed similarly to the opening for electrically connecting the source electrode or drain electrode layer and the source or drain region of the semiconductor layer. In the case of utilizing ablation by laser beam irradiation, the source electrode or drain electrode layer is irradiated with a laser beam. As the laser beam, irradiation of a multi-mode laser beam and a single-mode laser beam is performed so that both the laser beams overlap with each other. Synthesized energy of the multi-mode laser beam and the single-mode laser beam is absorbed by the source electrode or drain electrode layer in a region the irradiation of which is performed so that both the laser beams overlap with each other. The source electrode or drain electrode layer, the ablation of which occurs by the absorbed energy of the laser beams, is removed with the insulating layer 916 thereabove. Consequently, the opening that reaches the source electrode or drain electrode layer is formed in the insulating layer 916. Note that a low-melting point metal which can be relatively easily evaporated (chromium in this embodiment mode) is preferably used for the source electrode or drain electrode layer in the case where the opening is formed by utilizing ablation by laser beam irradiation.

A light-emitting element 930 is formed over the insulating layer 916 in the pixel portion 902. The light-emitting element 930 is electrically connected to the transistor 924.

First, a first electrode layer 932 is formed in the opening provided in the insulating layer 916 where the source electrode or drain electrode layer of the transistor 924 is exposed.

Next, a partition layer 918 is formed so as to have an opening over the first electrode layer 932 and cover the edge portions of the first electrode layer 932. The partition layer 918 can be formed using silicon oxide, silicon nitride, silicon oxynitride, silicon nitride oxide, or the like and may have a single layer structure or a stacked layer structure of two or three layers. The partition layer 918 can alternatively be formed using a material such as aluminum nitride, aluminum oxynitride having a higher content of oxygen than that of nitrogen, aluminum nitride oxide having a higher content of nitrogen than that of oxygen, aluminum oxide, diamond-like carbon (DLC), nitrogen-containing carbon (CN), polysilazane, or other substances including an inorganic insulating material. Alternatively, a material containing siloxane may also be used. Further, an organic insulating material may be used; an organic material may be either photosensitive or non-photosensitive; and polyimide, acrylic, polyamide, polyimide amide, resist, benzocyclobutene, or polysilazane can be used. Furthermore, an oxazole resin can be used, and for example, photo-curing polybenzoxazole or the like can be used.

The partition layer 918 can be formed by a droplet-discharging method by which a pattern can be selectively formed, a printing method by which a pattern can be transferred or drawn (a method for forming a pattern such as screen printing or offset printing), a dispenser method, a coating method such as a spin coating method, a dipping method, or the like. Alternatively, the partition layer is formed over the entire surface using a photosensitive material, and the partition layer formed of a photosensitive material is exposed to light and developed, whereby the partition layer can be patterned into a desired shape. Further, the partition layer may be formed over the entire surface by a PVD (Physical Vapor Deposition) method such as a sputtering method or a CVD (Chemical Vapor Deposition) method such as a low-pressure CVD (LPCVD) method or a plasma CVD method; a mask of a resist or the like is formed using a lithography technique; and the partition layer may be etched into a desired shape.

The partition layer is etching processed into a desired shape by employing either a dry etching method or a wet etching method; however, plasma etching (one kind of a dry etching method) is suitable for treating a large-sized substrate. As an etching gas, a fluorine-based gas such as $CF_4$, $CHF_3$, or $NF_3$ or a chlorine-based gas such as $Cl_2$ or $BCl_3$ is used, to which an inert gas such as He or Ar may be added as appropriate. Alternatively, electric discharge processing can be performed locally when the etching process is performed using atmospheric pressure discharge, and in such a case, a mask layer does not need to be formed over the entire surface of the substrate.

The partition layer 918 preferably has a shape of which radius of curvature continuously changes. By such a shape of the partition layer, coverage by a layer stacked thereover is improved.

Next, a layer 934 and a second electrode layer 936 are stacked over the first electrode layer 932 and the partition layer 918, and the light-emitting element 930 having a structure in which the layer 934 is interposed between the first electrode layer 932 and the second electrode layer 936 is obtained. The layer 934 includes at least a layer containing a light-emitting material by which a desired light-emission wavelength can be obtained.

One of the first electrode layer 932 and the second electrode layer 936 functions as an anode and the other functions as a cathode. The first electrode layer 932 and the second electrode layer 936 can be formed using gold (Au), platinum (Pt), nickel (Ni), tungsten (W), chromium (Cr), molybdenum (Mo), iron (Fe), cobalt (Co), copper (Cu), palladium (Pd), or the like as well as indium tin oxide (ITO), indium tin oxide containing silicon oxide, or indium tin oxide containing zinc oxide of 2 wt % to 20 wt %. In addition, aluminum, an alloy of magnesium and silver, an alloy of aluminum and lithium, or the like can be used.

In order to extract light emitted in the layer 934 outside, one or both the first electrode layer 932 and the second electrode layer 936 are preferably formed using indium tin oxide or the like, or alternatively, silver, aluminum, or the like that is formed to have a thickness of several nm to several tens of nm so as to transmit visible light.

The first electrode layer 932 can be obtained by forming the above material over the entire surface and pattering the material into a desired shape. The first electrode layer 932 may also be formed by various printing methods (a method for forming a desired pattern such as screen (mimeograph) printing, offset (planograph) printing, relief printing, or gravure (intaglio) printing), a nano-imprinting method, a droplet-discharging method, a dispenser method, a selective coating method, or the like. Further, a reflow method or a damascene method may also be used. With such a method, the conductive layer can be selectively formed in a desired place.

The first electrode layer 932 may be cleaned or polished by a CMP method or with the use of a polyvinyl alcohol based porous material, so that the surface thereof is planarized. In addition, after polishing using a CMP method, ultraviolet ray irradiation, oxygen plasma treatment, or the like may be performed on the surface of the first electrode layer 932.

After the first electrode layer 932 is formed, heat treatment may be performed. Through this heat treatment, moisture included in the first electrode layer 932 is released. Therefore, degasification or the like is not caused in the first electrode layer 932. Even when a light-emitting material which is easily deteriorated by moisture is formed over the first electrode layer 932, the light-emitting material is not deteriorated. Accordingly, a highly reliable display device can be manufactured.

The second electrode layer 936 can be formed by an evaporation method, a sputtering method, or the like. In addition, an insulating layer may be provided as a passivation layer (a protective layer) over the second electrode layer 936. It is effective to provide a passivation layer to cover the second electrode layer 936 in such a manner. The passivation layer can be formed using a single layer structure or a stacked layer structure in combination of an insulating layer including silicon nitride, silicon oxide, silicon oxynitride, silicon nitride oxide, aluminum nitride, aluminum oxynitride, aluminum nitride oxide having a higher content of nitrogen than that of oxygen, aluminum oxide, diamond-like carbon (DLC), or nitrogen-containing carbon (CN). Alternatively, the passivation layer may also be formed using a siloxane resin.

In this case, a film providing good coverage is preferably used as the passivation layer. A carbon film, especially, a DLC film is effective. The DLC film can be formed at a temperature in the range of room temperature to 100° C.; therefore, the DLC film can be easily formed over the layer 934 having low heat resistance. The DLC film can be formed by a plasma CVD method (typically, an RF plasma CVD method, a microwave CVD method, an electron cyclotron resonance (ECR) CVD method, a thermal filament CVD method, or the like), a combustion flame method, a sputtering method, an ion beam evaporation method, a laser evaporation method, or the like. A hydrogen gas and a hydrocarbon-based gas (for example, $CH_4$, $C_2H_2$, $C_6H_6$, or the like) are used as a reaction gas for forming a DLC film. The reaction gas is ionized by glow discharge and the ions are accelerated to collide with a negatively self-biased cathode, whereby a DLC film is formed. A nitrogen-containing carbon (CN) film may be formed using a $C_2H_4$ gas and an $N_2$ gas as a reaction gas. The DLC film has a high blocking effect on oxygen and can suppress oxidation of the layer 934. Therefore, the layer 934 can be prevented from being oxidized during a subsequent sealing step.

The layer 934 formed over the first electrode layer 932 includes at least a light-emitting layer containing a light-emitting material. The light-emitting layer includes a layer containing an organic compound, a layer containing an inorganic compound, or a layer containing both organic and inorganic compounds. The light-emitting element 930 in which the layer 934 is provided between the first electrode layer 932 and the second electrode layer 936 can be obtained.

In such a manner, the substrate 901 provided with the light-emitting element 930 and the sealing substrate 908 are fixed to each other with the sealant 910 to seal the light-emitting element 930. As the sealant 910, it is typically preferable to use a visible light curable resin, an ultraviolet curable resin, or a thermosetting resin. For example, a bisphenol-A liquid resin, a bisphenol-A solid resin, a bromine-containing epoxy resin, a bisphenol-F resin, a bisphenol-AD resin, a phenol resin, a cresol resin, a novolac resin, a cycloaliphatic epoxy resin, an Epi-Bis type (Epichlorohydrin-Bisphenol) epoxy resin, a glycidyl ester resin, a glycidyl amine resin, or an epoxy resin such as a heterocyclic epoxy resin or a modified epoxy resin can be used. Note that a region 948 surrounded with the sealant may be filled with a filler, or may be filled and sealed with nitrogen by sealing the region in a nitrogen atmosphere. In a structure in which light is taken out through the filler, the filler needs to have a light-transmitting property. Typically, a visible light curable, ultraviolet curable, or thermosetting epoxy resin may be used. Through the above processes, a display device having a display function using a light-emitting element is completed. Alternatively, the filler can be dripped in a liquid state to fill inside the display device. When a substance having a hygroscopic property such as a drying agent is used as the filler, a higher water-absorbing effect can be obtained, and deterioration of the light-emitting element 930 can be prevented.

In order to prevent element deterioration due to moisture, a drying agent may be provided so as to surround the pixel portion 902. For example, the drying agent may be provided in a depressed portion formed in the sealing substrate, so that the display device is not interfered with reduction in thickness. Further, when the drying agent is formed also in a region corresponding to a gate wiring layer so that a large water-absorbing area is provided, a high water-absorbing effect can be obtained. In addition, when the drying agent is formed over the gate wiring layer which does not contribute directly to light emission, reduction in light-extraction efficiency can be prevented.

This embodiment mode shows the case where the light-emitting element is sealed with a glass substrate. Sealing treatment is treatment for protecting the light-emitting element from moisture. Therefore, any of the following methods can be used: a method in which a light-emitting element is mechanically sealed with a cover material, a method in which a light-emitting element is sealed with a thermosetting resin or an ultraviolet curable resin, and a method in which a light-emitting element is sealed with a thin film of metal oxide, metal nitride, or the like having high barrier capability. As the cover material, glass, ceramics, plastic, or a metal can be used. However, when light is emitted to the cover material side, the cover material needs to have a light-transmitting property. The cover material is attached to the substrate over which the above light-emitting element is formed, with a sealant such as a thermosetting resin or an ultraviolet curable resin, and a sealed space is formed by curing the resin with heat treatment or ultraviolet ray irradiation treatment. It is also effective to provide a moisture-absorbing material typified by barium oxide in the sealed space. The moisture-absorbing material may be provided on the sealant, or over the partition layer or a peripheral portion so as not to block light emitted from the light-emitting element. Further, a space between the cover material and the substrate over which the light-emitting element is formed can also be filled with a thermosetting resin or an ultraviolet curable resin. In this case, it is effective to add a moisture-absorbing material typified by barium oxide in the thermosetting resin or the ultraviolet curable resin.

Further, the source electrode or drain electrode layer and the first electrode layer 932 may not be directly in contact to be electrically connected and may be connected through a wiring layer.

In this embodiment mode, an FPC 954 is connected to the terminal electrode layer 950 through an anisotropic conductive layer 952 in the terminal portion 906 so as to have electrical connection to outside.

Moreover, as illustrated in FIG. 27A, the display device manufactured in this embodiment mode includes the driver circuit portion 904 over the same substrate as the pixel portion 902. Note that the present invention is not limited and an IC chip may be mounted as a peripheral driver circuit by a COG method or a TAB method as described above.

In the display device of the present invention, a driving method for image display is not particularly limited, and for example, a dot sequential driving method, a line sequential driving method, an area sequential driving method, or the like may be used. Typically, the line sequential driving method is used, and a time division gray scale driving method or an area gray scale driving method may be used as appropriate. Further, a video signal inputted to the source line of the display device may be either an analog signal or a digital signal. The driver circuit and the like may be designed as appropriate in accordance with the video signal.

An opening can be formed in a desired region by applying the present invention without using a lithography step with a photoresist. Thus, lithography steps can be simplified and/or the number of lithography steps can be reduced. In the manufacturing process of the display device, the manufacturing cost can be reduced and the throughput can be improved. In addition, a large number of openings can be formed at the same time and mass productivity of the display device can also be improved.

This embodiment mode can be freely combined with the above Embodiment Modes 1 to 7 as appropriate.

Embodiment Mode 9

Various element structures can be applied to a light-emitting element that has a display function of a display device. The light-emitting element is generally distinguished by whether a light-emitting material is an organic compound or an inorganic compound. The former is referred to as an organic EL element, and the latter is referred to as an inorganic EL element. Here, examples of a light-emitting element that can be applied to the present invention will be described with reference to FIGS. 12, 13A to 13C, and 14A to 14C.

Figure 12:
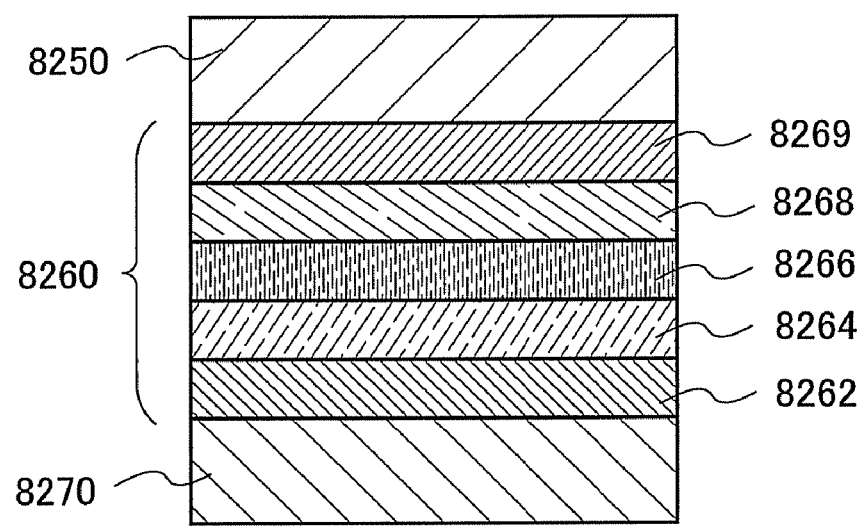
FIG. 12 is a view illustrating a structure of a light-emitting element which can be applied to the present invention.

FIG. 12 illustrates an organic EL element. In the light-emitting element illustrated in FIG. 12, a layer 8260 is interposed between a first electrode layer 8270 and a second electrode layer 8250. One of the first electrode layer 8270 or the second electrode layer 8250 is an anode, and the other is a cathode. Note that the anode indicates an electrode for injecting holes to a light-emitting layer, and the cathode indicates an electrode for injecting electrons to the light-emitting layer. In this embodiment mode, the first electrode layer 8270 is an anode and the second electrode layer 8250 is a cathode. Further, the layer 8260 has a structure in which a hole-injecting layer 8262, a hole-transporting layer 8264, a light-emitting layer 8266, an electron-transporting layer 8268, and an electron-injecting layer 8269 are sequentially stacked.

The first electrode layer 8270 and the second electrode layer 8250 can be formed using gold (Au), platinum (Pt), nickel (Ni), tungsten (W), chromium (Cr), molybdenum (Mo), iron (Fe), cobalt (Co), copper (Cu), palladium (Pd), or the like as well as indium tin oxide (ITO), indium tin oxide containing silicon oxide, or indium tin oxide containing zinc oxide of 2 wt % to 20 wt %. Moreover, in addition to aluminum, an alloy of magnesium and silver, an alloy of aluminum and lithium, or the like can also be used for forming the first electrode layer 8270. A method for forming the first electrode layer 8270 is the same as that of the first electrode layer 7012 or the first electrode layer 932 described above. A method for forming the second electrode layer 8250 is not particularly limited, and for example, a sputtering method, an evaporation method, or the like can be used.

In order to extract emitted light to an external portion, it is preferable to form either the first electrode layer 8270 or the second electrode layer 8250, or both of them by using indium tin oxide or the like or by depositing silver, aluminum, or the like to have a film thickness of several nm to several tens of nm, so that visible light can be transmitted.

The hole-injecting layer 8262 is a layer having a function for supporting injection of holes from the first electrode layer 8270 to the hole-transporting layer 8264. When the hole-injecting layer 8262 is provided, an ionization potential difference between the first electrode layer 8270 and the hole-transporting layer 8264 is relieved; thus, holes are easily injected. The hole-injecting layer 8262 is preferably formed using a substance, ionization potential of which is lower than that of a substance forming the hole-transporting layer 8264 and higher than that of a substance forming the first electrode layer 8270. The hole-injecting layer 8262 is also preferably formed using a substance, energy band of which is bent by being provided as a thin film with a thickness of 1 nm to 2 nm between the hole-transporting layer 8264 and the first electrode layer 8270. As a specific example of a substance that can be used for forming the hole-injecting layer 8262, a phthalocyanine-based compound such as phthalocyanine (abbreviation: $H_2Pc$) or copper phthalocyanine (CuPc), a high molecular material such as poly(ethylenedioxythiophene)/poly(styrenesulfonic acid) solution (PEDOT/PSS), and the like can be given. That is, a substance is selected from hole-transporting substances, so that ionization potential in the hole-injecting layer 8262 is relatively lower than that in the hole-transporting layer 8264, whereby the hole-injecting layer 8262 can be formed. In the case where the hole-injecting layer 862 is provided, it is preferable to form the first electrode layer 8270 using a substance with a high work function such as indium tin oxide. Note that the present invention is not particularly limited, and the hole-injecting layer 8262 is not necessarily provided.

The hole-transporting layer 8264 is a layer having a function for transporting holes that are injected from the first electrode layer 8270 to the light-emitting layer 8266. The hole-transporting layer 8264 is provided as described above, whereby a distance between the first electrode layer 8270 and the light-emitting layer 8266 can be increased. Consequently, quenching of light emission caused by a metal included in the first electrode layer 8270 and the like can be prevented. The hole-transporting layer 8264 is preferably formed using a hole-transporting substance, particularly using a substance that has a hole mobility of $1\times10^{-6}$ cm$^2$/Vs or more. Note that the hole-transporting substance is a substance whose hole mobility is higher than electron mobility and whose value of a ratio of hole mobility with respect to electron mobility (=hole mobility/electron mobility) is preferably larger than 100. As a specific example of a substance that can be used for the hole-transporting layer 8264, the following can be given: 4,4'-bis[N-(1-napthyl)-N-phenylamino]biphenyl (abbreviation: NPB), 4,4'-bis[N-(3-methylphenyl)-N-phenylamino]biphenyl (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis{N-[4-(N,N-di-m-tolylamino)phenyl]-N-phenylamino}biphenyl (abbreviation: DNTPD), 1,3,5-tris[N,N-di(m-tolyl)amino]benzene (abbreviation: m-MTDAB), 4,4',4''-tris(N-carbazolyl)triphenylamine (abbreviation: TCTA), phthalocyanine (abbreviation: $H_2Pc$), copper phthalocyanine (abbreviation: CuPc), vanadyl phthalocyanine (abbreviation: VOPc), 4,4'-bis[N-(4-biphenylyl)-N-phenylamino]biphenyl (abbreviation: BBPB), or the like. Note that the hole-transporting layer 8264 may have a single layer structure or a stacked layer structure.

The light-emitting layer 8266 is a layer having a light-emitting function, which contains a light-emitting material formed of an organic compound. Alternatively, the light-emitting layer 8266 may contain an inorganic compound. The organic compound contained in the light-emitting layer 8266 is not particularly limited as long as it is an organic compound with a light-emitting property. Various low molecular organic compounds and high molecular organic compounds can be used. Further, either a fluorescent light-emitting material or a phosphorescent light-emitting material may be used for the organic compound with a light-emitting property. The light-emitting layer 8s66 may be a layer containing only an organic compound with a light-emitting property or may be a layer that has a structure in which an organic compound with a light-emitting property is dispersed in a host material having a larger energy gap than the organic compound. In the case where the light-emitting layer 8266 is a layer in which a plurality of compounds are mixed like a layer containing a light-emitting material formed of the organic compound and the host material, the light-emitting layer 8266 can be formed by a co-evaporation method. Here, a co-evaporation method is an evaporation method in which materials are vaporized from a plurality of evaporation sources that are provided in one treatment chamber, and the vaporized materials are mixed in a vapor phase state and then deposited on the object to be processed.

The electron-transporting layer 8268 is a layer having a function for transporting electrons that are injected from the second electrode layer 8250 to the light emitting layer 8266. The electron-transporting layer 8268 is provided as described above, whereby a distance between the second electrode layer 8250 and the light-emitting layer 8266 can be increased. Consequently, quenching of light emission caused by a metal included in the second electrode layer 8250 and the like can be prevented. The electron-transporting layer 8268 is preferably formed using an electron-transporting substance, particularly using a substance that has an electron mobility of $1\times10^{-6}$ cm$^2$/Vs or more. Note that the electron-transporting substance is a substance whose electron mobility is higher than hole mobility and whose value of a ratio of electron mobility with respect to hole mobility (=electron mobility/hole mobility) is larger than 100. As a specific example of a substance that can be used for forming the electron-transporting layer 8268, the following can be given: 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), 4,4-bis(5-methylbenzoxazol-2-yl)stilbene (abbreviation: BzOs), or the like as well as a metal complex such as tris(8-quinolinolato)aluminum (abbreviation: Alq$_3$), tris(4-methyl-8-quinolinolato)aluminum (abbreviation: Almq$_3$), bis(10-hydroxybenzo[h]-quinolinato)beryllium (abbreviation: BeBq$_2$), bis(2-methyl-8-quinolinolato)-4-phenylphenolato-aluminum (abbreviation: BAlq), bis[2-(2-hydroxyphenyl)benzoxazolato]zinc (abbreviation: Zn(BOX)$_2$), or bis[2-(2-hydroxyphenyl)benzothiazolato]zinc (abbreviation: Zn(BTZ)$_2$). The electron-transporting layer 8268 may have a single layer structure or a stacked layer structure.

The electron-injecting layer 8269 is a layer having a function for supporting injection of electrons form the second electrode layer 8250 to the electron-transporting layer 8268. The electron-injecting layer 8269 can be formed using a substance having relatively higher electron affinity than that of a substance used for forming the electron-transporting layer 8268, which is selected from substances that can be used for forming the electron-transporting layer 8268, such as BPhen, BCP, p-EtTAZ, TAZ, and BzOs. When the electron-injecting layer 8269 is formed in such manner, a difference of electron affinity between the second electrode layer 8250 and the electron-transporting layer 8268 is relieved, and electrons are easily injected. In addition, the electron-injecting layer 8269 may contain an inorganic substance such as an alkali metal such as lithium (Li) or cesium (Cs); an oxide of an alkali metal such as lithium oxide, potassium oxide, or sodium oxide; an oxide of an alkaline earth metal such as calcium oxide or magnesium oxide; a fluoride of an alkali metal such as lithium fluoride or cesium fluoride; a fluoride of an alkaline earth metal such as calcium fluoride; or an alkaline earth metal such as magnesium (Mg) or calcium (Ca). In addition, the electron-injecting layer 8269 may have a structure containing the organic compound such as BPhen, BCP, p-EtTAZ, TAZ, or BzOs or may have a structure containing an inorganic compound such as a fluoride of an alkali metal such as LiF or a fluoride of an alkaline earth metal such as $CaF_2$. By providing the electron-injecting layer 8269 as a thin film with a thickness of 1 nm to 2 nm by using an inorganic compound such as a fluoride of an alkali metal such as LiF or a fluoride of an alkaline earth metal such as $CaF_2$, an energy band of the electron-injecting layer 8269 is bent, or a tunnel current flows through the electron-injecting layer 8269, whereby electrons are easily injected from the second electrode layer 8250 to the electron-transporting layer 8268.

Note that a hole-generating layer may be provided instead of the hole-injecting layer 8262, or an electron-generating layer may be provided instead of the electron-injecting layer 8269.

Here, the hole-generating layer is a layer for generating holes. The hole-generating layer can be formed by mixing at least one substance selected from hole-transporting substances and a substance showing an electron accepting property with respect to the hole-transporting substance. Here, as the hole-transporting substance, a similar substance to the substance that can be used for forming the hole-transporting layer 8264 can be used. As the substance showing an electron accepting property, metal oxide such as molybdenum oxide, vanadium oxide, ruthenium oxide, or rhenium oxide is preferably used.

The electron-generating layer is a layer for generating electrons. The electron-generating layer can be formed by mixing at least one substance selected from electron-transporting substances and a substance showing an electron donating property with respect to the electron-transporting substance. Here, as the electron-transporting substance, a similar substance to the substance that can be used for forming the electron-transporting layer 8268 can be used. As the substance showing an electron donating property, a substance selected from an alkali metal or an alkaline earth metal, specifically lithium (Li), calcium (Ca), sodium (Na), potassium (K), magnesium (Mg), or the like can be used.

The hole-injecting layer 8262, the hole-transporting layer 8264, the light-emitting layer 8266, the electron-transporting layer 8268, and the electron-injecting layer 8269 may be each formed by an evaporation method, a droplet-discharging method, a coating method, or the like. The first electrode layer 8270 or the second electrode layer 8250 may be formed by a sputtering method, an evaporation method, or the like.

In this embodiment mode, it is acceptable as long as the layer 8260 includes at least the light-emitting layer 8266, and the layers having other functions (the hole-injecting layer 8262, the hole-transporting layer 8264, the electron-transporting layer 8268, the electron-injecting layer 8269, and the like) may be provided as appropriate.

Further, the first electrode layer 8270 may be a cathode, and the second electrode layer 8250 may be an anode. In this case, the layer 8260 has a structure in which an electron-injecting layer, an electron-transporting layer, a light-emitting layer, a hole-transporting layer, and a hole-injecting layer are sequentially stacked from the first electrode layer 8270 side.

Next, an inorganic EL element will be described with reference to FIGS. 13A to 13C and 14A to 14C. The inorganic EL element is classified into a dispersion-type inorganic EL element and a thin-film-type inorganic EL element, depending on its element structure. The former and the latter are different in that the former has a light-emitting layer in which particles of a light-emitting material are dispersed in a binder, whereas the latter has a light-emitting layer formed of a thin film of a light-emitting material. However, the former and the latter share a common feature that they need electrons accelerated by a high electric field. Note that there are donor-acceptor recombination-type light emission that utilizes a donor level and an acceptor level, and localized-type light emission that utilizes inner-shell electron transition of a metal ion, as a mechanism of light emission that is obtained. In general, in many cases, a dispersion-type inorganic EL element exhibits donor-acceptor recombination-type light emission and a thin-film-type inorganic EL element exhibits localized-type light emission.

A light-emitting material that can be used in the present invention includes a base material and an impurity element. The impurity element serves as a luminescent center. By varying the impurity element that is contained, light emission of various colors can be obtained. Various methods such as a solid-phase method and a liquid-phase method (a coprecipitation method) can be used for forming the light-emitting material. In addition, an evaporative decomposition method, a double decomposition method, a method by heat decomposition reaction of a precursor, a reversed micelle method, a method in which such a method and high temperature baking are combined, a liquid-phase method such as a freeze-drying method, or the like can be used.

A solid-phase method is a method in which a base material and an impurity element or a compound containing an impurity element are weighed, they are mixed in a mortar, and the mixture is heated and baked in an electronic furnace to be reacted, so that the impurity element is contained in the base material. The baking temperature is preferably 700° C. to 1500° C. This is because the solid reaction does not progress when the temperature is too low, whereas the base material is decomposed when the temperature is too high. Note that the baking may be carried out in a powder state; however, it is preferable that the baking be performed out in a pellet state. Although the solid-phase method needs baking at a relatively high temperature, the solid-phase method is simple; therefore, high productivity is obtained and the solid-phase method is suitable for mass productivity.

A liquid-phase method (a coprecipitation method) is a method in which a base material or a compound containing a base material, and an impurity element or a compound containing an impurity element are reacted in a solution, dried, and then baked. Particles of a light-emitting material are distributed uniformly, and the reaction can progress even when the grain size is small and the baking temperature is low.

As a base material used for a light-emitting material, a sulfide, an oxide, or a nitride can be used. For the sulfide, for example, zinc sulfide, cadmium sulfide, calcium sulfide, yttrium sulfide, gallium sulfide, strontium sulfide, barium sulfide, or the like can be used. For the oxide, for example, zinc oxide, yttrium oxide, or the like can be used. For the nitride, for example, aluminum nitride, gallium nitride, indium nitride, or the like can be used. Furthermore, as the base material used for the light-emitting material, zinc selenide, zinc telluride, or the like can also be used. Alternatively, a ternary mixed crystal such as calcium gallium sulfide ($CaGa_2S_4$), strontium gallium sulfide ($SrGa_2S_4$), or barium gallium sulfide ($BaGa_2S_4$) may also be used.

For an impurity element of the localized-type light emission, manganese (Mn), copper (Cu), samarium (Sm), terbium (Tb), erbium (Er), thulium (Tm), europium (Eu), cerium (Ce), praseodymium (Pr), or the like can be used. Note that a halogen element such as fluorine (F) or chlorine (Cl) may be added, which can function as charge compensation.

On the other hand, for an impurity element of the donor-acceptor recombination-type light emission, a light-emitting material containing a first impurity element which forms a donor level and a second impurity element which forms an acceptor level can be used. As the first impurity element, for example, fluorine (F), chlorine (Cl), aluminum (Al), or the like can be used. As the second impurity element, for example, copper (Cu), silver (Ag), or the like can be used.

In the case where the light-emitting material of the donor-acceptor recombination-type light emission is synthesized by a solid-phase method, each of a base material, a first impurity element or a compound containing a first impurity element, and a second impurity element or a compound containing a second impurity element is weighed and mixed in a mortar, and then heated and baked in an electronic furnace. The above base material can be used for the base material. As the first impurity element or the compound containing the first impurity element, for example, fluorine (F), chlorine (Cl), aluminum sulfide, or the like can be used. As the second impurity element or the compound containing the second impurity element, for example, copper (Cu), silver (Ag), copper sulfide, silver sulfide, or the like can be used. The baking temperature is preferably 700° C. to 1500° C. This is because the solid reaction does not progress when the temperature is too low, whereas the base material is decomposed when the temperature is too high. Note that the baking may be performed in a powder state; however, it is preferable that the baking be performed in a pellet state.

As an impurity element in the case where solid-phase reaction is utilized, a compound including a first impurity element and a second impurity element may be used. In this case, the impurity element is easily diffused and solid-phase reaction easily progresses; thus, a uniform light-emitting material can be obtained. Moreover, since an unnecessary impurity element does not enter, a light-emitting material with high purity can be obtained. As the compound including the first impurity element and the second impurity element, for example, copper chloride, silver chloride, or the like can be used.

Note that these impurity elements may be contained at concentrations of 0.01 atom % to 10 atom %, preferably, 0.05 atom % to 5 atom % with respect to the base material.

In the case of the thin-film-type inorganic EL element, a light-emitting layer, which contains the above light-emitting material, can be formed by a vacuum evaporation method such as a resistance heating evaporation method or an electron beam evaporation (EB evaporation) method, a physical vapor deposition method (PVD) such as a sputtering method, a chemical vapor deposition method (CVD) such as a metal organic CVD method or a low-pressure hydride transport CVD method, an atomic layer epitaxy method (ALE), or the like.

Figure 13A:
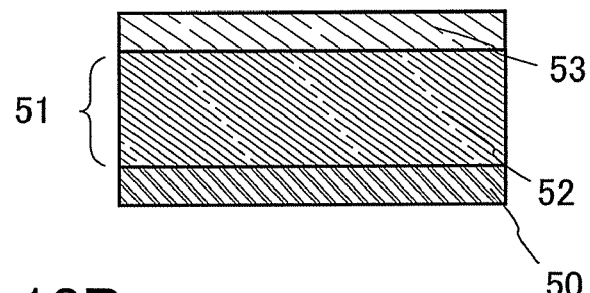
FIGS. 13A to 13C are views illustrating structures of light-emitting elements which can be applied to the present invention.
Figure 13B:
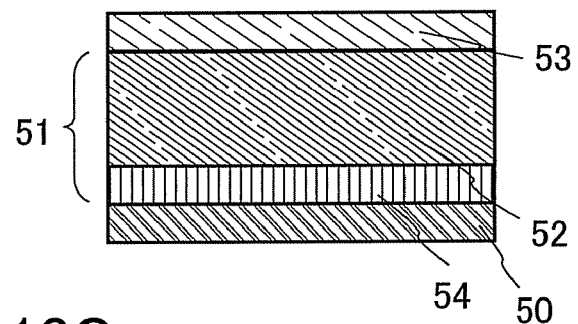
Figure 13C:
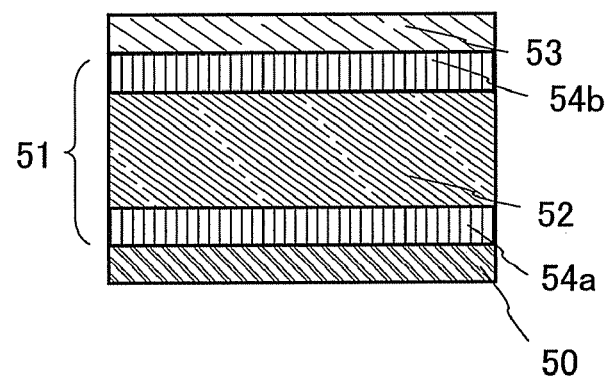

Examples of a thin-film-type inorganic EL element that can be used as a light-emitting element are illustrated in FIGS. 13A to 13C. In FIGS. 13A to 13C, each light-emitting element includes a first electrode layer 50, a layer 51, and a second electrode layer 53. The layer 51 includes at least a light-emitting layer 52.

In the light-emitting element illustrated in FIG. 13A, the layer 51 including only the light-emitting layer 52 is interposed between the first electrode layer 50 and the second electrode layer 53. The light-emitting elements illustrated in FIGS. 13B and 13C have a structure in which an insulating layer is provided between the light-emitting layer 52, and the first electrode layer 50 and the second electrode layer 53 in the light-emitting element of FIG. 13A. The light-emitting element illustrated in FIG. 13B has a structure in which an insulating layer 54 is provided between the first electrode layer 50 and the light-emitting layer 52. The light-emitting element illustrated in FIG. 13C has a structure in which an insulating layer 54a is provided between the first electrode layer 50 and the light-emitting layer 52 and an insulating layer 54b is provided between the second electrode layer 53 and the light-emitting layer 52. As described above, an insulating layer may be provided between the light-emitting layer and one of a pair of the electrode layers that sandwiches the light-emitting layer. Alternatively, an insulating layer may be provided between a light-emitting layer and one of a pair of electrode layers that sandwich the light-emitting layer and another insulating layer may be provided between the light-emitting layer and the other one of the pair of electrode layers. The insulating layer may have a single layer structure or a stacked layer structure.

In FIG. 13B, the insulating layer 54 is provided to be in contact with the first electrode layer 50; however, the order of the insulating layer and the light-emitting layer may be reversed so that the insulating layer 54 is provided to be in contact with the second electrode layer 53.

Next, a dispersion-type inorganic EL element is described. In the case of the dispersion-type inorganic EL element, particulate light-emitting materials are dispersed in a binder, so that a film-shaped light-emitting layer is formed. When particles having a desired size cannot be sufficiently obtained by a manufacturing method of a light-emitting material, the light-emitting materials may be processed into particles by crushing in a mortar or the like. The binder is a substance for fixing the particulate light-emitting materials in a dispersion state and holding the light-emitting materials in a form of a light-emitting layer. The light-emitting materials are uniformly dispersed in the light-emitting layer by the binder and are fixed.

In the case of the dispersion-type inorganic EL element, as a formation method of a light-emitting layer, a droplet-discharging method capable of selectively forming a light-emitting layer, a printing method (such as screen printing or offset printing), a coating method such as a spin coating method, a dipping method, a dispenser method, or the like can be used. Although there is no particular limitation on the film thickness of the light-emitting layer, the film thickness thereof is preferably in the range of 10 nm to 1000 nm. The ratio of the light-emitting material in the light-emitting layer containing the light-emitting material to the binder may be greater than or equal to 50 wt % and less than or equal to 80 wt %.

Figure 14A:
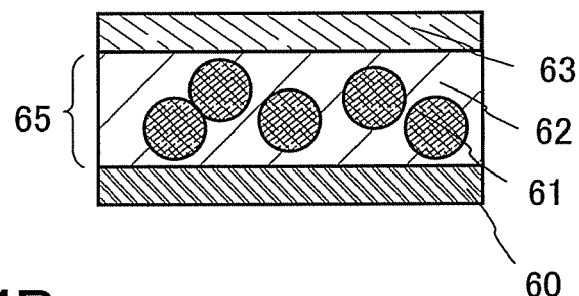
FIGS. 14A to 14C are views illustrating structures of light-emitting elements which can be applied to the present invention.
Figure 14B:
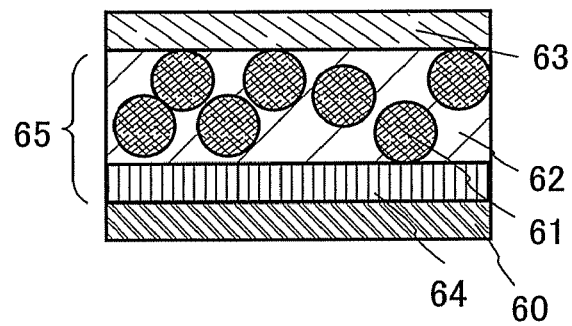
Figure 14C:
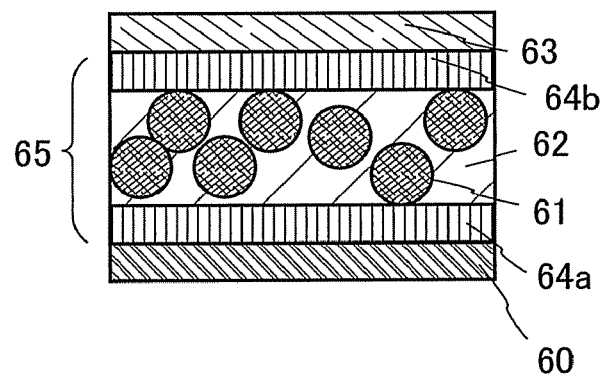

Examples of a dispersion-type inorganic EL element that can be used as a light-emitting element are illustrated in FIGS. 14A to 14C. In FIGS. 14A to 14C, each light-emitting element includes a first electrode layer 60, a layer 65, and a second electrode layer 63. The layer 65 includes at least a light-emitting layer.

The light-emitting element illustrated in FIG. 14A has a stacked layer structure of the first electrode layer 60, the light-emitting layer 62, and the second electrode layer 63. In the light-emitting layer 62, light-emitting materials 61 held by a binder are included.

As a binder that can be used in this embodiment mode, an insulating material can be used. Specifically, an organic material or an inorganic material can be used, and a mixture material of an organic material and an inorganic material may be used. As an organic material, polymer that has relatively high dielectric constant like a cyanoethyl cellulose-based resin; or a resin such as polyethylene, polypropylene, a polystyrene-based resin, a silicone resin, an epoxy resin, or vinylidene fluoride can be used. Alternatively, a heat-resistant high molecular material such as aromatic polyamide or polybenzimidazole, or a siloxane resin may be used. Note that the siloxane resin corresponds to a resin having Si—O—Si bonds. Siloxane has a skeleton structure formed from a bond of silicon (Si) and oxygen (O) and has an organic group containing at least hydrogen (for example, an alkyl group or aromatic hydrocarbon) as a substituent. Alternatively, as the substituent, a fluoro group may be used. Further alternatively, as the substituent, an organic group containing at least hydrogen, and a fluoro group may be used. A vinyl resin such as polyvinyl alcohol or polyvinyl butyral, or another resin material such as a phenol resin, a novolac resin, an acrylic resin, a melamine resin, a urethane resin, or an oxazole resin (polybenzoxazole) may also be used. A dielectric constant can also be controlled by mixing these resins with a high dielectric constant such as barium titanate ($BaTiO_3$) or strontium titanate ($SrTiO_3$) as appropriate.

As the inorganic material contained in the binder, the following can be used: materials such as silicon oxide, silicon nitride, silicon containing oxygen and nitrogen, aluminum nitride, aluminum containing oxygen and nitrogen, aluminum oxide, titanium oxide, $BaTiO_3$, $SrTiO_3$, lead titanate, potassium niobate, lead niobate, tantalum oxide, barium tantalate, lithium tantalate, yttrium oxide, zirconium oxide, and other substances containing an inorganic material. When an inorganic material having a high dielectric constant is mixed with an organic material (by addition or the like), a dielectric constant of a light-emitting layer including a light-emitting material and a binder can be further controlled and increased. A mixed layer of an inorganic material and an organic material is used for a binder, and the high dielectric constant is obtained, whereby further higher electric charge can be induced by the light-emitting material.

In the manufacturing process, the light-emitting materials are dispersed in a solution containing a binder. As a solvent of the solution containing a binder that can be used in this embodiment, it is acceptable as long as a solvent dissolves a binder material and can make a solution with the viscosity which is appropriate for a method of forming a light-emitting layer (various wet processes) and for a desired thickness. An organic solvent or the like can be used, and, for example, when a siloxane resin is used as the binder, propylene glycolmonomethyl ether, propylene glycolmonomethyl ether acetate (also referred to as PGMEA), 3-methoxy-3-methyl-1-butanol (also referred to as MMB), or the like can be used.

The light-emitting elements illustrated in FIGS. 14B and 14C have a structure in which an insulating layer is provided between the light-emitting layer 62, and the first electrode layer 60 or the second electrode layer 63 in the light-emitting element in FIG. 14A. The light-emitting element illustrated in FIG. 14B has a structure in which an insulating layer 64 is provided between the first electrode layer 60 and the light-emitting layer 62. The light-emitting element illustrated in FIG. 14C has a structure in which an insulating layer 64a is provided between the first electrode layer 60 and the light-emitting layer 62 and an insulating layer 64b is provided between the second electrode layer 63 and the light-emitting layer 62. As described above, the insulating layer may be provided between the light-emitting layer and one of a pair of electrode layers that sandwiches the light-emitting layer. Alternatively, an insulating layer may be provided between the light-emitting layer and one of a pair of electrode layers that sandwiches the light-emitting layer and another insulating layer may be provided between the light-emitting layer and the other one of the pair of electrode layers. The insulating layer may have a single layer structure or a stacked layer structure.

In FIG. 14B, the insulating layer 64 is provided to be in contact with the first electrode layer 60; however, the order of the insulating layer and the light-emitting layer may be reversed so that the insulating layer 64 is provided to be in contact with the second electrode layer 63.

Insulating layers such as the insulating layer 54 in FIGS. 13A to 13C and the insulating layer 64 in FIGS. 14A to 14C are not particularly limited; however, it is preferable that the insulating layer have high withstand voltage, be a dense film, and furthermore have a high dielectric constant. For example, the insulating layer can be formed using silicon oxide, yttrium oxide, titanium oxide, aluminum oxide, hafnium oxide, tantalum oxide, barium titanate, strontium titanate, lead titanate, silicon nitride, zirconium oxide, or the like; a mixed layer thereof; or a stacked layer containing two or more kinds of these. These insulating layers can be formed by a sputtering method, an evaporating method, a CVD method, or the like. Alternatively, the insulating layer may be formed in such a manner that particles of these insulating materials are dispersed in a binder. A binder material may be formed of a material that is similar to a binder contained in a light-emitting layer and may be formed by a similar method. Although there is no particular limitation on a film thickness of the insulating layer, the thickness thereof is preferably in the range of 10 nm to 1000 nm.

The inorganic EL elements illustrated in FIGS. 13A to 13C and 14A to 14C can obtain light emission by applying a voltage between a pair of electrode layers that sandwich the light-emitting layer; however, the light-emitting element can also operate by either DC driving or AC driving.

The light-emitting elements shown in this embodiment mode (FIGS. 12, 13A to 13C, and 14A to 14C) can be provided as a display element of a display device shown in the above embodiment modes.

Figure 11C:
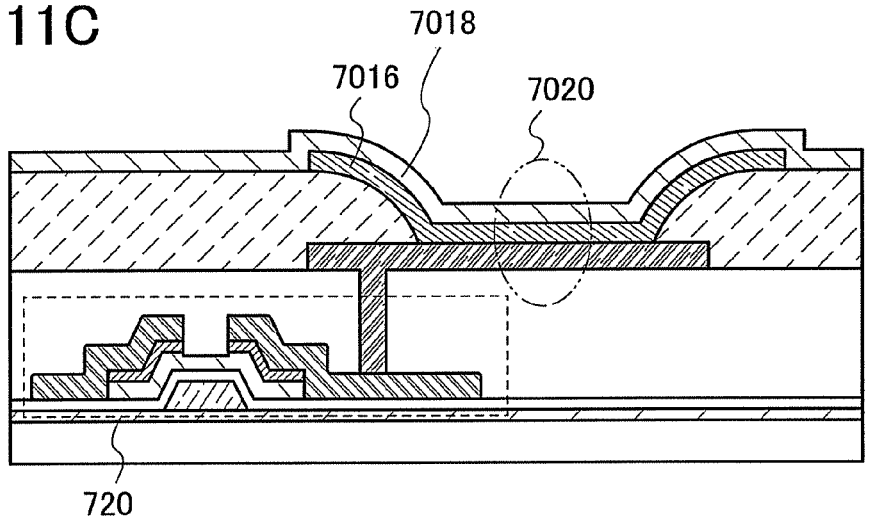

For example, in a case where the organic EL element illustrated in FIG. 12 is applied to the display device illustrated in FIGS. 11A to 11C, the first electrode layer 7012 or the second electrode layer 7018 corresponds to the first electrode layer 8270 or the second electrode layer 8250. The layer 7016 corresponds to the layer 8260. In the case of the display device illustrated in FIGS. 27A and 27B, similarly, the first electrode layer 932 or the second electrode layer 936 corresponds to the first electrode layer 8270 or the second electrode layer 8250. The layer 934 corresponds to the layer 8260.

Further, the same thing can be said for the case where the inorganic EL elements illustrated in FIGS. 13A to 13C and 14A to 14C are applied to the display device illustrated in FIGS. 11A to 11C. The first electrode layer 7012 or the second electrode layer 7018 corresponds to the first electrode layer 50 or the second electrode layer 53, or the first electrode layer 60 or the second electrode layer 63. The layer 7016 corresponds to the layer 51 or the layer 65. In the case of the display device illustrated in FIGS. 27A and 27B, similarly, the first electrode layer 932 or the second electrode layer 936 corresponds to the first electrode layer 50 or the second electrode layer 53, or the first electrode layer 60 or the second electrode layer 63. The layer 934 corresponds to the layer 51 or the layer 65.

The present invention can be applied in forming an opening for connecting the light-emitting element of this embodiment mode to a transistor or the like. In the manufacturing process of the display device having the light-emitting element, the throughput is improved by applying the present invention. In addition, mass productivity of the display device can also be improved.

This embodiment mode can be freely combined with the above Embodiment Modes 6 to 8 as appropriate.

Embodiment Mode 10

In this embodiment mode, a liquid crystal display device will be described.

Figures 29A, 29B:
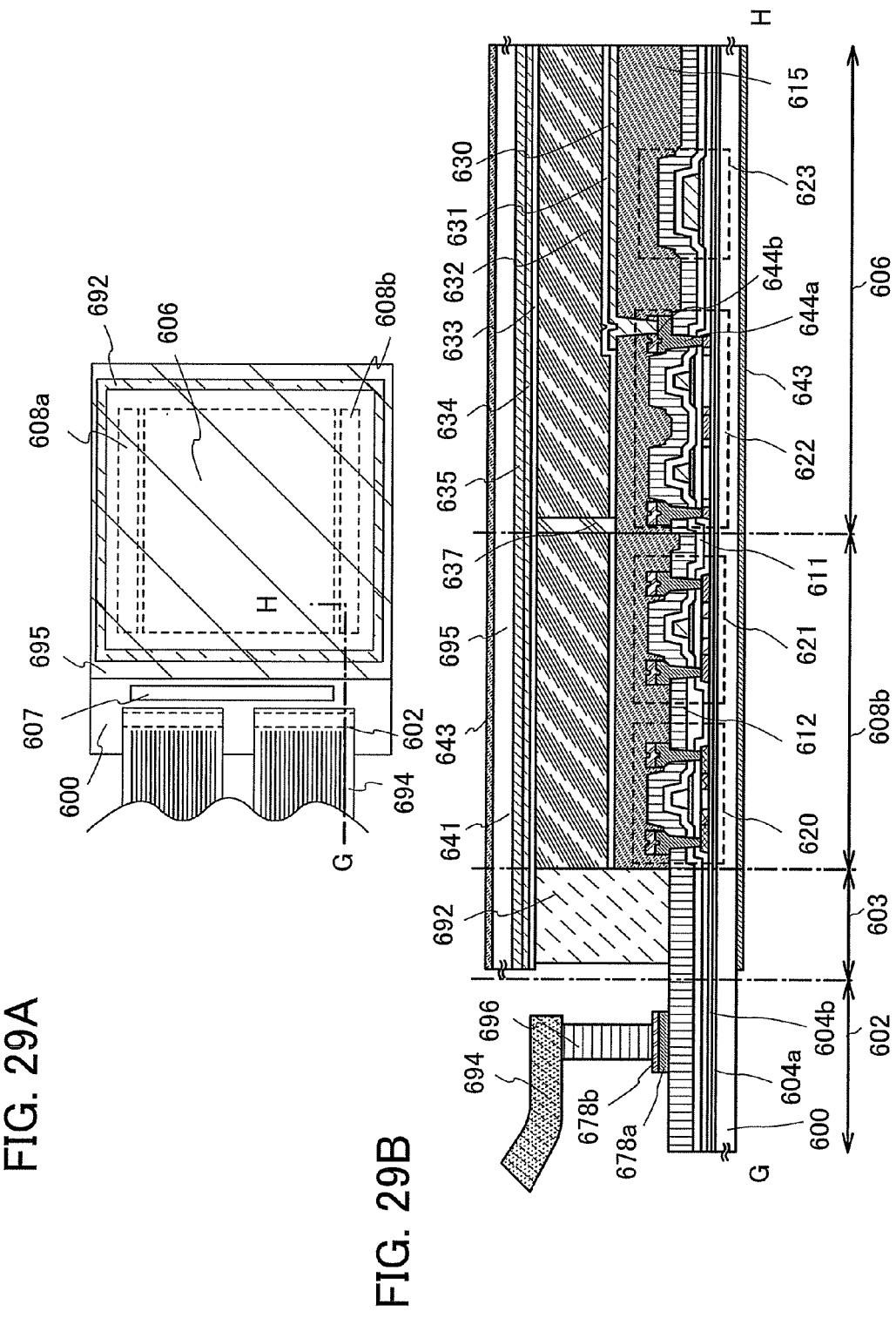
FIGS. 29A and 29B are views illustrating an example of a display device of the present invention.

FIG. 29A is a top view of a liquid crystal display device, and FIG. 29 B is a cross-sectional view of FIG. 29A taken along a line G-H.

As illustrated in FIG. 29A, a pixel region 606, a driver circuit region 608a that is a scanning line driver circuit, and a driver circuit region 608b that is a scanning line driver region are sealed between a substrate 600 and a sealing substrate 695 with a sealant 692. A driver circuit region 607 that is a signal line driver circuit formed using an IC driver is provided over the substrate 600. In the pixel region 606, a transistor 622 and a capacitor element 623 are provided, and in the driver circuit region 608b, a driver circuit including a transistor 620 and a transistor 621 is provided. A substrate similar to that in the above embodiment mode can be used as the substrate 600. There is a concern that a substrate made of a synthetic resin has lower allowable temperature limit than other substrates when being used as the substrate 600; however, the substrate made of a synthetic resin can be employed when replacement by a high heat-resistant substrate is performed after a manufacturing process.

In the pixel region 606, the transistor 622 functioning as a switching element is provided over the substrate 600 with a base insulating layer 604a and a base insulating layer 604b interposed therebetween. In this embodiment mode, the transistor 622 is a multi-gate thin film transistor, which includes a semiconductor layer including impurity regions that serve as source and drain regions, a gate insulating layer, a gate electrode layer having a stacked structure of two layers, and source electrode and drain electrode layers. The source electrode or drain electrode layer is in contact with and is electrically connected to the impurity region of the semiconductor layer and a pixel electrode layer 630.

The source electrode or drain electrode layer has a stacked layer structure. The source electrode or drain electrode layers are electrically connected to the impurity regions of the semiconductor layer in an opening formed in an insulating layer 611 and the gate insulating layer which cover the gate electrode layer.

The opening that reaches the impurity regions of the semiconductor layer can be formed by utilizing ablation by laser beam irradiation as shown in the above Embodiment Modes 1 to 6. Specifically, irradiation of a multi-mode laser beam and a single-mode laser beam is performed so that both the laser beams overlap with each other. Since the semiconductor layer can function as a light absorbing layer, ablation occurs in a region the irradiation of which is performed so that the multi-mode laser beam and the single-mode laser beam overlap with each other. Accordingly, the gate insulating layer, the insulating layer 611, and an insulating layer 612 over the semiconductor layer can be removed to form the opening.

Alternatively, the opening that reaches the impurity regions of the semiconductor layer may also be formed by forming a mask layer using a photoresist and etching processing by using the mask layer.

Source electrode or drain electrode layers 644a and 644b are electrically connected to the pixel electrode layer 630 in an opening formed in an insulating layer 615. The opening formed in the insulating layer 615 can be formed by utilizing ablation by laser beam irradiation as shown in the above Embodiment Modes t to 6. In this embodiment mode, a low-melting point metal which can be relatively easily evaporated (chromium in this embodiment mode) is used for the source electrode or drain electrode layer 644b, and a high-melting point metal which cannot be easily evaporated compared to the source electrode or drain electrode layer 644b (tungsten in this embodiment mode) is used for the source electrode or drain electrode layer 644a. Irradiation of a multi-mode laser beam and a single-mode laser beam is performed from the insulating layer 615 side so as overlap with each other. At this time, in the source electrode or drain electrode layers 644a and 644b, the irradiation of the multi-mode laser beam and the single-mode laser beam is performed so that both the laser beams overlap with each other. Synthesized energy of the multi-mode laser beam and the single-mode laser beam is absorbed by the source electrode or drain electrode layers 644a and 644b in the irradiated region so that both the laser beams overlap with each other. Ablation of the source electrode or drain electrode layers 644a and 644b occurs according to the absorbed laser beam energy, and the upper source electrode or drain electrode layer 644b and the insulating layer 615 are removed. Consequently, the opening that reaches the source electrode or drain electrode layer 644a is formed.

The pixel electrode layer 630 is formed in the opening where the source electrode or drain electrode layers 644a and 644b are exposed, so that the source electrode or drain electrode layers 644a and 644b can be electrically connected to the pixel electrode layer 630. Note that the pixel electrode layer 630 may be formed without forming an opening in the source electrode or drain electrode layer 644b.

A thin film transistor can be manufactured by various methods. For example, a crystalline semiconductor layer is formed as a semiconductor layer. A gate electrode layer is provided over the crystalline semiconductor layer with a gate insulating layer interposed therebetween. An impurity element can be added to the crystalline semiconductor layer by using the gate electrode layer as a mask. By addition of an impurity element using the gate electrode layer in such a manner, a mask layer does not need to be formed for addition of an impurity element. The gate electrode layer can have a single layer structure or a stacked layer structure. The impurity region can be formed into a high-concentration impurity region and a low-concentration impurity region by controlling the concentration thereof. A thin film transistor having a low-concentration impurity region in such a manner has a structure referred to as an LDD (Lightly Doped Drain) structure. The low-concentration impurity region can be formed to overlapped with the gate electrode, and such a thin film transistor has a structure referred to as a GOLD (Gate Overlapped LDD) structure. The thin film transistor is formed to have n-type polarity by using phosphorus (P) or the like for the impurity region. In a case of p-type polarity, boron (B) or the like may be added. After that, an insulating layer 611 and an insulating layer 612 are formed to cover the gate electrode layer and the like. Dangling bonds of the crystalline semiconductor layer can be terminated by hydrogen mixed in the insulating layer 611 (and the insulating layer 612).

In order to further improve planarity, the insulating layer 615 may be formed as an interlayer insulating layer. The insulating layer 615 can be formed using an organic insulating material or an inorganic insulating material to have a single layer structure or a stacked layer structure. For example, the insulating layer 615 can be formed of a material such as silicon oxide, silicon nitride, silicon oxynitride, silicon nitride oxide, aluminum nitride, aluminum oxynitride, aluminum nitride oxide having a higher content of nitrogen than that of oxygen, aluminum oxide, diamond-like carbon (DLC), polysilazane, nitrogen-containing carbon (CN), phosphosilicate glass (PSG), borophosphosilicate glass (BPSG), alumina, or other substances including an inorganic insulating material. Alternatively, an organic insulating material may be used; an organic material may be either photosensitive or non-photosensitive; and polyimide, acrylic, polyamide, polyimide amide, resist, benzocyclobutene, a siloxane resin, or the like can be used. Note that the siloxane resin corresponds to a resin having Si—O—Si bonds. Siloxane has a skeleton structure formed from a bond of silicon (Si) and oxygen (O). As a substituent, an organic group containing at least hydrogen (for example, an alkyl group or aromatic hydrocarbon) is used. A fluoro group may be used as the substituent. Alternatively, an organic group containing at least hydrogen and a fluoro group may be used as the substituent.

By using a crystalline semiconductor layer, the pixel region and the driver circuit region can be formed over the same substrate. In this case, the transistor in the pixel region 606 and the transistor in the driver circuit region 608*b* are formed at the same time. The transistor used in the driver circuit region 608*b* constitutes part of a CMOS circuit. Although the thin film transistor included in the CMOS circuit has a GOLD structure, it can have an LDD structure like the transistor 622.

Without limitation to this embodiment mode, the thin film transistor in the pixel region 606 may have a single-gate structure in which one channel formation region is formed, a double-gate structure in which two channel formation regions are formed, or a triple-gate structure in which three channel formation regions are formed. In addition, the thin film transistor of a peripheral driver circuit region may also have a single-gate structure, a double-gate structure, or a triple-gate structure.

Note that the present invention can be used in a top-gate structure (such as a staggered structure), a bottom-gate structure (such as an inversely staggered structure), a dual-gate structure including two gate electrode layers provided above and below a channel region each with a gate insulating film interposed therebetween, or another structure, without limitation to the formation method of a thin film transistor described in this embodiment mode.

Next, an insulating layer 631 referred to as an alignment film is formed by a printing method or a droplet-discharging method to cover the pixel electrode layer 630. Note that the insulating layer 631 can be selectively formed by using a screen printing method or an offset printing method. After that, rubbing treatment is performed. The rubbing treatment is not necessarily performed when the mode of liquid crystal is, for example, a VA mode. An insulating layer 633 functioning as an alignment film is similar to the insulating layer 631. Subsequently, the sealant 692 is formed by a droplet-discharging method in a peripheral region of the pixel region.

After that, the sealing substrate 695 provided with the insulating layer 633 functioning as an alignment film, a conductive layer 634 functioning as a counter electrode, a colored layer 635 functioning as a color filter, a polarizer 641 (also referred to as a polarizing plate), and a polarizer 642 is attached to the substrate 600 that is a TFT substrate with a spacer 637 interposed therebetween, and a liquid crystal layer 632 is provided in a gap therebetween. Since the liquid crystal display device of this embodiment mode is of transmissive type, a polarizer (polarizing plate) 643 is provided on a side of the substrate 600 opposite to the side having elements. The polarizer can be provided over the substrate using an adhesive layer. The sealant may be mixed with a filler, and further, the sealing substrate 695 may be provided with a shielding film (black matrix) or the like. Note that the color filter or the like may be formed of materials exhibiting red (R), green (G), and blue (B) when the liquid crystal display device performs full color display. When performing monochrome display, the colored layer may be omitted or formed of a material exhibiting at least one color.

Note that the color filter is not provided in some cases where light-emitting diodes (LEDs) of RGB or the like are arranged as a backlight and a successive additive color mixing method (field sequential method) in which color display is performed by time division is employed. The black matrix is preferably provided so as to overlap with a transistor and a CMOS circuit for the sake of reducing reflection of external light by wirings of the transistor and the CMOS circuit. Note that the black matrix may be provided so as to overlap with a capacitor. This is because reflection by a metal film forming the capacitor element can be prevented.

The liquid crystal layer can be formed by a dispenser method (dripping method), or an injecting method by which liquid crystal is injected using a capillary phenomenon after attaching the substrate 600 including an element to the sealing substrate 695. A dripping method is preferably employed when using a large substrate to which an injecting method is not easily applied.

Although the spacer may be provided in such a way that particles each having a size of several μm are dispersed, the spacer in this embodiment mode is formed by a method in which a resin film is formed over an entire surface of the substrate and then etched. A material of the spacer is coated by a spinner and then subjected to light exposure and development to form a predetermined pattern. Further, the material is heated at 150° C. to 200° C. in a clean oven or the like so as to be hardened. The thus manufactured spacer can have various shapes depending on the conditions of the light exposure and development. It is preferable that the spacer have a columnar shape with a flat top so that mechanical strength of the liquid crystal display device can be secured when the counter substrate is attached. The shape can be conical, pyramidal, or the like, and there is no particular limitation on the shape.

Subsequently, terminal electrode layers 678*a* and 678*b* electrically connected to the pixel region are provided with an FPC 694 that is a wiring board for connection with an anisotropic conductive layer 696 interposed therebetween. The FPC 694 functions to transmit external signals or potential. Through the above steps, a liquid crystal display device having a display function can be manufactured.

A wiring and a gate electrode layer which are included in the transistor, the pixel electrode layer 630, and the conductive layer 634 that is a counter electrode layer can be formed using a material such as indium tin oxide (ITO), indium zinc oxide (IZO) in which indium oxide is mixed with zinc oxide (ZnO), a conductive material in which indium oxide is mixed with silicon oxide, organic indium, organic tin, indium oxide containing tungsten oxide, indium zinc oxide containing tungsten oxide, indium oxide containing titanium oxide, or indium tin oxide containing titanium oxide; a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu) or silver (Ag); an alloy containing the metal as its main component; or metal nitride thereof.

A retardation film may be stacked between the polarizing plate and the liquid crystal layer.

Although a TN liquid crystal panel is shown in this embodiment mode, the above process can be similarly applied to a liquid crystal panel of another type. For example, this embodiment mode can be applied to a liquid crystal panel of a transverse electrical field type in which liquid crystal is orientated by applying an electric field parallel to a glass substrate. Further, this embodiment mode can be applied to a liquid crystal panel of a VA (Vertical Alignment) type.

Figure 17:
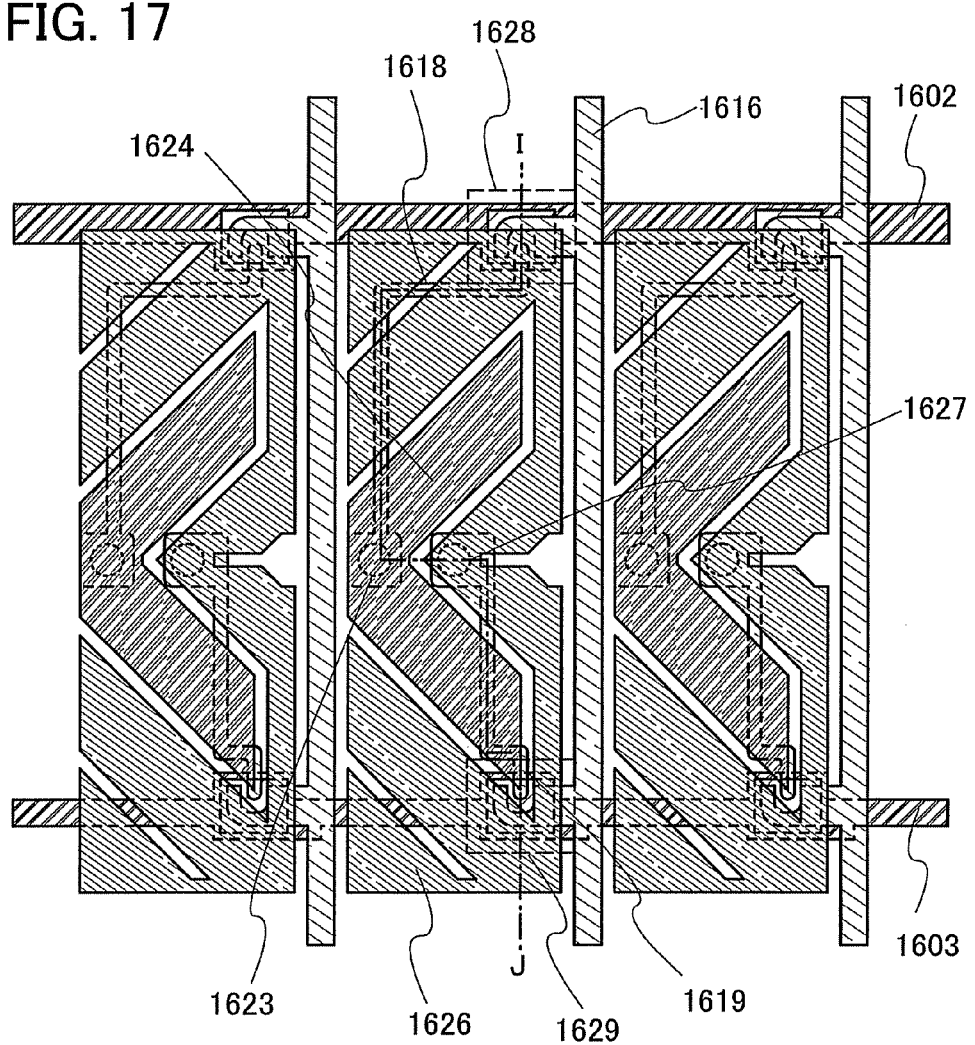
FIG. 17 is a diagram illustrating an example of a display device of the present invention.
Figure 18:
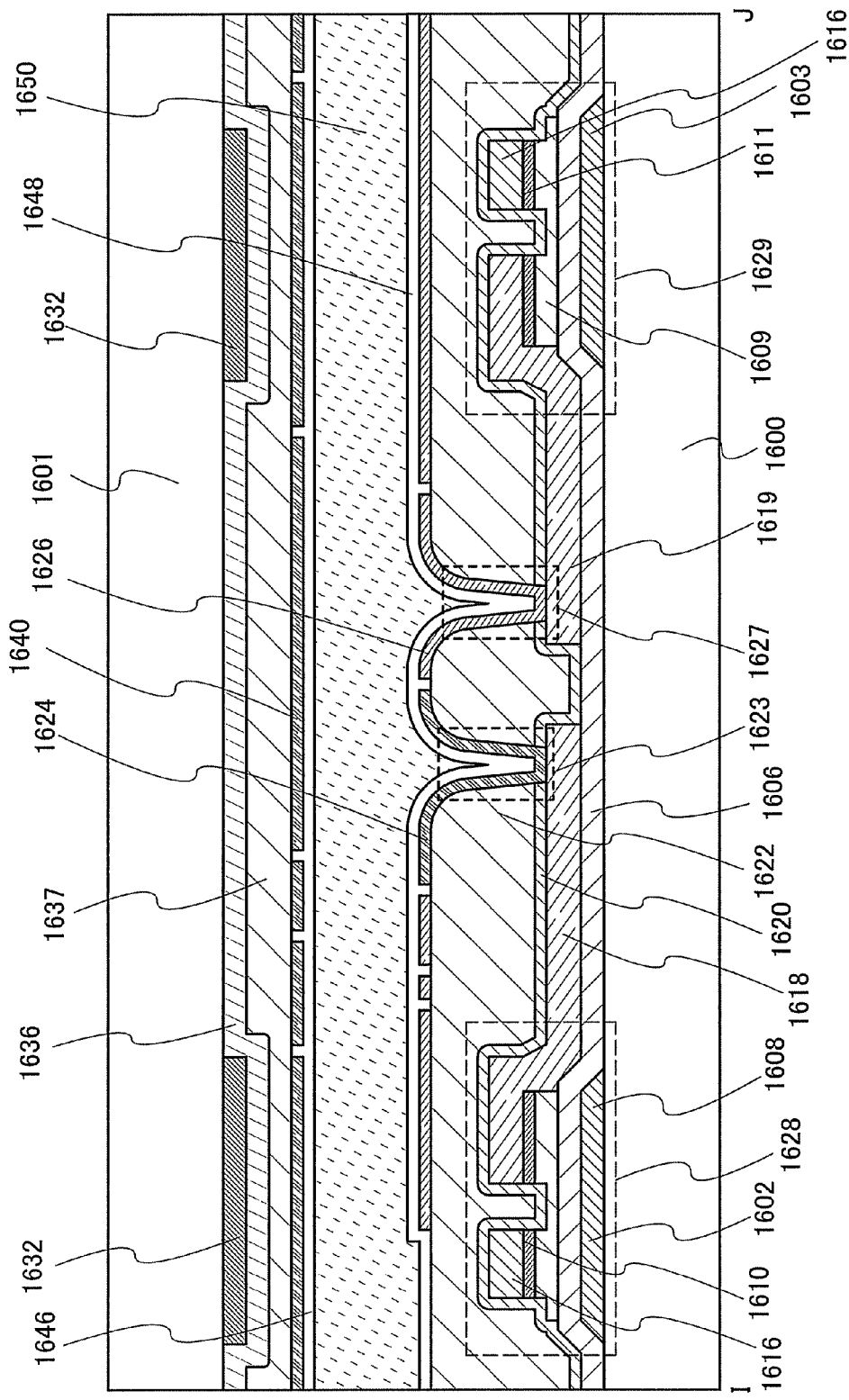
FIG. 18 is a view illustrating an example of a display device of the present invention.

FIGS. 17 and 18 illustrate a pixel structure of a VA-type liquid crystal panel. FIG. 17 is a plan view, and FIG. 18 is a cross-sectional view of a structure taken along a line I-J in FIG. 17. Hereinafter, the pixel structure is described with reference to both the drawings.

In this pixel structure, a plurality of pixel electrodes are included in one pixel, and TFTs are connected to the pixel electrodes. Each of the TFTs is driven by a different gate signal. That is, a multi-domain pixel has a structure in which signals applied to the pixel electrodes are individually controlled.

A pixel electrode layer 1624 is connected to a TFT 1628 with a wiring layer 1618 through an opening (contact hole) 1623. A pixel electrode layer 1626 is connected to a TFT 1629 with a wiring layer 1619 through an opening (contact hole) 1627. A gate wiring layer 1602 of the TFT 1628 and a gate electrode layer 1603 of the TFT 1629 are separated so that different gate signals can be supplied. On the other hand, a wiring layer 1616 functioning as a data line is used in common for the TFT 1628 and the TFT 1629.

The openings 1623 and 1627 can be formed by utilizing ablation by laser beam irradiation as shown in the above Embodiment Modes 1 to 6. Specifically, irradiation of a multi-mode laser beam and a single-mode laser beam is performed from an insulating layer 1622 side so that both the laser beams overlap with each other. The irradiation of the laser beams is performed so that the laser beams overlap with each other in the wiring layers 1618 and 1619. Synthesized energy of the multi-mode laser beam and the single-mode laser beam is absorbed by the wiring layers 1618 and 1619 in the irradiated region so that both the laser beams overlap with each other. Ablation of the wiring layers 1618 and 1619 occurs according to the absorbed laser beam energy, and an insulating layer 1620 and the insulating layer 1622 thereabove are removed. Consequently, the opening 1623 that reaches the wiring layer 1618 and the opening 1627 that reaches the wiring layer 1619 are formed.

Figure 19:
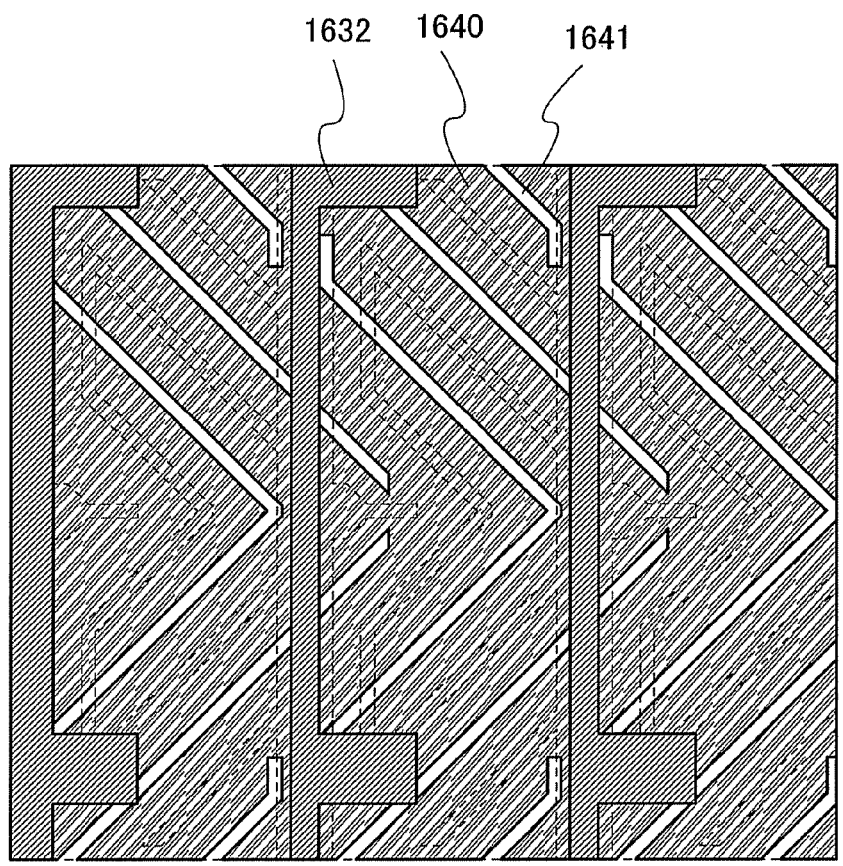
FIG. 19 is a view illustrating an example of a display device of the present invention.

The pixel electrode layer 1624 and the pixel electrode layer 1626 can be formed by being selectively etched after a conductive material is formed over the entire surface. A shape of the pixel electrode layer 1624 and a shape of the pixel electrode layer 1626 are different from each other, and those pixel electrode layers are separated by a slit 1625. The pixel electrode layer 1626 is formed so as to surround the external side of the pixel electrode layer 1624 that is spread in a V-shaped manner. Timing of voltage application is made to vary between the pixel electrode layer 1624 and the pixel electrode layer 1626 by the TFT 1628 and the TFT 1629, whereby orientation of liquid crystal is controlled. A counter substrate 1601 is provided with a light-shielding layer 1632, a colored layer 1636, and a counter electrode layer 1640. Further, a planarization layer 1637 is formed between the colored layer 1636 and the counter electrode layer 1640, whereby orientation disorder of liquid crystal is prevented. FIG. 19 illustrates a structure of the counter substrate side. Although the counter electrode layer 1640 is used in common between different pixels, a slit 1641 is formed. This slit 1641 and the slit 1625 on the side of the pixel electrode layers 1624 and 1626 are arranged to mesh alternately, so that an oblique electric field is efficiently generated, and orientation of liquid crystal can be controlled. Thus, directions in which liquid crystal is orientated can be varied depending on places, and a viewing angle is widened.

An opening can be formed in a desired region by applying the present invention without using a lithography step with a photoresist. Thus, lithography steps can be simplified and/or the number of lithography steps can be reduced, the loss of a material such as a resist material or a developing solution can be prevented, and the number of photomasks which are necessary can be reduced. Therefore, in the manufacturing process of the display device, the cost can be reduced and the throughput can be improved. In addition, a large number of openings can be formed at the same time and mass productivity of the display device can also be improved.

This embodiment mode can be freely combined with the above Embodiment Modes 1 to 6 as appropriate.

Embodiment Mode 11

In this embodiment mode, a liquid crystal display device using a liquid crystal display element as a display element will be described.

Figure 30:
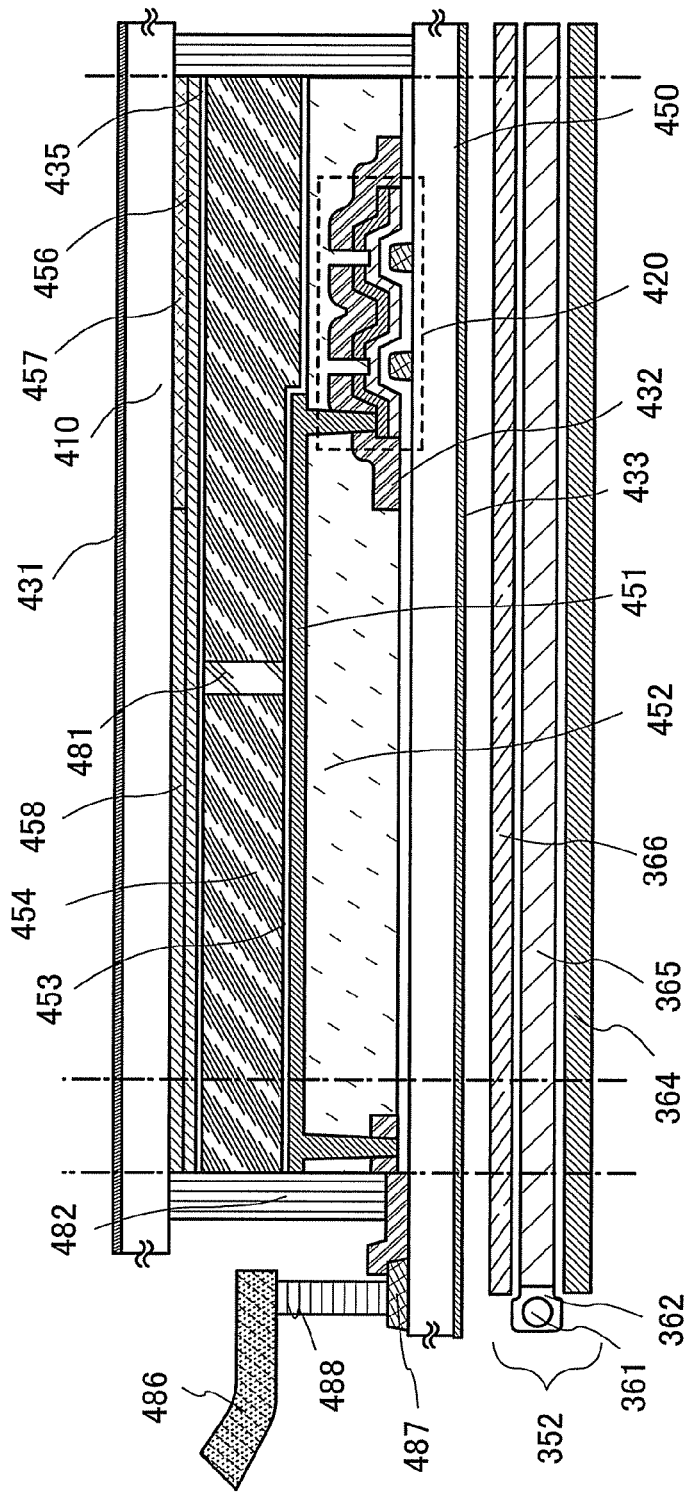
FIG. 30 is a view illustrating an example of a display device of the present invention.

In a display device illustrated in FIG. 30, the following components are provided over a substrate 450: a transistor 220 that is an inversely staggered transistor, a pixel electrode layer 451, an insulating layer 452, an insulating layer 453, a liquid crystal layer 454, a spacer 481, an insulating layer 435, a counter electrode layer 456, a color filter 458, a black matrix 457, a counter substrate 410, a polarizing plate (polarizer) 431, a polarizing plate (polarizer) 433 in a pixel region; and a sealant 482, a terminal electrode layer 487, an anisotropic conductive layer 488, and an FPC 486 in a sealing region.

A gate electrode layer, a semiconductor layer, a source electrode layer, and a drain electrode layer of the transistor 420, and the pixel electrode layer 451 formed in this embodiment mode may be formed, as shown in the above Embodiment Mode 6, 8, 10, and the like, by forming a material layer formed of a conductive material or a semiconductor material and selectively etching the material layer as appropriate.

In this embodiment mode, an amorphous semiconductor layer is used as a semiconductor layer for forming a channel. A semiconductor layer having one conductivity type provided between a source electrode or drain electrode layer and the semiconductor layer for forming a channel may be formed, if necessary. In this embodiment mode, a semiconductor layer for forming a channel and an amorphous n-type semiconductor layer as a semiconductor layer having one conductivity type are stacked. Moreover, an NMOS structure of an n-channel thin film transistor where an n-type semiconductor layer is formed as a semiconductor layer having one conductivity type, a PMOS structure of a p-channel thin film transistor where a p-type semiconductor layer is formed, or a CMOS structure of an n-channel thin film transistor and a p-channel thin film transistor can be manufactured.

In order to impart a conductivity type, an element for imparting a conductivity type is added by doping and an impurity region is formed in the semiconductor layer, so that an n-channel transistor or a p-channel transistor can be formed. Plasma treatment with a $PH_3$ gas may be performed, so that a conductivity type is imparted to the semiconductor layer.

In this embodiment mode, the transistor 220 is an n-channel inversely staggered thin film transistor. A channel protection-type inversely staggered thin film transistor can also be used, where a protective layer is provided over a channel region of a semiconductor layer.

Next, a structure of a backlight unit 352 is described. The backlight unit 352 includes a cold cathode tube, a hot cathode tube, a light-emitting diode, an inorganic EL element, or an organic EL element as a light source 361 that emits fluorescence; a lamp reflector 362 for effectively leading fluorescence to a light conducting plate 365; the light conducting plate 365 by which fluorescence is totally reflected and led to the entire surface of the display panel; a diffusing plate 366 for reducing variations in brightness; and a reflector plate 364 for reusing light leaked under the light conducting plate 365.

A control circuit for controlling the luminance of the light source 361 is connected to the backlight unit 352. The luminance of the light source 361 can be controlled by a signal supplied from the control circuit.

The source electrode or drain electrode layer of the transistor 420 is electrically connected to the pixel electrode layer 451 in an opening that is formed in the insulating layer 452. The opening can be formed utilizing ablation by laser beam irradiation as shown in the above Embodiment Modes 1 to 6. In this embodiment mode, a low-melting point metal which can be relatively easily evaporated (chromium in this embodiment mode) is used for the source electrode or drain electrode layer. Irradiation of a multi-mode laser beam and a single-mode laser beam is performed from the insulating layer 452 side so that both the laser beams overlap with each other. The irradiation is performed so that both the laser beams overlap with each other in the source electrode or drain electrode layer. Synthesized energy of the multi-mode laser beam and the single-mode laser beam is absorbed by the source electrode or drain electrode layer in a region the irradiation of which is performed so that both the laser beams overlap with each other. The source electrode or drain electrode layer, the ablation of which occurs by the absorbed energy of the laser beams, is removed along with the insulating layer 452 thereabove. Consequently, the opening that reaches the semiconductor layer having one conductivity type where the source electrode or drain electrode layer is exposed on the side surface can be formed.

The pixel electrode layer 451 is formed in the opening where the source electrode or drain electrode layer and the semiconductor layer having one conductivity are exposed; thus, the pixel electrode layer 251 can be electrically connected to the semiconductor layer having one conductivity type and the source electrode or drain electrode layer.

An opening can be formed in a desired region by applying the present invention without using a lithography step with a photoresist. Thus, lithography steps can be simplified and/or the number of lithography steps can be reduced, the manufacturing cost can be reduced, and the throughput can be improved. In addition, a large number of openings can be formed at the same time and mass productivity of the display device can also be improved.

This embodiment mode can be freely combined with the above Embodiment Modes 1 to 10 as appropriate.

Embodiment Mode 12

In this embodiment mode, an example of a display device different from that of the above embodiment mode will be described.

Figure 20:
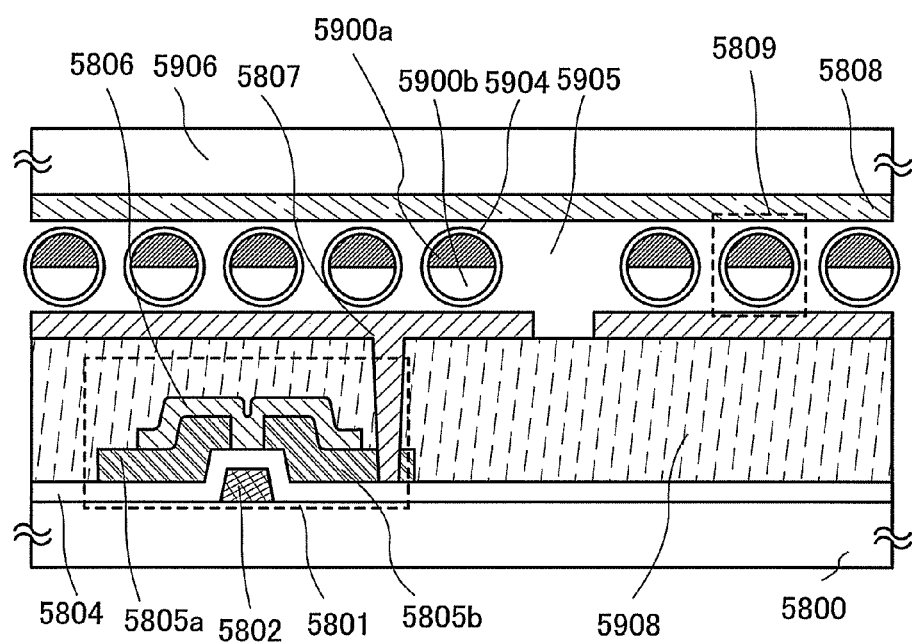
FIG. 20 is a view illustrating an example of a display device of the present invention.

FIG. 20 illustrates an active-matrix electronic paper to which the present invention is applied. Note that the active-matrix electronic paper is illustrated in FIG. 20; however, the present invention can also be applied to a passive-matrix electronic paper.

As the electronic paper, a twisting ball display system can be used. A twisting ball display system is a method in which display is performed by arranging spherical particles each of which is colored separately in black and white between a first electrode layer and a second electrode layer, and generating a potential difference between the first electrode layer and the second electrode layer so as to control the directions of the spherical particles.

A transistor 5801 is an inverted coplanar thin film transistor, which includes a gate electrode layer 5802, a gate insulating layer 5804, wiring layers 5805a and 5805b, and a semiconductor layer 5806. The wiring layers 5805a and 5805b each serve as a source electrode or drain electrode layer. In addition, the wiring layer 5805b is electrically connected to a first electrode layer 5807 through an opening formed in an insulating layer 5908. Between the first electrode layer 5807 and a second electrode layer 5808, spherical particles 5809, each of which includes a black region 5900a and a white region 5900b, and a cavity 5904 which is filled with liquid around the black region 5900a and the white region 5900b, are provided. A space around the spherical particle 5809 is filled with a filler 5905 such as a resin.

In this embodiment mode, the gate electrode layer 5802, the semiconductor layer 5806, the wiring layers 5805a and 5805b, and the like included in the transistor 5801 can be formed by forming and selectively etching as appropriate a material layer formed of a conductive material or a semiconductor material.

The wiring layer 5805b is electrically connected to the first electrode layer 5807 in the opening formed in the insulating layer 5908. The opening can be formed utilizing laser ablation by laser beam irradiation as shown in the above Embodiment Modes 1 to 6. In this embodiment mode, a low-melting point metal which can be relatively easily evaporated (chromium in this embodiment mode) is used for the wiring layer 5805b. Irradiation of a multi-mode laser beam and a single-mode laser beam is performed from the insulating layer 5908 side so that both the laser beams overlap with each other. The irradiation is performed so that both the laser beams overlap with each other in the wiring layer 5805b. Synthesized energy of the multi-mode laser beam and the single-mode laser beam is absorbed by the wiring layer 5805b in a region the irradiation of which is performed so that both the laser beams overlap with each other. The wiring layer 5850b is removed along with the insulating layer 5908 thereabove by ablation by the absorbed energy of the laser beams. Consequently, the opening where the wiring layer 5805b is exposed on the side surface can be formed. Note that the present invention is not particularly limited and the wiring layer 5805b may be left in forming the opening by ablation. Part or the entire wiring layer 5805b can be left by selecting as appropriate a conductive material for forming the wiring layer 5805b or energy of the laser beams.

The first electrode layer 5807 is formed in the opening where the wiring layer 5805b is exposed; thus, the wiring layer 5805b and the first electrode layer 5807 can be electrically connected.

By utilizing laser ablation, an opening can be formed in the insulating layer by laser beam irradiation without performing a complicated lithography step.

Instead of the twisting ball, an electrophoretic element can also be used. A microcapsule having a diameter of approximately 10 μm to 20 μm, in which a transparent liquid and positively charged white microparticles and negatively charged black microparticles are encapsulated, is used. In the microcapsule that is provided between the first electrode layer and the second electrode layer, when an electric field is applied by the first electrode layer and the second electrode layer, the white microparticles and the black microparticles migrate to opposite sides to each other, so that white or black can be displayed. A display element using this principle is an electrophoretic display element, and is referred to as an electronic paper in general. The electrophoretic display element has higher reflectivity than a liquid crystal display element; thus, an auxiliary light is unnecessary, less power is consumed, and a display portion can be recognized even in a dusky place. Even when power is not supplied to the display portion, an image which has been displayed once can be maintained. Thus, it is possible that a displayed image can be stored, even if a display device having a display function is distanced from a source of an electric wave.

Any structure is acceptable for the transistor as long as the transistor can serve as a switching element. The semiconductor layer may be formed using various semiconductors such as an amorphous semiconductor, a crystalline semiconductor, a polycrystalline semiconductor, and a microcrystalline semiconductor, or an organic transistor may also be formed using an organic compound.

Although this embodiment mode specifically shows the case where a structure of a display device is an active-matrix type, needless to say, the present invention can also be applied to a passive-matrix display device.

An opening can be formed in a desired region by applying the present invention without using a lithography step with a photoresist. Thus, lithography steps can be simplified and/or the number of lithography steps can be reduced, the manufacturing cost can be reduced, and the throughput can be improved. In addition, a large number of openings can be formed at the same time and mass productivity of the display device can also be improved.

This embodiment mode can be freely combined with the above Embodiment Modes 1 to 6 as appropriate.

Embodiment Mode 13

Next, a mode in which a driver circuit for driving is mounted on a display panel manufactured according to Embodiment Modes 1 to 6 will be described.

First, a display device employing a COG method is described with reference to FIG. 16A. A pixel portion 2701 for displaying information of characters, images, or the like is provided over a substrate 2700. A substrate provided with a plurality of driver circuits is divided into rectangles, and a driver circuit 2751 after division (also referred to as a driver IC) is mounted on the substrate 2700. FIG. 16A illustrates a mode of mounting a plurality of driver ICs 2751 and FPCs 2750 mounted on the end of the driver ICs 2751. Alternatively, the size obtained after division may be made almost equal to the length of a side of the pixel portion on a signal line side, and a tape may be mounted on the end of the single driver IC.

Alternatively, a TAB method may be employed. In this case, a plurality of tapes may be attached and driver ICs may be mounted on the tapes as illustrated in FIG. 16B. Similarly to the case of a COG method, a single driver IC may be mounted on a single tape. In this case, a metal piece or the like for fixing the driver IC may be attached together in terms of intensity.

A plurality of driver ICs to be mounted on a display panel are preferably formed over a rectangular substrate having a size of 300 mm to 1000 mm or more, or a side longer than 1000 mm for the sake of improvement in productivity.

In other words, a plurality of circuit patterns each including a driver circuit portion and an input-output terminal as a unit may be formed over the substrate and may be lastly divided to be used. In consideration of the side length of the pixel portion or the pixel pitch, the driver IC may be formed to be a rectangle having a long side of 15 mm to 80 mm and a short side of 1 mm to 6 mm. Alternatively, the driver IC may be formed to have the same side length as that of the pixel region, or a length obtained by adding a side length of the pixel portion to a side length of each driver circuit.

An advantage of the external dimension of the driver IC over an IC chip is the length of the long side. When the driver IC having a long side length of 15 mm to 80 mm is used, the number of the driver ICs necessary for being mounted in accordance with the pixel portion is less than that in the case of using an IC chip. Therefore, yield in manufacturing can be improved. When a driver IC is formed over a glass substrate, productivity is not decreased because there is no limitation on the shape of a substrate used as a base. This is a great advantage compared to the case of taking IC chips out of a circular silicon wafer.

When a scanning line driver circuit 3702 is formed in an integrated manner over a substrate as illustrated in FIG. 15B, a driver IC provided with a signal line driver circuit is mounted on a region outside a pixel portion 3701. The driver IC is a signal line driver circuit. In order to form a pixel region corresponding to RGB full color, 3072 signal lines are required for an XGA class and 4800 signal lines are required for a UXGA class. The signal lines formed in such a number are divided into several blocks at the end of the pixel portion 3701, and lead lines are formed. The signal lines are gathered corresponding to the pitch of output terminals of the driver ICs.

The driver IC is preferably formed of a crystalline semiconductor formed over a substrate. The crystalline semiconductor is preferably formed by being irradiated with a continuous wave laser beam. Therefore, a continuous wave solid-state or gas laser is used for an oscillator for generating the laser beam. There are almost no crystal defects when a continuous wave laser is used, and as a result, a transistor can be manufactured by using a polycrystalline semiconductor layer having a large grain size. In addition, high-speed driving is possible because mobility or response speed is high, and it is possible to further improve an operating frequency of an element, compared to the conventional element. Therefore, high reliability can be obtained because variation in characteristics is little. Note that the channel-length direction of the transistor and a scanning direction of a laser beam may be arranged in the same direction to further improve the operating frequency. This is because the highest mobility can be obtained when a channel length direction of a transistor and a scanning direction of a laser beam over a substrate are almost parallel to each other (preferably, greater than or equal to (30(and less than or equal to 30( ) in a step of laser crystallization with a continuous wave laser. Note that the channel length direction corresponds to a current flowing direction, in other words, a direction in which electric charge moves in a channel formation region. Thus manufactured transistor has a semiconductor layer including a polycrystalline semiconductor layer in which a crystal grain is extended in the channel direction, and this refers to that a crystal grain boundary is formed almost along the channel direction.

In order to perform laser crystallization, it is preferable to significantly narrow down the laser beam, and the shape of the laser beam (beam spot) preferably has the same width as that of a short side of the driver ICs, approximately greater than or equal to 1 mm and less than or equal to 3 mm. In addition, in order to secure an enough and effective energy density for an object to be irradiated, a region irradiated with the laser beam preferably has a linear shape. The term "linear" used herein refers to not a line in a strict sense but a rectangle or an oblong with a large aspect ratio. For example, the linear shape refers to a shape with an aspect ratio of 2 or more (preferably greater than or equal to 10 and less than or equal to 10000). Thus, by making a width of the laser beam shape (beam spot) the same length as a short side of the driver ICs, a method for manufacturing a display device, of which productivity is improved, can be provided.

As illustrated in FIGS. 16A and 16B, driver ICs may be mounted as both the scanning line driver circuit and the signal line driver circuit. In this case, it is preferable to use the driver ICs having different specifications for the scanning line driver circuit and the signal line driver circuit.

In the pixel region, the signal line and the scanning line intersect to form a matrix, and transistors are arranged corresponding to each intersection. One feature of this embodiment mode is that a TFT having an amorphous semiconductor or a semi-amorphous semiconductor as a channel portion is used as the transistor arranged in the pixel region. The amorphous semiconductor is formed by a method such as a plasma CVD method or a sputtering method. The semi-amorphous semiconductor can plasma CVD method or a sputtering method. The semi-amorphous semiconductor can be formed by a plasma CVD method at a temperature of less than or equal to 300° C. A film thickness necessary to form the transistor is formed in a short time even in the case of using, for example, a non-alkaline glass substrate having an external size of 550 mm×650 mm. The feature of such a manufacturing technique is effective for manufacturing a large-sized display device. In addition, a semi-amorphous TFT can obtain field effect mobility of 2 $cm^2/V\cdot sec$ to 10 $cm^2/V\cdot sec$ by forming a channel formation region using a SAS. Thus, a display panel in which system-on-panel is realized can be manufactured.

The scanning line driver circuit can also be formed in an integrated manner over the substrate by using a TFT having a semiconductor layer formed of a SAS. In the case of using a TFT having a semiconductor layer formed of a SAS, the driver ICs may be mounted as both the scanning line driver circuit and the signal line driver circuit.

In this case, it is preferable to use the driver ICs having different specifications for the scanning line driver circuit and the signal line driver circuit. For example, a transistor included in the scanning line driver IC is required to withstand a voltage of approximately 30 V; however, a drive frequency thereof is 100 kHz or less, and high-speed operation is not required, comparatively. Therefore, it is preferable to set a channel length (L) of the transistor included in the scanning line driver sufficiently long. On the other hand, a transistor of the signal line driver IC is required to withstand a voltage of only approximately 12 V; however, a drive frequency thereof is around 65 MHz at 3 V, and high-speed operation is required. Therefore, it is preferable to set a channel length or the like of the transistor included in a driver on a micron rule.

A method for mounting the driver IC is not particularly limited, and a COG method, a wire bonding method, or a TAB method can be employed.

When the thicknesses of the driver IC and the counter substrate are set equal to each other, a distance therebetween is almost constant, which contributes to thinning of a display device as a whole. When both substrates are formed of the same material, thermal stress is not generated and characteristics of a circuit formed of a TFT are not damaged even when a temperature change is caused in the display device. Besides, the number of the driver ICs to be mounted on one pixel region can be reduced by mounting longer driver ICs than IC chips as driver circuits as described in this embodiment mode.

In this manner, a driver circuit can be incorporated in a display panel.

Embodiment Mode 14

As for a display panel (an EL display panel or a liquid crystal display panel) manufactured according to Embodiment Modes 6 to 13, an example will be shown, in which a semiconductor layer is formed of an amorphous semiconductor or a SAS, and a scanning line driver circuit is formed over a substrate.

Figure 22:
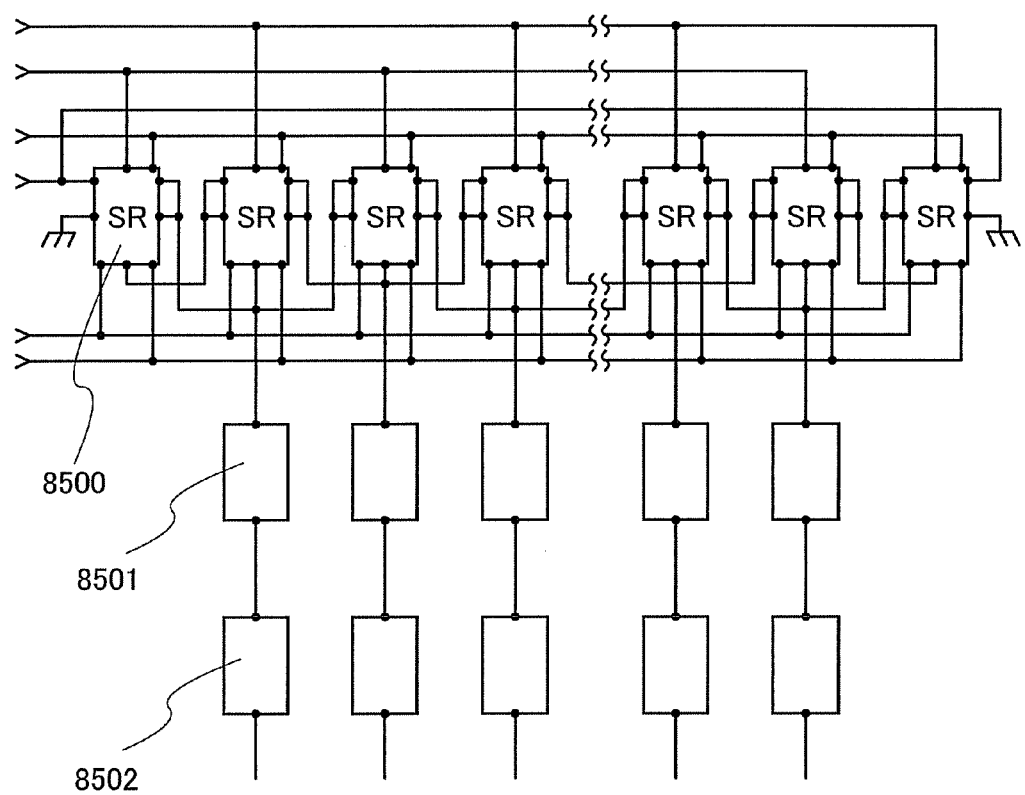
FIG. 22 is a diagram illustrating an example of a circuit configuration of a display device of the present invention.

FIG. 22 is a block diagram of a scanning line driver circuit that includes an n-channel TFT using a SAS in which a field-effect mobility of 1 $cm^2/V\cdot sec$ to 15 $cm^2/V\cdot sec$ can be obtained.

In FIG. 22, a block denoted by reference numeral 8500 corresponds to a pulse-output circuit that outputs a sampling pulse for one stage, and a shift register includes n pieces of pulse-output circuits. Reference numeral 8501 denotes a buffer circuit, and a pixel 8502 is connected to the end thereof.

Figure 23:
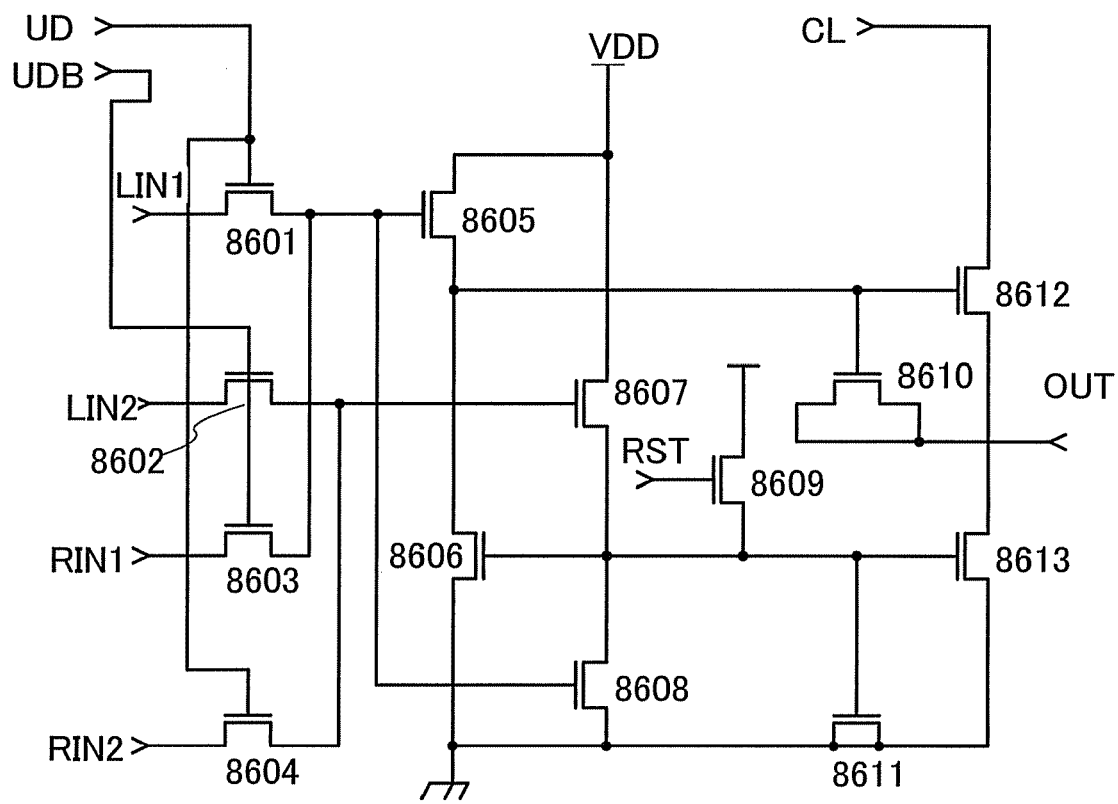
FIG. 23 is a diagram illustrating an example of a circuit configuration of a display device of the present invention.

FIG. 23 illustrates a specific structure of the pulse-output circuit 8500, which includes n-channel TFTs 8601 to 8613. At this point, a size of the TFTs may be determined in consideration of operation characteristics of the n-channel TFTs using a SAS. For example, when the channel length is 8 μm, the channel width can be set in the range of 10 μm to 80 μm.

Figure 24:
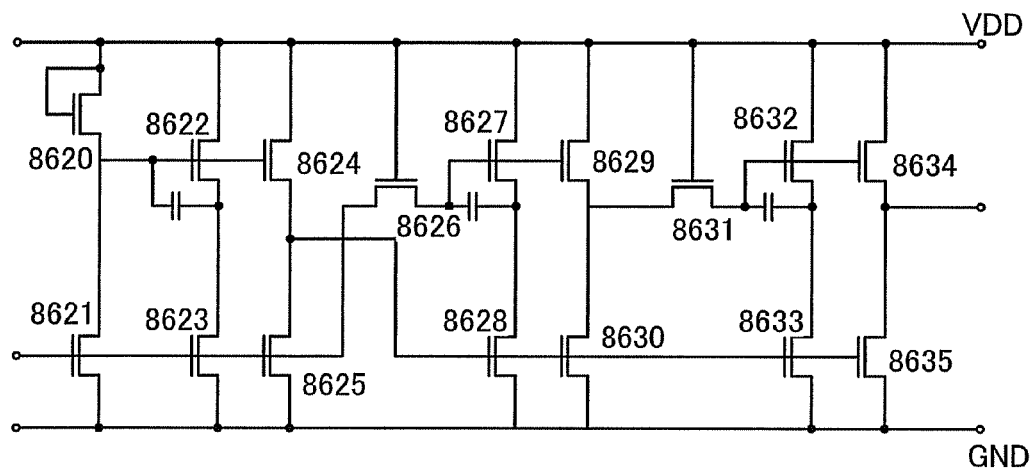
FIG. 24 is a diagram illustrating an example of a circuit configuration of a display device of the present invention.

Furthermore, a specific structure of the buffer circuit 8501 is illustrated in FIG. 24. Similarly, the buffer circuit includes n-channel TFTs 8620 to 8635. At this point, a size of the TFTs may be determined in consideration of operation characteristics of the n-channel TFTs using a SAS. For example, when the channel length is 10 μm, the channel width is to be set in the range of 10 μm to 1800 μm.

In order to realize such a circuit, it is necessary to connect the TFTs with one another by a wiring.

In such a manner, a driver circuit can be incorporated in a display panel.

Embodiment Mode 15

Figure 28:
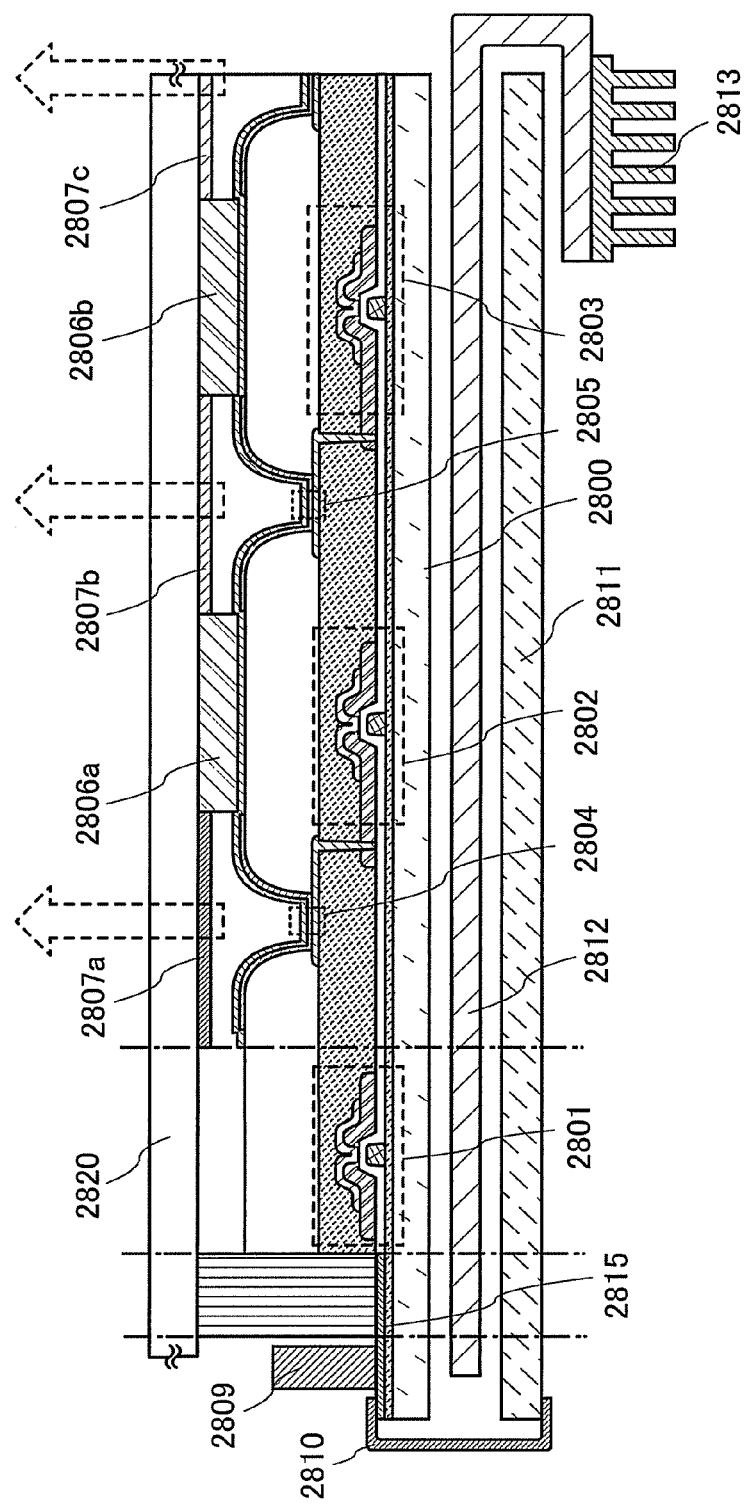
FIG. 28 is a view illustrating a structural example of a display module of the present invention.

This embodiment mode will be described with reference to FIG. 28. FIG. 28 illustrates an example in which an EL display module is formed using a TFT substrate 2800 manufactured by applying the present invention. In FIG. 28, a pixel portion including pixels is formed over the TFT substrate 2800.

In FIG. 28, a TFT that has a similar structure to that formed in the pixel, or a protective circuit portion 2801 is provided between a driver circuit and the pixel, outside the pixel portion. The protective circuit portion 2801 operates in a similar manner to a diode by connecting either a source electrode layer or a drain electrode layer to a gate electrode layer of the TFT similar to that formed in the pixel. A driver IC formed of a single crystalline semiconductor, a stick driver IC formed of a polycrystalline semiconductor layer over a glass substrate, a driver circuit formed of a SAS, or the like is applied to a driver circuit 2809.

The TFT substrate 2800 is fixed to a sealing substrate 2820 with spacers 2806a and 2806b formed by a droplet-discharging method interposed therebetween. The spacers are preferably provided to keep a distance between two substrates constant even when the substrate is thin or an area of the pixel portion is enlarged. A space between the TFT substrate 2800 and the sealing substrate 2820 over light-emitting elements 2804 and 2805 connected to TFTs 2802 and 2803 respectively may be filled with a resin material having a light-transmitting property at least to light of a visible region and may be solidified, or may be filled with anhydrous nitrogen or an inert gas.

FIG. 28 illustrates the case where the light-emitting elements 2804 and 2805 have a top-emission structure, in which light is emitted in the direction of arrows illustrated in the drawing. Multicolor display can be performed by making the pixels emit light of different colors of red, green, and blue. At this time, color purity of the light emitted to an external portion can be improved by forming colored layers 2807a, 2807b, and 2807c corresponding to respective colors on the sealing substrate 2820 side. Moreover, pixels that emit white light may be used and may be combined with the colored layers 2807a, 2807b, and 2807c.

The driver circuit 2809 that is an external circuit is connected by a wiring board 2810 to a scanning line or signal line connection terminal that is provided at one end of an external circuit substrate 2811. In addition, a heat pipe 2813 that is a high-efficiency heat conduction device having a pipe-like shape and a heat sink 2812, each of which is used for conducting heat to the outside of the device, may be provided in contact with or adjacent to the TFT substrate 2800 to enhance a heat dissipation effect.

Note that FIG. 28 illustrates the top-emission EL display module; however, a bottom emission structure may be employed by changing the structure of the light-emitting element or the position of the external circuit board. Alternatively, a dual emission structure in which light is emitted from both the top and bottom surfaces may be used. In the case of the top emission structure, the insulating layer serving as a partition may be colored and used as a black matrix. This partition can be formed by a droplet-discharging method and it may be formed by mixing a black resin of a pigment material, carbon black, or the like into a resin material such as polyimide. A stacked layer thereof may alternatively be used.

In addition, in the EL display module, reflected light of light that is incident from an external portion may be blocked by using a retardation film or a polarizing plate. In a top-emission display device, an insulating layer serving as a partition may be colored and used as a black matrix. This partition can be formed by a droplet-discharging method. Carbon black or the like may be mixed into a black resin of a pigment material or a resin material such as polyimide, and a stacked layer thereof may also be used. By a droplet-discharging method, different materials may be discharged to the same region plural times to form the partition. A quarter-wave plate or a half-wave plate may be used as the retardation film and may be designed to be able to control light. As the structure, a TFT element substrate, the light-emitting element, the sealing substrate (sealant), the retardation film (quarter-wave plate or a half-wave plate), and the polarizing plate are sequentially stacked, through which light emitted from the light-emitting element is transmitted and emitted to an external portion from the polarizing plate side. The retardation film or polarizing plate may be provided on a side where light is emitted or may be provided on both sides in the case of a dual emission display device in which light is emitted from the both surfaces. In addition, an anti-reflection film may be provided on the outer side of the polarizing plate. Accordingly, a higher-definition and accurate image can be displayed.

A resin film may be attached to the side of the TFT substrate 2800 where the pixel portion is formed, with the use of a sealant or an adhesive resin, to form a sealing structure. Although glass sealing using a glass substrate is used in this embodiment mode, various sealing methods such as resin sealing using a resin, plastic sealing using plastics, and film sealing using a film can be used. A gas barrier film that prevents water vapor from penetrating the resin film is preferably provided over the surface of the resin film. By employing a film sealing structure, further reduction in thickness and weight can be achieved.

In a display device provided with a TFT substrate or the like manufactured by the present invention, part of the process is simplified, and the throughput in the manufacture is improved. Therefore, a display module can be manufactured with high productivity.

This embodiment mode can be freely combined with the above Embodiment Modes 1 to 9, 13, and 14 as appropriate.

Embodiment Mode 16

Figure 31A:
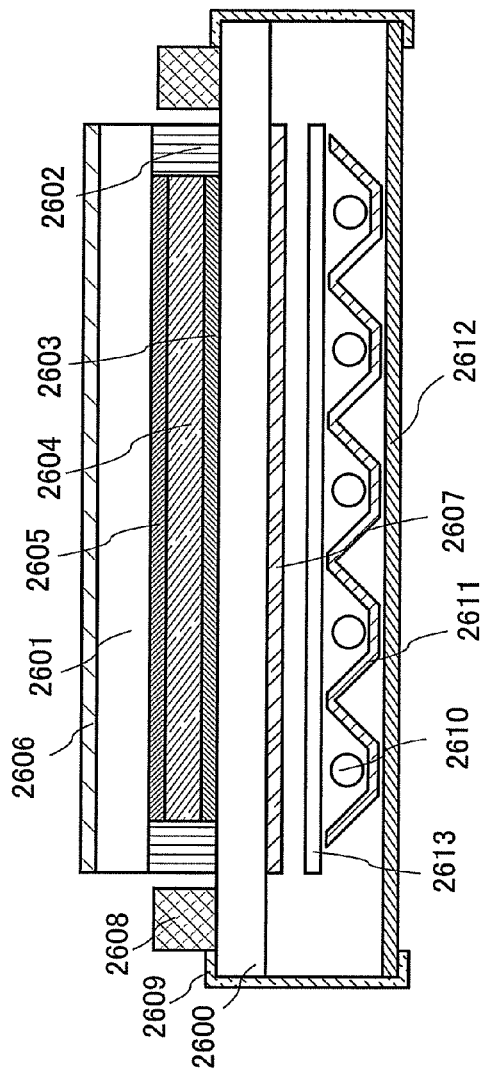
FIGS. 31A and 31B are views each illustrating a structural example of a display module of the present invention.
Figure 31B:
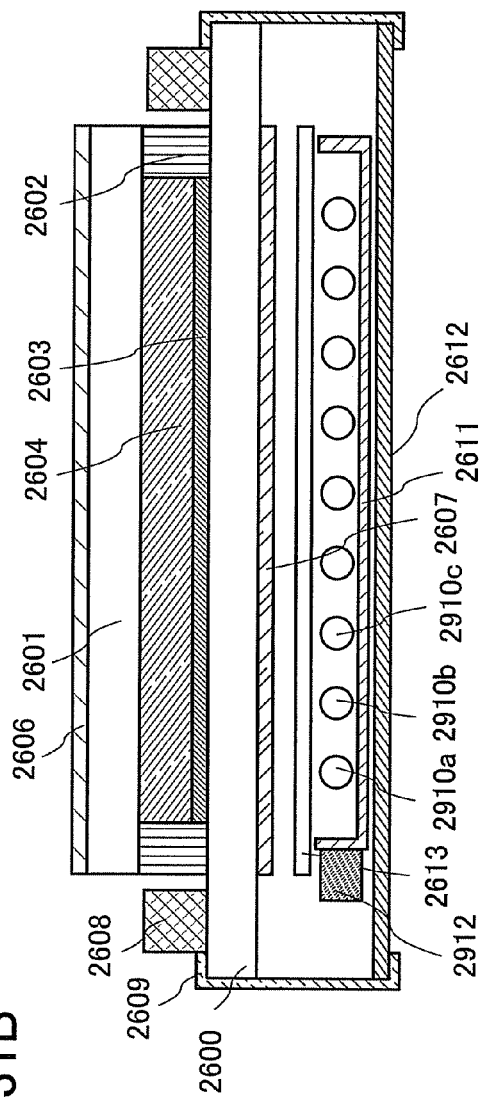

This embodiment mode will be described with reference to FIGS. 31A and 31B. FIGS. 31A and 31B illustrate an example of forming a liquid crystal display module by using a TFT substrate 2600 manufactured by the present invention.

FIG. 31A illustrates an example of a liquid crystal display module, in which the TFT substrate 2600 and a counter substrate 2601 are fixed to each other with a sealant 2602, and a pixel portion 2603 and a liquid crystal layer 2604 are provided therebetween to form a display region. A colored layer 2605 is necessary to perform color display. In the case of the RGB system, respective colored layers corresponding to colors of red, green, and blue are provided for respective pixels. The outer sides of the TFT substrate 2600 and the counter substrate 2601 are provided with polarizing plates 2606 and 2607, and a diffusing plate 2613. A light source includes a cold cathode tube 2610 and a reflector plate 2611. A circuit board 2612 is connected to the TFT substrate 2600 by a flexible wiring board 2609. External circuits such as a control circuit and a power supply circuit are incorporated in the circuit board 2612. The polarizing plate and the liquid crystal layer may be stacked with a retardation film interposed therebetween.

As the liquid crystal display module, the following can be used: a TN (Twisted Nematic) mode, an IPS (In-Plane-Switching) mode, an FFS (Fringe Field Switching) mode, an MVA (Multi-domain Vertical Alignment) mode, a PVA (Patterned Vertical Alignment) mode, an ASM (Axially Symmetric aligned Micro-cell) mode, an OCB (Optical Compensated Birefringence) mode, an FLC (Ferroelectric Liquid Crystal) mode, an AFLC (Anti Ferroelectric Liquid Crystal) mode, or the like.

FIG. 31B illustrates an example of applying an OCB mode to the liquid crystal display module of FIG. 31A, so that this liquid crystal display module is an FS-LCD (Field Sequential-LCD). The FS-LCD performs red, green, and blue light emissions in one frame period. Color display can be performed by composing an image by a time division method. In addition, emission of each color is performed using a light-emitting diode, a cold cathode tube, or the like; hence, a color filter is not needed. Thus, there is no necessity for arranging color filters of three primary colors and limiting a display region of each color. Display of all three colors can be performed in any region. On the other hand, light emission of three colors is performed in one frame period; therefore, high-speed response of liquid crystal is needed. When an FLC mode using an FS system and the OCB mode are applied to the display device of the present invention, a display device or a liquid crystal television device having higher performance and high image quality can be completed.

A liquid crystal layer of the OCB mode has a so-called π cell structure. In the π cell structure, liquid crystal molecules are orientated such that pretilt angles of the molecules are symmetrical with respect to the center plane between the active matrix substrate and the counter substrate. The orientation in the at cell structure is a splay orientation when a voltage is not applied between the substrates, and shifts into a bend orientation when the voltage is applied. White display is performed in this bend orientation. Further voltage application makes the liquid crystal molecules in the bend orientation orient perpendicular to the substrates, which does not allow light to pass therethrough. Note that a response speed approximately ten times as high as that of a conventional TN mode can be achieved by using the OCB mode.

Further, as a mode corresponding to the FS system, an HV (Half V)-FLC, an SS (Surface Stabilized)-FLC, or the like using a ferroelectric liquid crystal (FLC) that can operate at high speed can also be used. A nematic liquid crystal that has relatively low viscosity can be used for the OCB mode. A smectic liquid crystal that has a ferroelectric phase can be used for the HV-FLC or the SS-FLC.

An optical response speed of the liquid crystal display module is increased by narrowing a cell gap of the liquid crystal display module. Alternatively, the optical response speed can be increased by lowering the viscosity of the liquid crystal material. The above method of increasing the optical response speed is more effective when a pixel pitch of a pixel region of a TN-mode liquid crystal display module is less than or equal to 30 μm. The optical response speed can be further increased by an overdrive method in which an applied voltage is increased (or decreased) only for a moment.

The liquid crystal display module of FIG. 31B is a transmissive liquid crystal display module, in which a red light source 2910a, a green light source 2910b, and a blue light source 2910c are provided as light sources. A control portion 2912 is provided in the liquid crystal display module to separately control the red light source 2910a, the green light source 2910b, and the blue light source 2910c to be turned on or off. The light emission of each color is controlled by the control portion 2912, and light enters the liquid crystal to compose an image using the time division; therefore, color display is performed.

In the liquid crystal display module described above, an opening for connecting the TFT substrate, the pixel portion, and the like can be formed. Therefore, since part of the process can be simplified and the throughput is improved, the liquid crystal display module can be manufactured with high productivity. Further, since the number of lithography steps with a photoresist can be reduced, a highly reliable liquid crystal display module can be manufactured.

This embodiment mode can be freely combined with the above Embodiment Modes 1 to 7 and 10 to 14 as appropriate.

Embodiment Mode 17

Figure 21:
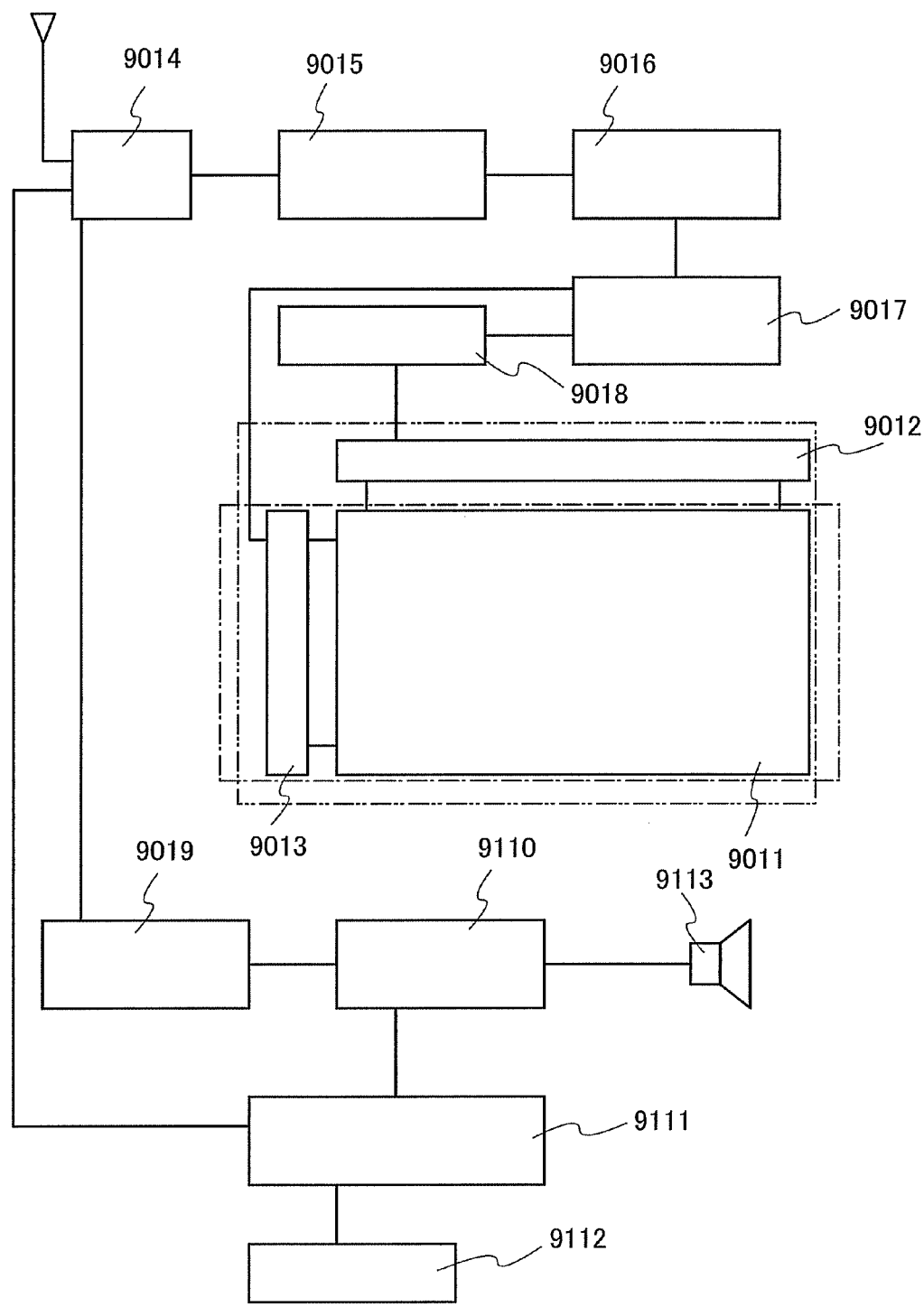
FIG. 21 is a block diagram illustrating a main structure of an electronic device to which the present invention is applied.

With the display device formed by the present invention, a television device (also referred to as simply a television, or a television receiver) can be completed. FIG. 21 is a block diagram illustrating main components of the television device.

FIG. 15A corresponds to a top view illustrating a structure of a display panel of the television device illustrated in FIG. 21. A pixel portion 2701 in which pixels 2702 are arranged in matrix, a scanning line input terminal 2703, and a signal line input terminal 2704 are formed over a substrate 2700 having an insulating surface. The number of pixels may be determined according to various standards. In a case of XGA full-color display using RGB, the number of pixels may be 1024×768×3 (RGB). In a case of UXGA full-color display using RGB, the number of pixels may be 1600×1200×3 (RGB), and in a case of full-spec high-definition and full-color display using RGB, the number of pixels may be 1920×1080×3 (RGB).

The pixels 2702 are formed in matrix by intersections of scanning lines extended from the scanning line input terminal 2703 and signal lines extended from the signal line input terminal 2704. Each pixel 2702 in the pixel portion 2701 is provided with a switching element and a pixel electrode layer connected thereto. A typical example of the switching element is a TFT. A gate electrode layer of the TFT is connected to the scanning line, and a source or a drain of the TFT is connected to the signal line, which enables each pixel to be independently controlled by a signal inputted from an external portion.

FIG. 15A illustrates a structure of a display panel in which a signal to be inputted to the scanning line and the signal line is controlled by an external driver circuit. Alternatively, a driver IC 2751 may be mounted on the substrate 2700 by a COG (Chip On Glass) method as illustrated in FIG. 16A. As another mounting mode, a TAB (Tape Automated Bonding) method may be used as illustrated in FIG. 16B. The driver IC may be formed over a single crystalline semiconductor substrate or may be formed using a TFT over a glass substrate. In each of FIGS. 16A and 16B, the driver IC 2751 is connected to an FPC (Flexible Printed Circuit) 2750.

When a TFT provided in a pixel is formed of a crystalline semiconductor, a scanning line driver circuit 3702 can also be formed over a substrate 3700 as illustrated in FIG. 15B. In FIG. 15B, a pixel portion 3701 is controlled by an external driver circuit connected to a signal line input terminal 3704, similarly to FIG. 15A. When the TFT provided in a pixel is formed of a polycrystalline (microcrystalline) semiconductor, a single crystalline semiconductor, or the like having high mobility, a pixel portion 4701, a scanning line driver circuit 4702, and a signal line driver circuit 4704 can all be formed over a substrate 4700 as illustrated in FIG. 15C.

As a structure of the display panel of the television device illustrated in FIG. 21, there are the following cases: a case in which only a pixel portion 9011 is formed over a substrate, and a scanning line driver circuit 9013 and a signal line driver circuit 9012 are mounted by a TAB method as illustrated in FIG. 16B; a case in which the pixel portion 9011 is formed, and the scanning line driver circuit 9013 and the signal line driver circuit 9012 are mounted by a COG method as illustrated in FIG. 16A; a case in which the pixel portion 9011 and the scanning line driver circuit 9013 are formed of TFTs over a substrate as illustrated in FIG. 15B, and the signal line driver circuit 9012 is separately mounted as a driver IC; a case in which the pixel portion 9011, the signal line driver circuit 9012, and the scanning line driver circuit 9013 are formed over a substrate as illustrated in FIG. 15C; and the like. However, the display panel may have any structures.

In FIG. 21, as a structure of another external circuit, a video signal amplifier circuit 9015 that amplifies a video signal among signals received by a tuner 9014; a video signal processing circuit 9016 that converts the signals outputted from the video signal amplifier circuit 9015 into chrominance signals corresponding to respective colors of red, green, and blue; a control circuit 9017 that converts the video signal into an input specification of the driver IC; and the like are provided on an input side of the video signal. The control circuit 9017 outputs signals to both a scanning line side and a signal line side. In a case of digital driving, a signal dividing circuit 9018 may be provided on the signal line side and an input digital signal may be divided into m pieces and supplied.

An audio signal among signals received by the tuner 9014 is transmitted to an audio signal amplifier circuit 9019 and the output is supplied to a speaker 9113 through an audio signal processing circuit 9110. A control circuit 9111 receives control information of a receiving station (reception frequency) or sound volume from an input portion 9112 and transmits signals to the tuner 9014 and the audio signal processing circuit 9110.

Figure 25A:
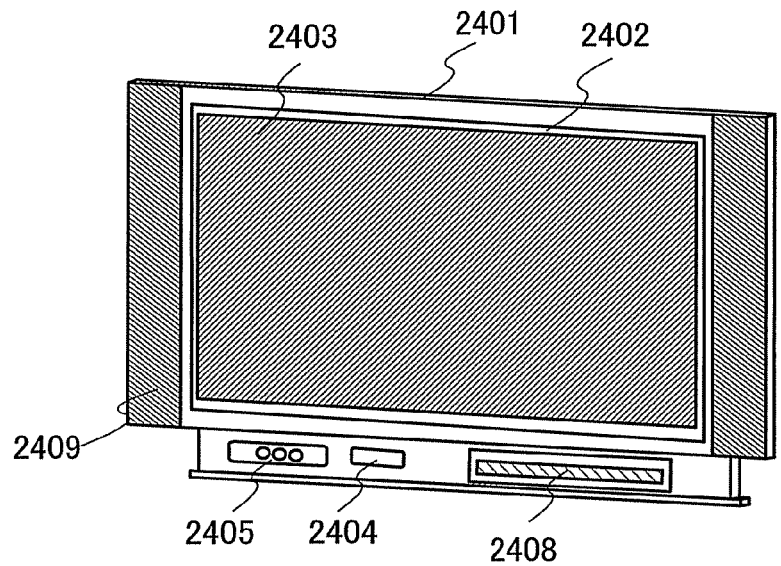
FIGS. 25A and 25B are views each illustrating an example of an electronic device to which the present invention is applied.
Figure 25A:
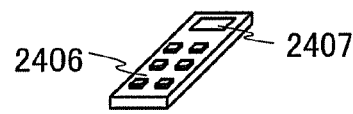
Figure 25B:
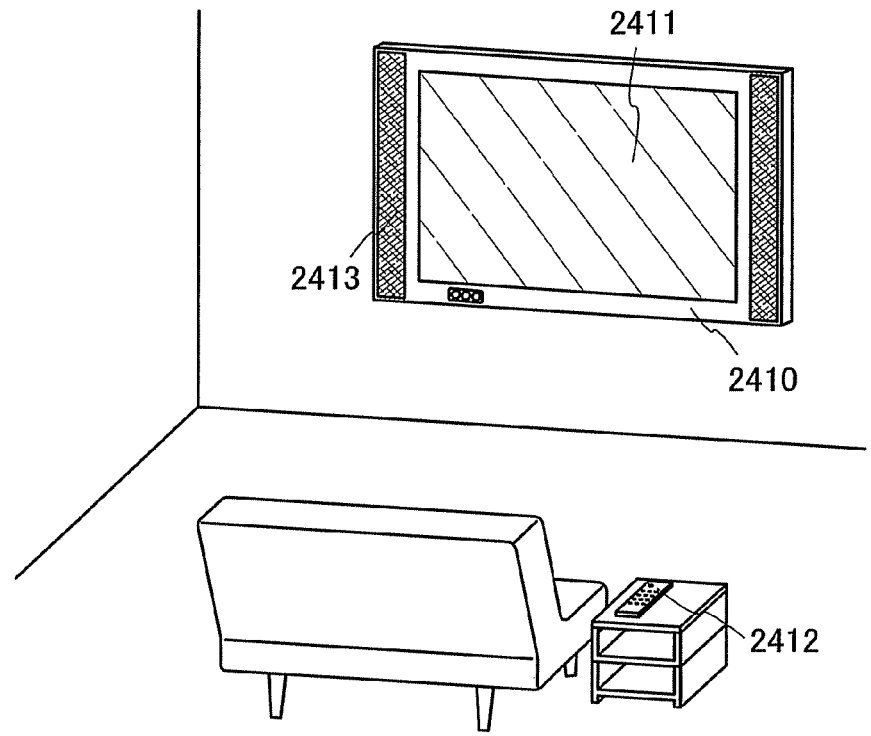

A television device can be completed by incorporating the display module into a casing as illustrated in FIGS. 25A and 25B. When a liquid crystal display module is used as a display module, a liquid crystal television device can be manufactured. When an EL module is used, an EL television device can be manufactured. Alternatively, a plasma television, electronic paper, or the like can be manufactured. In FIG. 25A, a main screen 2403 is formed by using the display module, and a speaker portion 2409, an operation switch, and the like are provided as its accessory equipment. Thus, a television device can be completed according to the present invention.

In FIG. 25A, a display panel 2402 is incorporated in a casing 2401, and general TV broadcast can be received by a receiver 2405. When the display panel is connected to a communication network by wired or wireless connections via a modem 2404, one-way (from a sender to a receiver) or two-way (between a sender and a receiver or between receivers) information communication can be performed. The television device can be operated by using a switch built in the casing 2401 or a remote control unit 2406 that is separately formed. A display portion 2407 for displaying output information may also be provided in the remote control device 2406.

Further, the television device may include a sub screen 2408 formed using a second display panel so as to display channels, volume, or the like, in addition to the main screen 2403. In this structure, both the main screen 2403 and the sub screen 2408 can be formed using the liquid crystal display panel of the present invention. Alternatively, the main screen 2403 may be formed using an EL display panel superior in a wide viewing angle, and the sub screen 2408 may be formed using a liquid crystal display panel capable of displaying images with less power consumption. In order to reduce the power consumption preferentially, the main screen 2403 may be formed using a liquid crystal display panel, and the sub screen may be formed using an EL display panel, which can be switched on and off. With the use of the present invention, a display device can be manufactured with high productivity even when a large-sized substrate is used and a large number of TFTs or electronic components are used.

FIG. 25B illustrates a television device having a large-sized display portion, for example, a 20-inch to 80-inch display portion. The television device includes a casing 2410, a display portion 2411, a remote control device 2412 that is an operation portion, a speaker portion 2413, and the like. The present invention is applied to manufacture of the display portion 2411. Since the television device in FIG. 25B is a wall-hanging type, it is not necessary to have a large installation space.

Needless to say, the present invention is not limited to the television device, and can be applied to various use applications as a large-sized display medium such as an information display board at a train station, an airport, or the like, or an advertisement display board on the street, as well as a monitor of a personal computer.

An opening or the like for connecting a TFT and a pixel of a display device can be formed by applying the present invention. Consequently, since the display device can be manufactured through a simplified process, it is possible to manufacture the display device with high productivity.

This embodiment mode can be freely combined with the above Embodiment Modes 1 to 16 as appropriate.

Embodiment Mode 18

Examples of electronic devices according to the present invention are as follows: television devices (also referred to as simply a television, or a television receiver), cameras such as digital cameras and digital video cameras, cellular telephone devices (also referred to as simply a cellular phone, or a cell-phone), portable information terminals such as PDA, portable game machines, computer monitors, computers, audio reproducing devices such as a car audio, image reproducing devices including a recording medium, such as a home-use game machine, and the like. Specific examples thereof will be described with reference to FIGS. 26A to 26E.

Figure 26A:
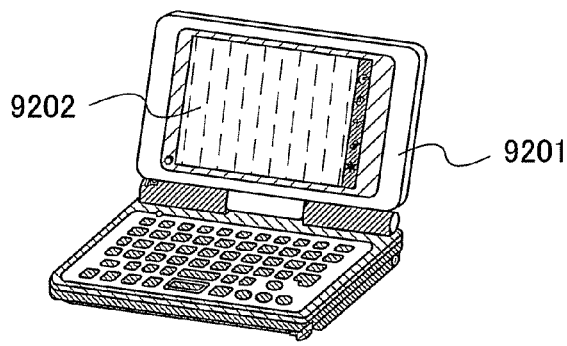
FIGS. 26A to 26E are views each illustrating an example of an electronic device to which the present invention is applied.

A portable information terminal device illustrated in FIG. 26A includes a main body 9201, a display portion 9202, and the like. A display device of the present invention can be applied to the display portion 9202. Consequently, a portable information terminal device can be manufactured through a simplified process, whereby it can be manufactured with high productivity.

Figure 26B:
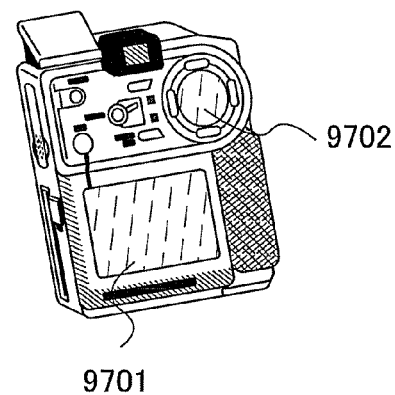

A digital video camera illustrated in FIG. 26B includes a display portion 9701, a display portion 9702, and the like. A display device of the present invention can be applied to the display portion 9701. Consequently, a digital video camera can be manufactured through a simplified process, whereby it can be manufactured with high productivity.

Figure 26C:
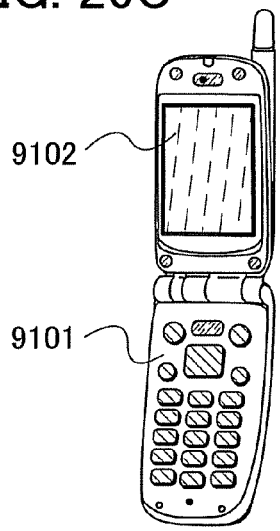

A cellular phone illustrated in FIG. 26C includes a main body 9101, a display portion 9102, and the like. A display device of the present invention can be applied to the display portion 9102. Consequently, a cellular phone can be manufactured through a simplified process, whereby it can be manufactured with high productivity.

Figure 26D:
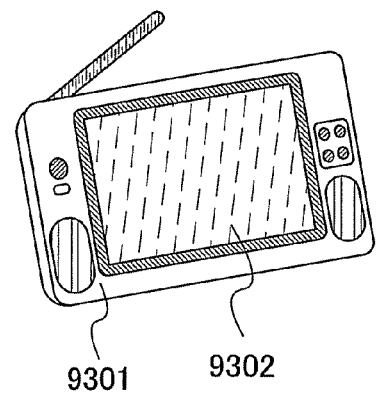

A portable television device illustrated in FIG. 26D includes a main body 9301, a display portion 9302, and the like. A display device of the present invention can be applied to the display portion 9302. Consequently, a portable television device can be manufactured through a simplified process, whereby it can be manufactured with high productivity. The display device of the present invention can be applied to a wide range of television devices ranging from a small-sized television device mounted on a portable terminal such as a cellular phone, a medium-sized television device which can be carried, to a large-sized (for example, 40-inch or more) television device.

Figure 26E:
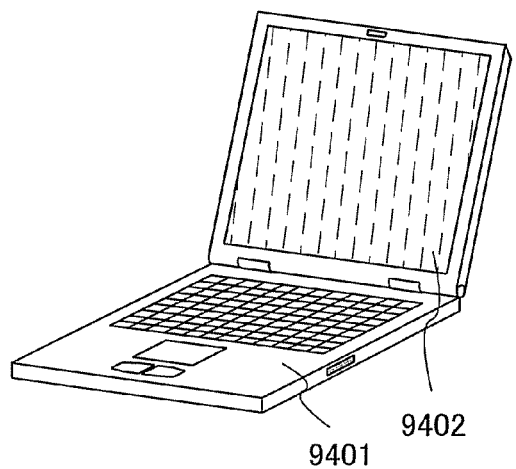

A portable computer illustrated in FIG. 26E includes a main body 9401, a display portion 9402, and the like. A display device of the present invention can be applied to the display portion 9402. Consequently, a portable computer can be manufactured through a simplified process, whereby it can be manufactured with high productivity.

As described above, with the display device of the present invention, electronic devices can be provided with high productivity.

This embodiment mode can be freely combined with the above Embodiment Modes 1 to 17 as appropriate.

The present application is based on Japanese Patent Application serial No. 2006-255863 filed in Japan Patent Office on Sep. 21, 2006, the entire contents of which are hereby incorporated by reference.

What is claimed is:

1. A method for manufacturing a semiconductor device comprising the steps of:
    forming a light absorption layer;
    forming an insulating layer over the light absorption layer; and
    irradiating the insulating layer with a multi-mode laser beam and a single-mode laser beam simultaneously so that those laser beams overlap with each other and forming an opening in a region of the insulating layer where those laser beams overlap.

2. A method for manufacturing a semiconductor device comprising the steps of:
    forming a light absorption layer;
    forming an insulating layer over the light absorption layer; and
    irradiating the insulating layer and the light absorption layer with a multi-mode laser beam and a single-mode laser beam simultaneously so that those laser beams overlap with each other and forming an opening in a region of the insulating layer and the light absorption layer where those laser beams overlap.

3. The method for manufacturing a semiconductor device according to claim 1, wherein the light absorption layer is formed over a conductive layer.

4. The method for manufacturing a semiconductor device according to claim 2, wherein the light absorption layer is formed over a conductive layer.

5. The method for manufacturing a semiconductor device according to claim 1, wherein a laser beam emitted from a YAG laser, a YVO$_4$ laser, or an excimer laser is used as the multi-mode laser beam.

6. The method for manufacturing a semiconductor device according to claim 2, wherein a laser beam emitted from a YAG laser, a YVO$_4$ laser, or an excimer laser is used as the multi-mode laser beam.

7. The method for manufacturing a semiconductor device according to claim 1, wherein a laser beam emitted from a femtosecond laser or a picosecond laser as the single-mode laser beam.

8. The method for manufacturing a semiconductor device according to claim 2, wherein a laser beam emitted from a femtosecond laser or a picosecond laser as the single-mode laser beam.

9. The method for manufacturing a semiconductor device according to claim 1, wherein the light absorption layer is formed using a material which absorbs the multi-mode laser beam and the single-mode laser beam.

10. The method for manufacturing a semiconductor device according to claim 2, wherein the light absorption layer is formed using a material which absorbs the multi-mode laser beam and the single-mode laser beam.

11. The method for manufacturing a semiconductor device according to claim 1, wherein the light absorption layer is formed using a material which contains at least one element of chromium (Cr), molybdenum (Mo), nickel (Ni), titanium (Ti), cobalt (Co), copper (Cu), or aluminum (Al).

12. The method for manufacturing a semiconductor device according to claim 2, wherein the light absorption layer is formed using a material which contains at least one element of chromium (Cr), molybdenum (Mo), nickel (Ni), titanium (Ti), cobalt (Co), copper (Cu), or aluminum (Al).

13. The method for manufacturing a semiconductor device according to claim 1, wherein the light absorption layer is formed using a material which contains at least one of silicon, germanium, silicon germanium, molybdenum oxide, tin oxide, bismuth oxide, vanadium oxide, nickel oxide, zinc oxide, gallium arsenide, gallium nitride, indium oxide, indium phosphide, indium nitride, cadmium sulfide, cadmium telluride, or strontium titanate.

14. The method for manufacturing a semiconductor device according to claim 2, wherein the light absorption layer is formed using a material which contains at least one of silicon, germanium, silicon germanium, molybdenum oxide, tin oxide, bismuth oxide, vanadium oxide, nickel oxide, zinc oxide, gallium arsenide, gallium nitride, indium oxide, indium phosphide, indium nitride, cadmium sulfide, cadmium telluride, or strontium titanate.

15. The method for manufacturing a semiconductor device according to claim 1, wherein the insulating layer is formed with a material which transmits the multi-mode laser beam and the single-mode laser beam.

16. The method for manufacturing a semiconductor device according to claim 2, wherein the insulating layer is formed with a material which transmits the multi-mode laser beam and the single-mode laser beam.

17. The method for manufacturing a semiconductor device according to claim 1, wherein a conductive layer is formed in the opening.

18. The method for manufacturing a semiconductor device according to claim 2, wherein a conductive layer is formed in the opening.

* * * * *